(12) United States Patent
Enomoto et al.

(10) Patent No.: US 9,116,437 B2
(45) Date of Patent: Aug. 25, 2015

(54) PATTERN FORMING METHOD, CHEMICAL AMPLIFICATION RESIST COMPOSITION AND RESIST FILM

(75) Inventors: Yuichiro Enomoto, Shizuoka (JP); Sou Kamimura, Shizuoka (JP); Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 144 days.

(21) Appl. No.: 13/320,150

(22) PCT Filed: Jun. 14, 2010

(86) PCT No.: PCT/JP2010/060412
§ 371 (c)(1),
(2), (4) Date: Nov. 11, 2011

(87) PCT Pub. No.: WO2010/147228
PCT Pub. Date: Dec. 23, 2010

(65) Prior Publication Data
US 2012/0058427 A1     Mar. 8, 2012

(30) Foreign Application Priority Data

Jun. 17, 2009  (JP) .................................. 2009-144711
Apr. 30, 2010  (JP) .................................. 2010-105909

(51) Int. Cl.
| G03F 7/30 | (2006.01) |
|---|---|
| G03F 7/32 | (2006.01) |
| G03F 7/004 | (2006.01) |
| G03F 7/039 | (2006.01) |
| G03F 7/20 | (2006.01) |

(52) U.S. Cl.
CPC .............. *G03F 7/325* (2013.01); *G03F 7/0045* (2013.01); *G03F 7/0046* (2013.01); *G03F 7/0397* (2013.01); *G03F 7/2041* (2013.01)

(58) Field of Classification Search
USPC ........................................................ 430/325
See application file for complete search history.

(56) References Cited

U.S. PATENT DOCUMENTS

| 4,663,269 A * | 5/1987 | Narang et al. ................. 430/326 |
|---|---|---|
| 2006/0172228 A1 | 8/2006 | Wada |
| 2006/0257781 A1* | 11/2006 | Benoit et al. ............... 430/270.1 |
| 2006/0264528 A1 | 11/2006 | Wada |
| 2008/0187860 A1 | 8/2008 | Tsubaki et al. |
| 2008/0261150 A1 | 10/2008 | Tsubaki et al. |
| 2010/0233629 A1 | 9/2010 | Wada |
| 2012/0315449 A1 | 12/2012 | Tsubaki et al. |

FOREIGN PATENT DOCUMENTS

| EP | 2020615 A1 | 2/2009 |
|---|---|---|
| JP | 6-266100 A | 9/1994 |
| JP | 2006-156422 A | 6/2006 |
| JP | 2006-208781 A | 8/2006 |
| JP | 2006-330098 A | 12/2006 |
| JP | 2000-199953 A | 7/2007 |
| JP | 200890261 A | 4/2008 |
| JP | 2008-292975 A | 12/2008 |
| WO | 2010061977 A2 | 6/2010 |
| WO | 2010098493 A1 | 9/2010 |

OTHER PUBLICATIONS

Communication dated Oct. 29, 2012 from the European Patent Office in counterpart European application No. 10789599.7.
International Search Report [PCT/ISA/210] issued on Jul. 20, 2010 in International Application No. PCT/JP2010/060412.
Written Opinion [PCT/ISA/237] issued by the International Searching Authority on Jul. 20, 2010 in International Application No. PCT/JP2010/060412.
Office Action, dated Oct. 25, 2013, issued by the European Patent Office, in counterpart Application No. 10789599.7.
Office Action dated Apr. 2, 2014 issued by the European Patent Office in corresponding European Application No. 10 789 599.7.
Office Action dated Dec. 24, 2013 issued by the Japanese Patent Office in counterpart Japanese Patent Application No. 2010-105909.
Office Action dated Aug. 5, 2014 issued by the Taiwanese Patent Office in corresponding Taiwanese Application No. 099119370.

* cited by examiner

*Primary Examiner* — Daborah Chacko Davis
(74) *Attorney, Agent, or Firm* — Sughrue Mion, PLLC

(57) ABSTRACT

A pattern forming method, including: (i) forming a film from a chemical amplification resist composition; (ii) exposing the film, so as to form an exposed film; and (iii) developing the exposed film by using a developer containing an organic solvent, wherein the chemical amplification resist composition contains: (A) a resin capable of decreasing a solubility of the resin (A) in the developer containing an organic solvent by an action of an acid; (B) a compound capable of generating an acid upon irradiation with an actinic ray or radiation; and (C) a basic, compound or ammonium salt compound whose basicity decreases upon irradiation with an actinic ray or radiation, and a resist composition used for the pattern forming method and a resist film formed from the resist composition are provided.

17 Claims, 1 Drawing Sheet

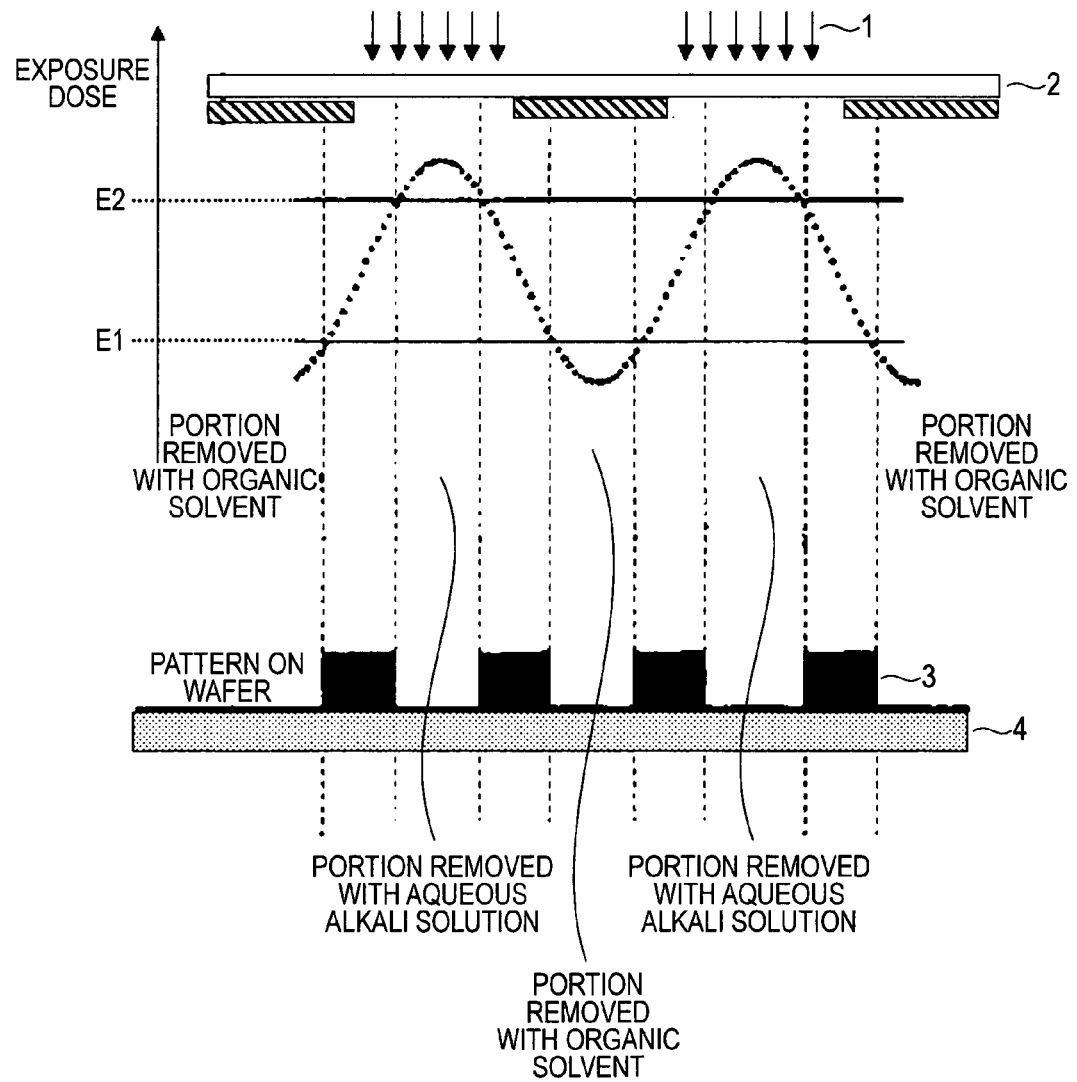

PATTERN FORMING METHOD, CHEMICAL AMPLIFICATION RESIST COMPOSITION AND RESIST FILM

TECHNICAL FIELD

The present invention relates to a pattern forming method suitable for lithography in the production of a semiconductor device such as IC, a liquid crystal device or a circuit board such as thermal head and further in other photofabrication processes. More specifically, the present invention relates to a pattern forming method suitable for exposure by an ArF exposure apparatus or immersion projection exposure apparatus using a light source that emits far ultraviolet light at a wavelength of 300 nm or less, a composition used therefor, and a resist film.

BACKGROUND ART

With the advent of a resist for KrF excimer laser (248 nm), an image forming method called chemical amplification is used as the image forming method for a resist so as to compensate for the reduction in sensitivity due to light absorption. To explain the image-forming method of positive chemical amplification by example, this is an image forming method of causing an acid generator in the exposed area to decompose upon exposure and thereby generate an acid, utilizing the generated acid as the reactive catalyst to change an alkali-insoluble group to an alkali-soluble group by baking after exposure (PEB: Post Exposure Bake), and removing the exposed area by alkali development.

Along with miniaturization of a semiconductor device, the trend is moving into a shorter wavelength of the exposure light source and a higher numerical aperture (higher NA) of the projection lens and at the present time, an exposure machine using, as its light source, an ArF excimer laser having a wavelength at 193 nm is developed. Also, a so-called immersion method of filling a high refractive-index liquid (hereinafter sometimes referred to as an "immersion liquid") between the projection lens and the sample is being aggressively studied. The immersion method can be combined with the super-resolution technology under study at present, such as phase-shift method and modified illumination method.

As for the technique to more enhance the resolution, double exposure technology or double patterning technology has been proposed.

In conventional pattern formation of an electronic device such as semiconductor device, a mask or reticle pattern enlarged in pattern size by 4 to 5 times as compared with a pattern intended to form is reduced and transferred on an exposure target such as wafer by using a reduction projection exposure apparatus.

However, the dimensional miniaturization brings about a problem that in the conventional exposure system, lights irradiated on adjacent patterns interfere with each other to decrease the optical contrast. Therefore, in such technology, it is devised to divide the exposure mask design into two or more designs and synthesize an image by independently exposing these masks. In this double exposure system, it is necessary to divide the exposure mask design and again synthesize an image on an exposure target (wafer), and therefore, the division of the mask design must be devised so that the pattern on the reticle can be faithfully reproduced on the exposure target.

Studies of applying the effect of such a double exposure system to the transfer of a fine image pattern of a semiconductor device are introduced, for example, in JPA-2006-156422 (the term "JP-A" as used herein means an "unexamined published Japanese patent application").

In the case of simply applying the conventional resist composition to the double exposure system, the pattern formation needs to be performed in the vicinity of resolution limit of the resist, and this incurs a problem that sufficient exposure margin or depth of focus cannot be obtained.

JP-A-2000-199953 describes a double development technology as the double patterning technology for enhancing the resolution. In this case, an image forming method by general chemical amplification is utilized, and by making use of a property that the polarity of a resin in a resist composition when exposed is changed to high polarity in a region irradiated with a high light intensity and maintained as low polarity in a region irradiated with a low light intensity, the high exposure region of a specific resist film is dissolved with a high-polarity developer (specifically, a conventional aqueous alkali solution) (positive development) and the low exposure region is dissolved with a low-polarity developer (specifically, an organic solvent) (negative development). More specifically, the region not lower than an exposure dose E2 of irradiation light 1 shown in FIG. 1 is dissolved using an aqueous alkali solution, and the region not higher than an exposure dose E1 is dissolved using a specific organic solvent, whereby, as shown in FIG. 1, the region with a medium exposure dose (E2–E1) is allowed to remain without being developed and an L/S pattern 3 having a pitch half the pitch of the exposure mask 2 is formed on a wafer 4.

However, it is very difficult to select an optimal combination of a resist composition and an organic solvent developer, and there is a problem that developability when using an organic solvent developer becomes bad.

Furthermore, at the formation of a fine pattern by double development, good resolution achievable when merely using an organic solvent or an aqueous alkali solution alone is insufficient, and the resist film is demanded to show good pattern resolution for both developers.

Considering these problems, in the double development technology, U.S. Patent Application Publication 2008/0187860 proposes a pattern forming method using a specific resist composition. According to this technique, a high-precision fine pattern is supposed to be stably obtained.

Yet it is required that a higher-precision fine pattern excellent in terms of line width variation (LWR) and focus latitude (DOF) is stably obtained.

SUMMARY OF INVENTION

An object of the present invention is to solve those problems and for more stably forming a high-precision fine pattern so as to produce a high-integration and high-precision electronic device, provide a pattern forming method excellent in terms of line width variation (LWR), focus latitude (DOF) and pattern profile, a composition used therefor, and a resist film.

The present invention includes the following configurations and thanks to these configurations, the above-described object of the present invention is achieved.

[1] A pattern forming method, comprising:
(i) forming a film from a chemical amplification resist composition;
(ii) exposing the film, so as to form an exposed film; and
(iii) developing the exposed film by using a developer containing an organic solvent,
wherein the chemical amplification resist composition contains:

(A) a resin capable of decreasing a solubility of the resin (A) in the developer containing an organic solvent by an action of an acid;

(B) a compound capable of generating an acid upon irradiation with an actinic ray or radiation; and (C) a basic compound or ammonium salt compound whose basicity decreases upon irradiation with an actinic ray or radiation.

[2] The pattern forming method as described in [1] above, wherein a content of the organic solvent in the developer is from 90 to 100 mass % based on the entire amount of the developer.

[3] The pattern forming method as described in [1] or [2] above, wherein the compound (C) is a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

[4] The pattern forming method as described in any one of [1] to [3] above, wherein the compound (C) generates a compound represented by the following formula (PA-I), (PA-II) or (PA-III) upon irradiation with an actinic ray or radiation:

Q-A$_1$-(X)$_n$—B—R       (PA-I)

Q$_1$-X$_1$—NH—X$_2$-Q$_2$       (PA-II)

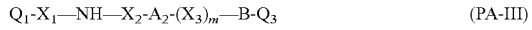

Q$_1$-X$_1$—NH—X$_2$-A$_2$-(X$_3$)$_m$—B-Q$_3$       (PA-III)

wherein in formula (PA-I),

A$_1$ represents a single bond or a divalent linking group;

Q represents —SO$_3$H or —CO$_2$H;

X represents —SO$_2$— or —CO—;

n represents 0 or 1;

B represents a single bond, an oxygen atom or —N(Rx)-;

Rx represents a hydrogen atom or a monovalent organic group; and

R represents a monovalent organic group having a basic functional group, or a monovalent organic group having an ammonium group;

in formula (PA-II), each of Q$_1$ and Q$_2$ independently represents a monovalent organic group, provided that either one of Q$_1$ and Q$_2$ has a basic functional group, Q$_1$ and Q$_2$ may combine to form a ring, and the ring formed may have a basic functional group; and each of X$_1$ and X$_2$ independently represents —CO— or —SO$_2$—; and in formula (PA-III), each of Q$_1$ and Q$_3$ independently represents a monovalent organic group, provided that either one of Q$_1$ and Q$_3$ has a basic functional group, Q$_1$ and Q$_3$ may combine to form a ring, and the ring formed may have a basic functional group;

each of X$_1$, X$_2$ and X$_3$ independently represents —CO— or —SO$_2$—;

A$_2$ represents a divalent linking group;

B represents a single bond, an oxygen atom or —N(Qx)-;

Qx represents a hydrogen atom or a monovalent organic group;

when B is —N(Qx)-, Q$_3$ and Qx may combine to form a ring; and m represents 0 or 1.

[5] The pattern forming method as described in [4] above, wherein the compound (C) generates a compound represented by formula (PA-II) or (PA-III).

[6] The pattern forming method as described in any one of [1] to [5] above, wherein the organic solvent contained in the developer is at least one kind of an organic solvent selected from the group consisting of a ketone-based solvent, an ester-based solvent, an alcohol-based solvent, an amide-based solvent and an ether-based solvent.

[7] The pattern forming method as described in any one of [1] to [6] above, further comprising:

(iv) performing rinsing by using a rinsing solution.

[8] The pattern forming method as described in [7] above, wherein the rinsing solution is a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

[9] The pattern forming method as described in any one of [1] to [8] above, further comprising:

(vi) developing the film by using an aqueous alkali developer.

[10] The pattern forming method as described in any one of [1] to [9] above, wherein the exposure is immersion exposure.

[11] A chemical amplificatidn resist composition that is used in the pattern forming method described in any one of [1] to [10] above.

[12] A resist film formed from the chemical amplification resist composition described in [11] above.

The present invention preferably further includes the following configurations.

[13] The pattern forming method as described in any one of [2] to [10] above, wherein the content of the organic solvent in the developer is from 95 to 100 mass % based on the entire amount of the developer.

[14] The pattern forming method as described in any one of [1] to [10] and [13] above, wherein a water content in the developer is less than 10 mass %.

[15] The pattern forming method as described in any one of [1] to [10], [13] and [14] above, wherein the resin (A) contains a repeating unit represented by the following formula (AI):

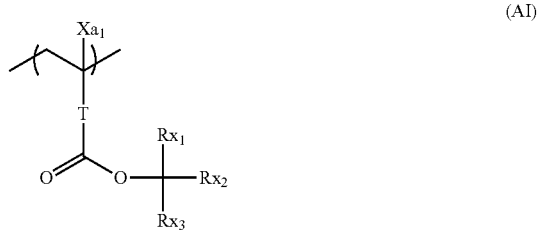

wherein Xa$_1$ represents a hydrogen atom, a methyl group which may have a substituent, or a group represented by —CH$_2$—R$_9$;

R$_9$ represents a hydroxyl group or a monovalent organic group;

T represents a single bond or a divalent linking group;

each of Rx$_1$ to Rx$_3$ independently represents an alkyl group or a cycloalkyl group; and Rx$_2$ and Rx$_3$ may combine to form a ring structure.

[16] The pattern forming method as described in any one of [1] to [10] and [13] to [15] above,
wherein the resin (A) contains a repeating unit containing a lactone structure.

[17] The pattern forming method as described in any one of [1] to [10] and [13] to [16] above,
wherein the resist composition further contains a hydrophobic resin.

[18] The pattern forming method as described in any one of [1] to [10] and [13] to [17] above,
wherein the actinic ray or radiation is ArF excimer laser.

BRIEF DESCRIPTION OF DRAWING

FIG. 1 is a schematic view showing the pattern forming method using positive development and negative development in combination.

DESCRIPTION OF EMBODIMENTS

The mode for carrying out the present invention is described below.

In the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Also, in the present invention, unless otherwise indicated, the "exposure" includes not only exposure with a mercury lamp, a far ultraviolet ray typified by excimer laser, an X-ray, EUV light or the like but also lithography with a particle beam such as electron beam and ion beam.

The pattern forming process necessary for practicing the present invention includes the following steps:
(i) a step of forming a film by using a chemical amplification resist composition,
(ii) a step of exposing the film, and
(iii) a step of developing the exposed film by using an organic solvent-containing developer (also called as a developer containing an organic solvent).

In the pattern forming method of the present invention, the organic solvent contained in the developer is preferably at least one kind of an organic solvent selected from the group consisting of a ketone-based solvent, an ester-based solvent, an alcohol-based solvent, an amide-based solvent and an ether-based solvent.

The pattern forming method of the present invention preferably further comprises (iv) a step of performing rinsing by using a rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably further comprises (v) a heating step after the (ii) exposure step.

The pattern forming method of the present invention may further comprise (vi) a step of developing the film by using an aqueous alkali developer.

In practicing the present invention, a resist composition containing:
(A) a resin capable of decreasing the solubility in an organic solvent-containing developer by the action of an acid,
(B) a compound capable of generating an acid upon irradiation with an actinic ray or radiation, and
(C) a basic compound or ammonium salt compound whose basicity decreases upon irradiation with an actinic ray or radiation,
and (Ab) a developer containing an organic solvent are necessary.

In practicing the present invention, it is preferred to further use (Ad) a rinsing solution containing an organic solvent.

The film formed in the present invention is a resist film formed by applying a resist composition containing:
(A) a resin capable of decreasing the solubility in an organic solvent-containing developer by the action of an acid,
(B) a compound capable of generating an acid upon irradiation with an actinic ray or radiation, and
(C) a basic compound or ammonium salt compound whose basicity decreases upon irradiation with an actinic ray or radiation.

The resist composition of the present invention is explained below.

(A) Resin Capable of Decreasing the Solubility in an Organic Solvent-Containing Developer by the Action of an Acid The resin capable of decreasing the solubility in an organic solvent-containing developer by the action of an acid, which is used in the resist composition of the present invention, includes, for example, a resin having a group capable of decomposing by the action of an acid to produce a polar group (hereinafter sometimes referred to as an "acid-decomposable group"), on either one or both of the main and side chains of the resin (sometimes referred to as an "acid-decomposable resin" or a "resin (A)). It is considered that when a polar group is produced, the affinity for an organic solvent-containing developer is decreased to induce insolubilization (negative conversion). Incidentally, this resin is also a resin capable of increasing the polarity by the action of an acid to increase the solubility in an aqueous alkali developer.

The acid-decomposable group preferably has a structure where the polar group is protected by a group capable of leaving by the action of an acid.

The polar group is not particularly limited as long as it is a group capable of being insolubilized in an organic solvent-containing developer, but an alkali-soluble group such as carboxyl group, fluorinated alcohol group (preferably hexafluoroisopropanol) and sulfonic acid group is preferred.

The group preferred as the acid-decomposable group is a group where a hydrogen atom of the group above is replaced by a group capable of leaving by the action of an acid.

Examples of the group capable of leaving by the action of an acid include $—C(R_{36})(R_{37})(R_{38})$, $—C(R_{36})(R_{37})(OR_{39})$ and $—C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl, a norbornyl group, an isoboronyl group, a camphanyl group, a dicyclopentyl group, an α-pinel group, a tricyclodecanyl group, a tetracyclododecyl group and an androstanyl group. Incidentally, a part of carbon atoms in the cycloalkyl group may be substituted with a heteroatom such as oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit which can be contained in the resin (A) is preferably a repeating unit represented by the following formula (AI):

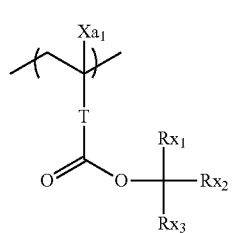

(AI)

In formula (AI), $Xa_1$ represents a hydrogen atom, a methyl group which may have a substituent, or a group represented by $—CH_2—R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO-Rt-group, a —O-Rt- group, and a divalent linking group formed by combining two or more groups thereof. In the formulae, Rt represents an alkylene group or a cycloalkylene group. The total carbon number of the divalent linking group of T is preferably from 1 to 20, more preferably from 1 to 15, still more preferably from 2 to 10.

T is preferably a single bond or a —COO-Rt- group. Rt is preferably an alkylene group having a carbon number of 1 to 5, more preferably a $—CH_2—$ group, a $—(CH_2)_2—$ group or a $—(CH_2)_3—$ group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units is preferably from 20 to 70 mol %, more preferably from 30 to 50 mol %, based on all repeating units in the resin (A).

Specific preferred examples of the repeating unit having an acid-decomposable group are set forth below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each is independent from every others. p represents 0 or a positive integer. Specific examples and preferred examples of Z are the same as specific examples and preferred examples of $R_{10}$ in formula (2-1) described later.

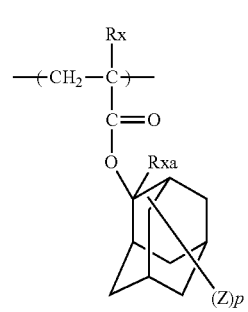

1

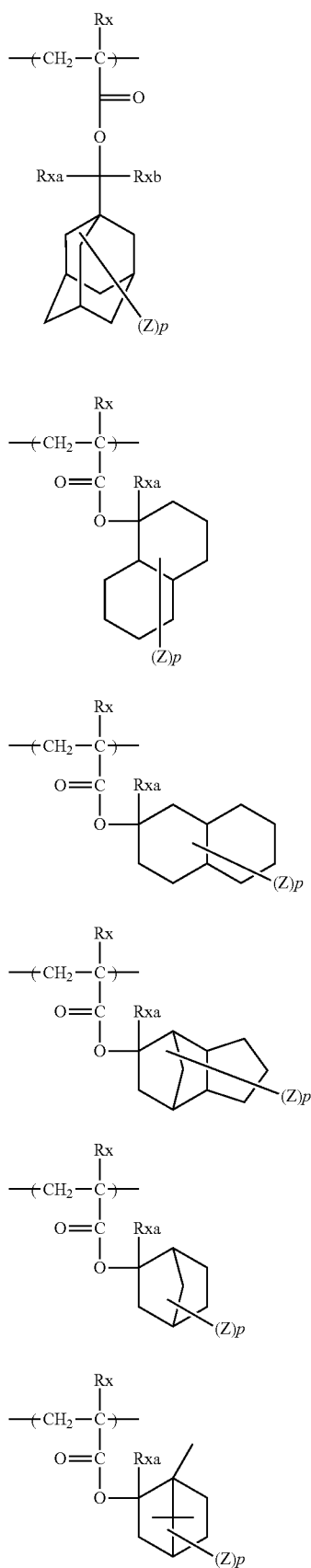
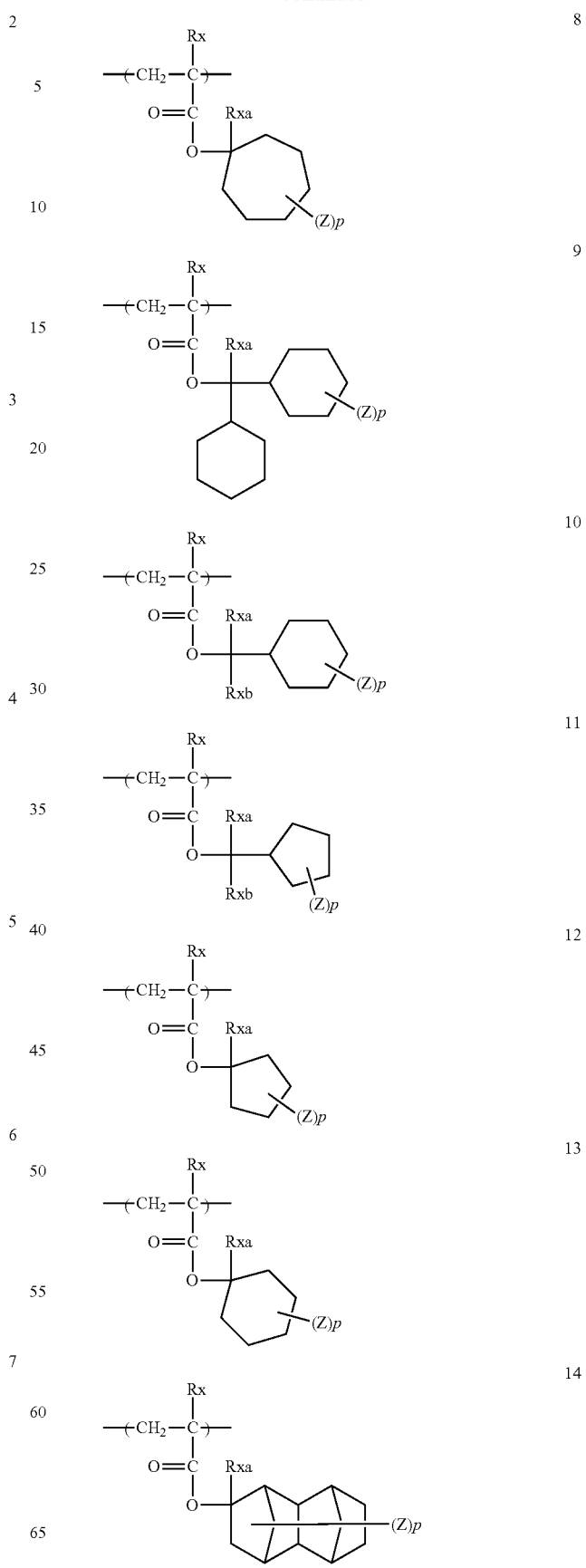

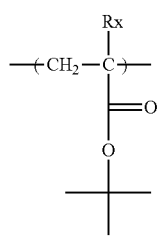
15
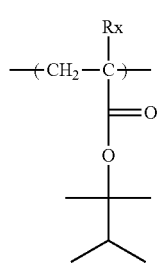
16
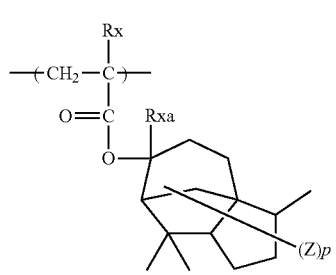
17
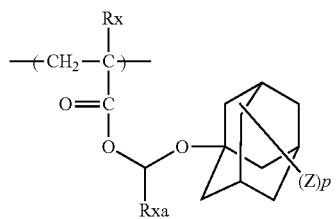
18
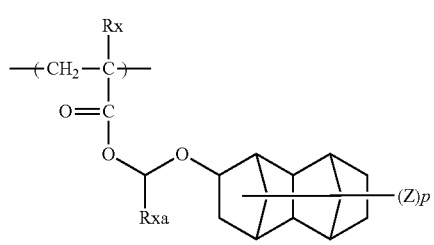
19
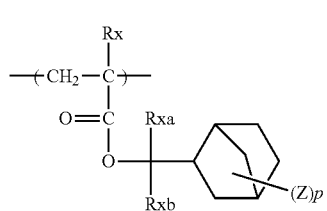
20
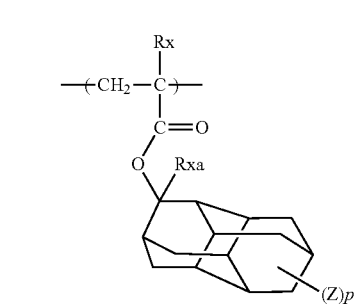
21
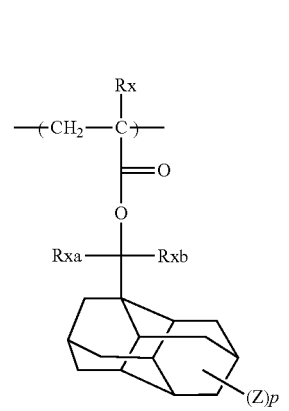
22
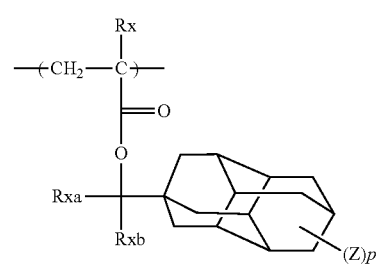
23
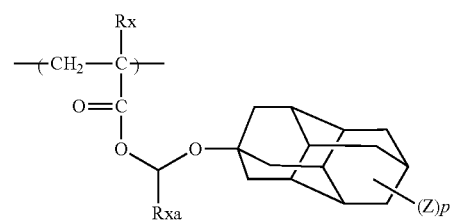
24
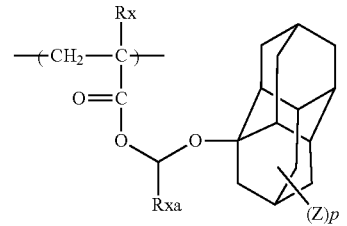
25

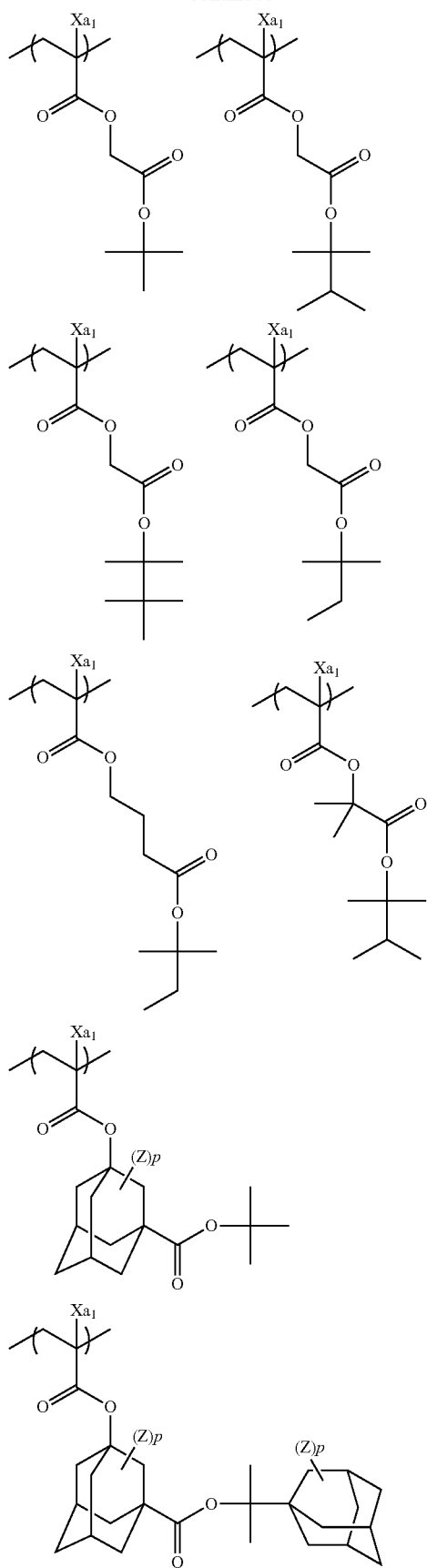
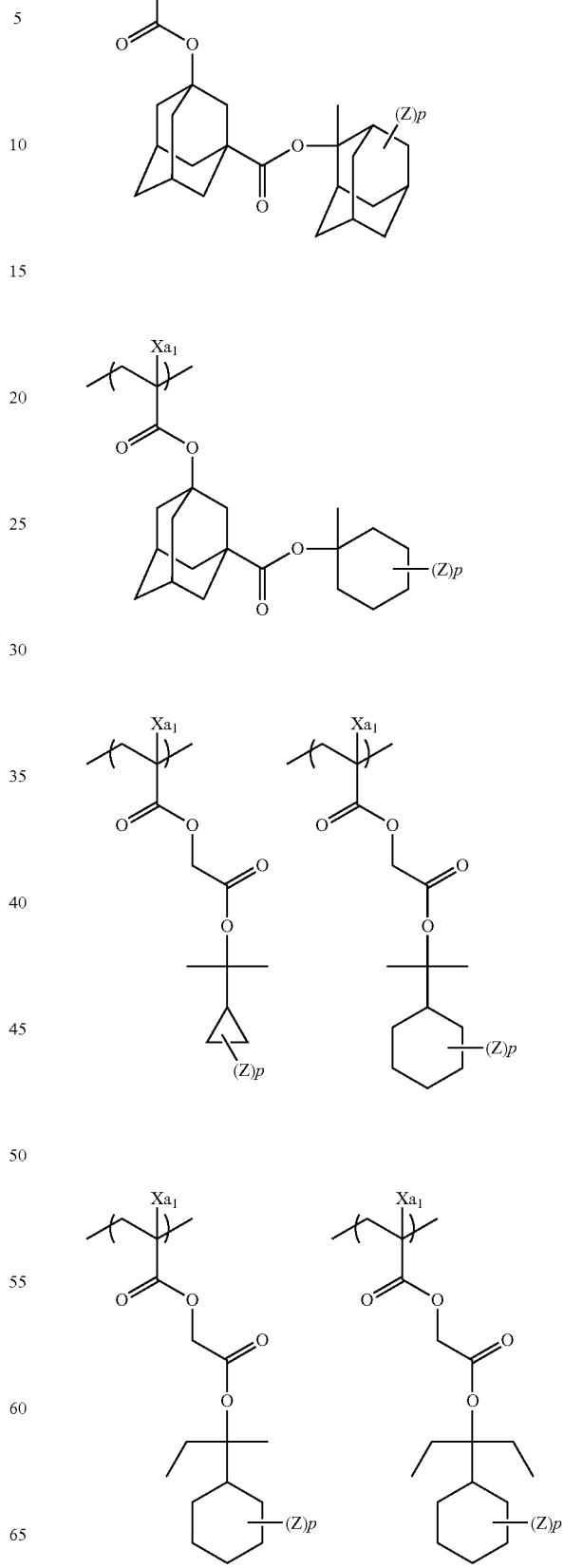

-continued
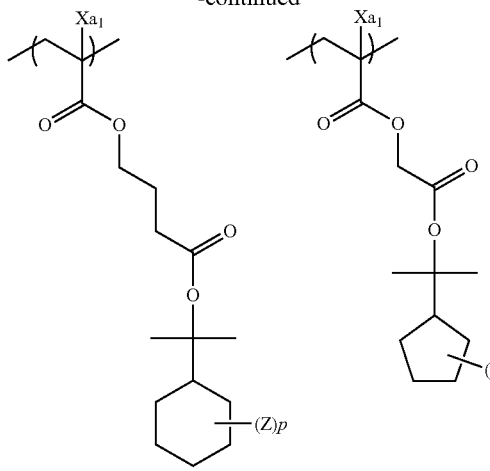
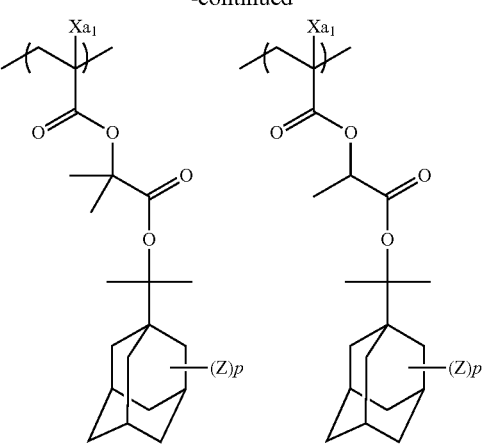
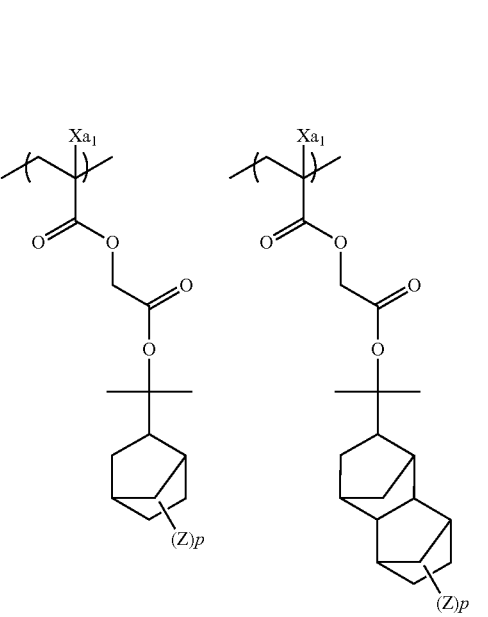
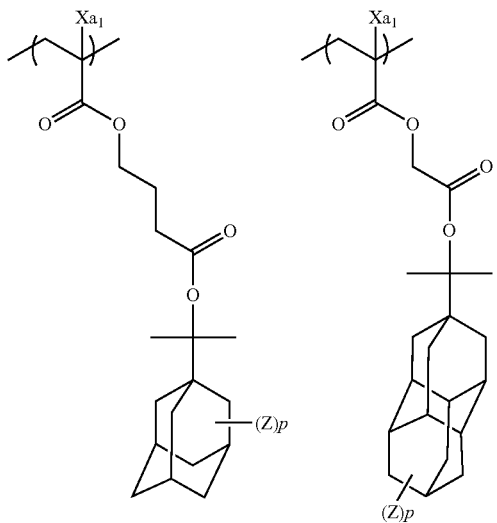
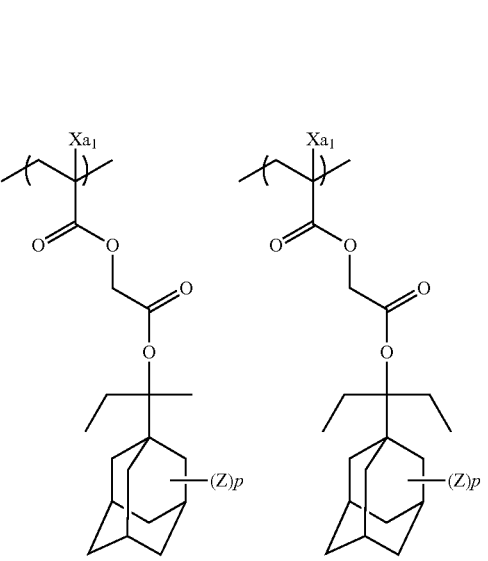

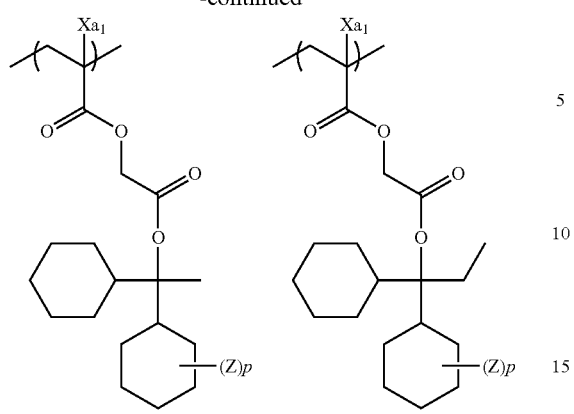
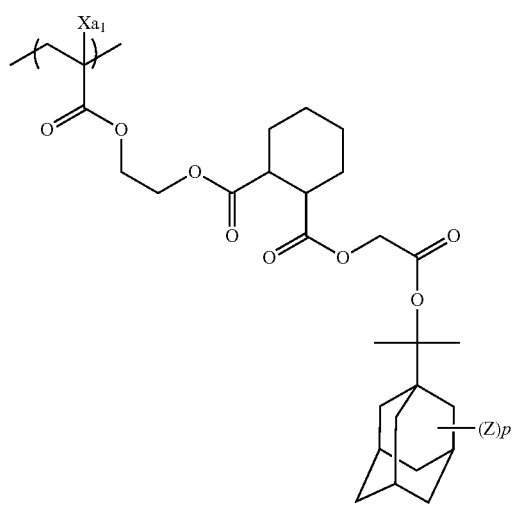
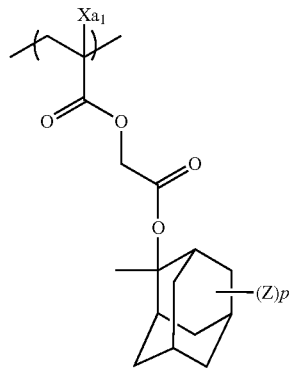
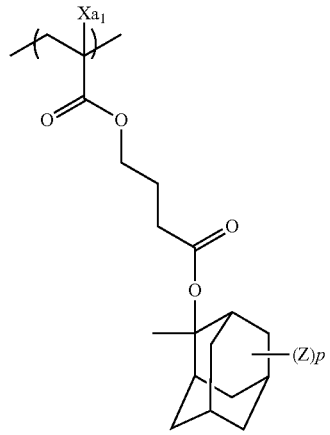
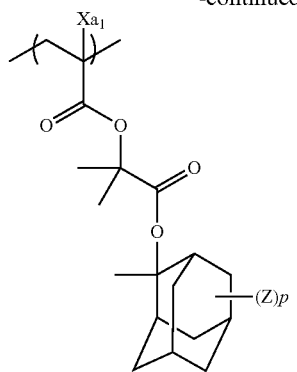
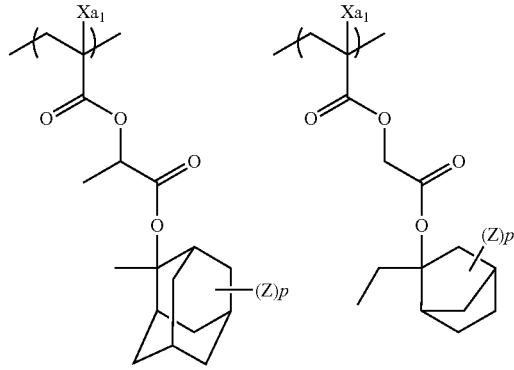
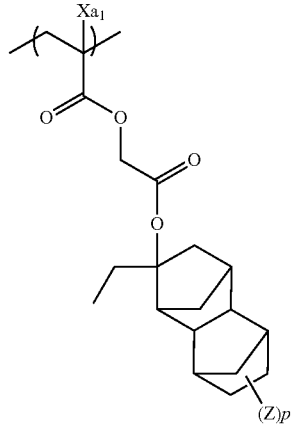
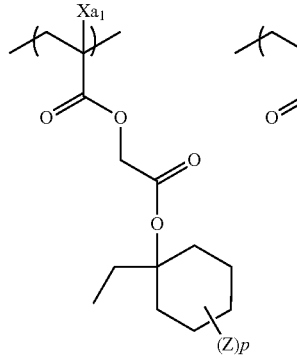

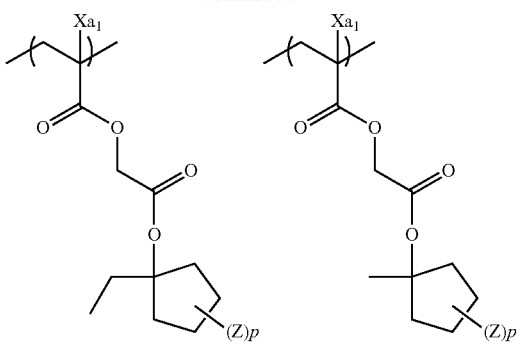

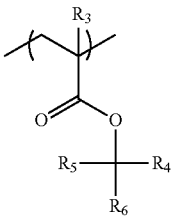

(2)

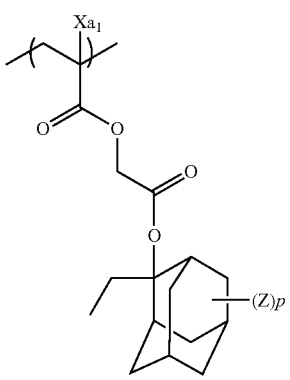

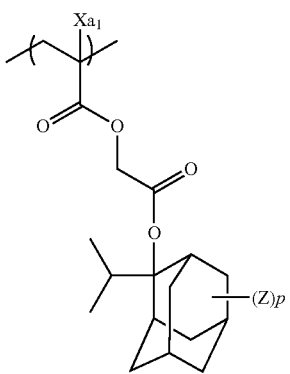

The resin (A) is more preferably a resin having, as the repeating unit represented by formula (AI), at least either one of a repeating unit represented by formula (1) and a repeating unit represented by formula (2).

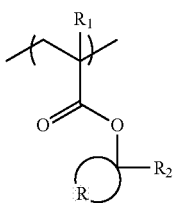

(1)

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl-group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the substituent which the alkyl group of $R_2$, $R_4$, $R_5$ and $R_6$ may further have include an aryl group (e.g., phenyl, naphthyl), an aralkyl group, a hydroxyl group, an alkoxy group (e.g., methoxy, ethoxy, butoxy, octyloxy, dodecyloxy), an acyl group (e.g., acetyl, propanoyl, benzoyl), and an oxo group. The carbon number of the substituent is preferably 15 or less.

Examples of the substituent which the cycloalkyl group of $R_2$, $R_4$, $R_5$ and $R_6$ may further have include an alkyl group (e.g., methyl, ethyl, propyl, isopropyl, butyl, tert-butyl, hexyl), and the groups exemplified above as the substituent which the alkyl group of $R_2$ may further have. The carbon number of the substituent is preferably 15 or less.

The repeating unit represented by formula (2) is preferably a repeating unit represented by the following formula (2-1):

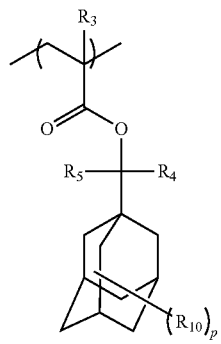

(2-1)

In formula (2-1), $R_3$ to $R_5$ have the same meanings as in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

As for the acid-decomposable group-containing repeating unit of Resin (A), one kind of a repeating unit may be used, or two or more kinds of repeating units may be used in combination. In the case of using repeating units in combination, any combination may be employed, but a combination use of a repeating unit represented by formula (1) and a repeating unit represented by formula (2), and a combination use of two kinds of repeating units represented by formula (1), are preferred. More specifically, the following combinations are preferred. In specific examples below, R represents a hydrogen atom, $CH_3$, $CF_3$ or $CH_2OH$.

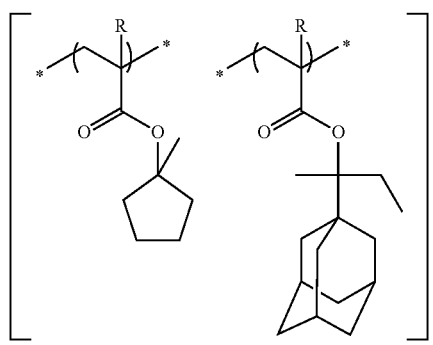

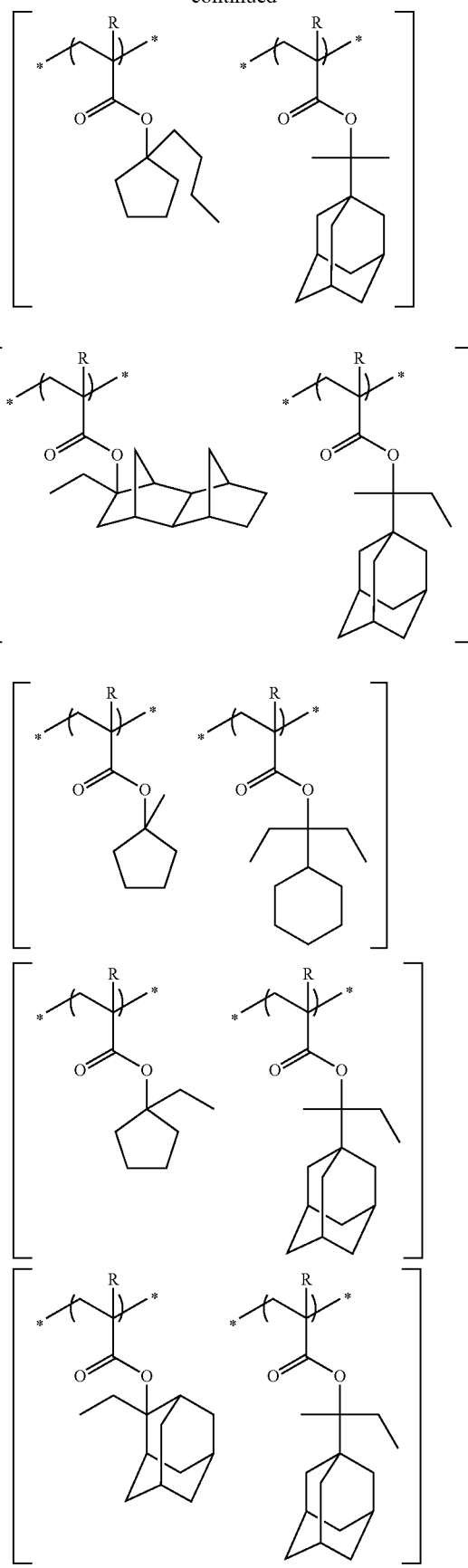

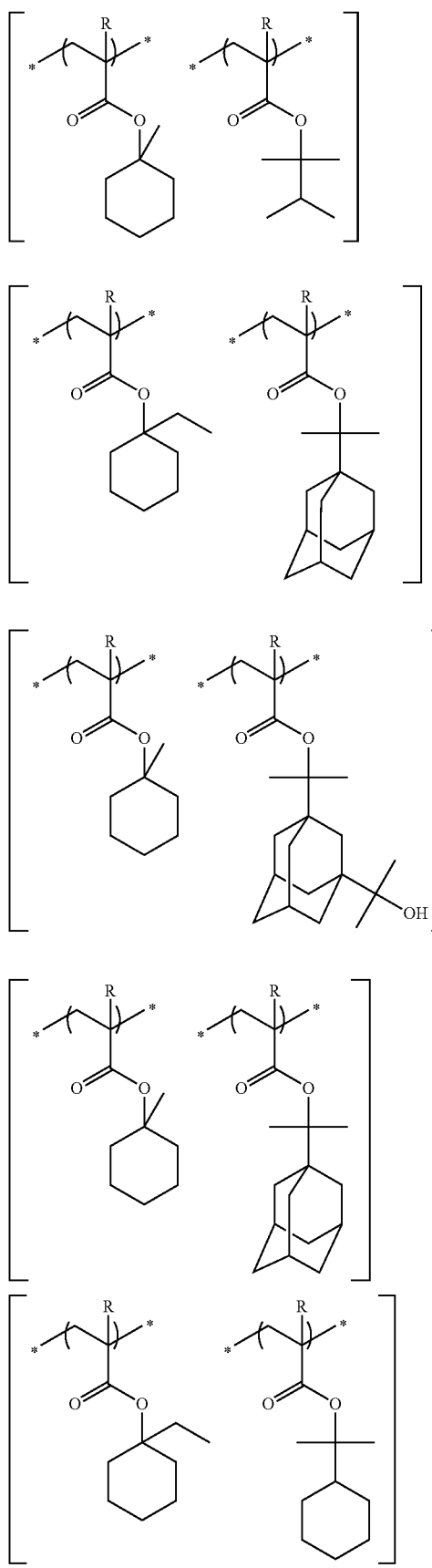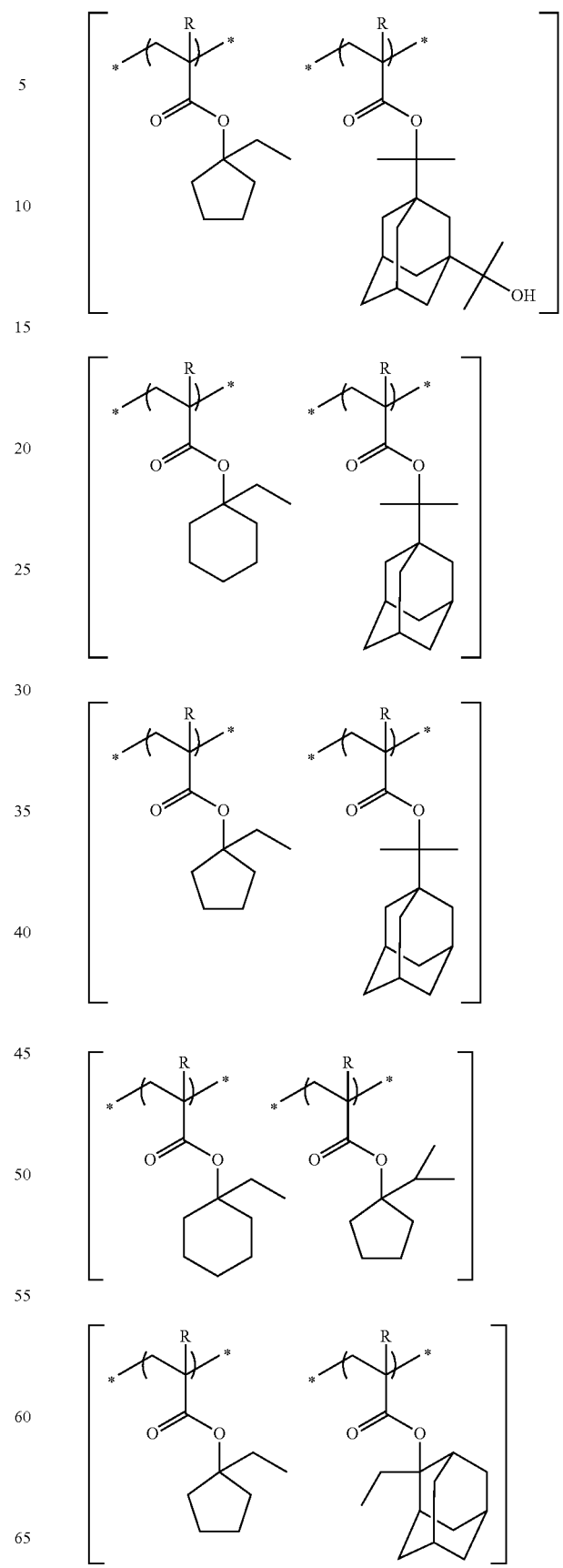

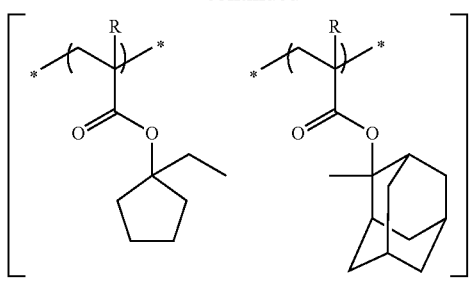

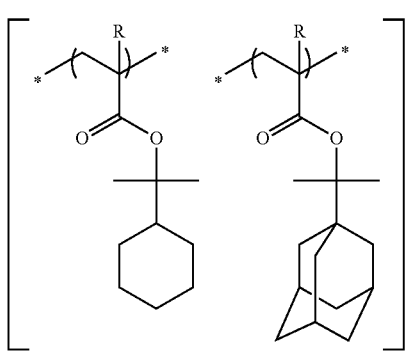

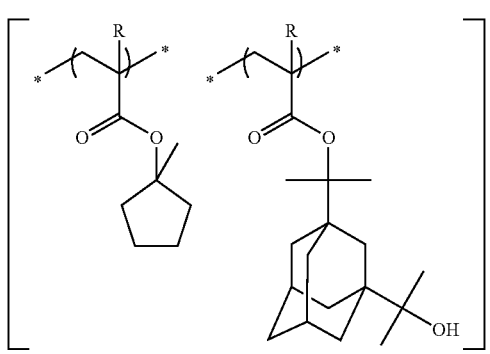

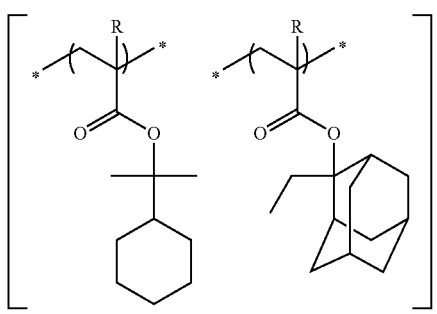

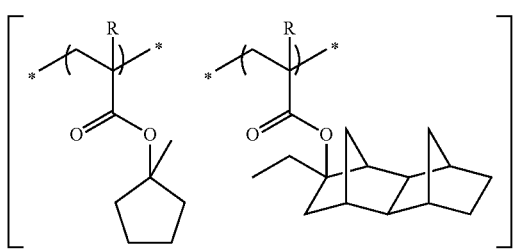

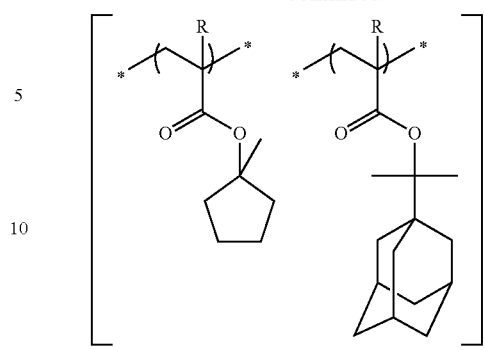

The resin (A) preferably contains a repeating unit having a lactone structure.

As for the lactone structure, any may be used as long as it has a lactone structure, but the lactone structure is preferably a 5- to 7-membered ring lactone structure, and a structure where another ring structure is condensed to a 5- to 7-membered ring lactone structure in the form of forming a bicyclo or Spiro structure, is preferred. The resin more preferably contains a repeating unit having a lactone structure represented by any one of the following formulae (LC1-1) to (LC1-17). The lactone structure may be bonded directly to the main chain. Preferred lactone structures are (LC1-1), (LC1-4), (LC1-5), (LC1-6), (LC1-13), (LC1-14) and (LC1-17), with the lactone structure (LC1-4) being more preferred. By using a specific lactone structure, LWR and development defect are improved.

LC1-1

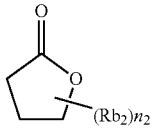

LC1-2

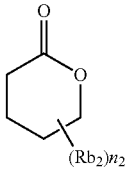

LC1-3

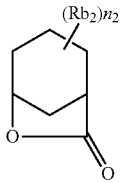

LC1-4

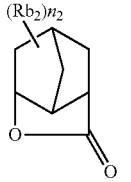

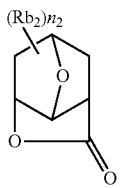
LC1-5

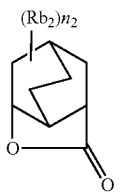
LC1-6

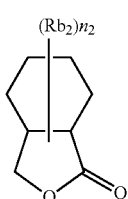
LC1-7

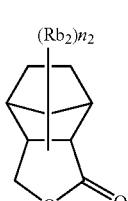
LC1-8

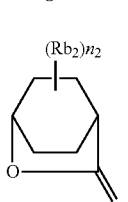
LC1-9

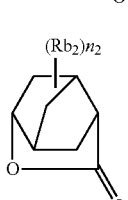
LC1-10

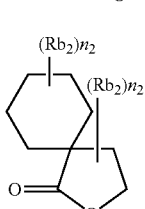
LC1-11

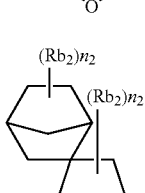
LC1-12

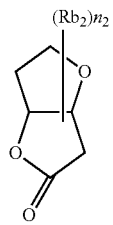
LC1-13

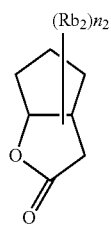
LC1-14

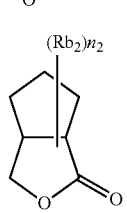
LC1-15

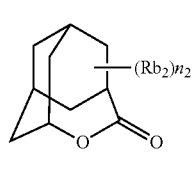
LC1-16

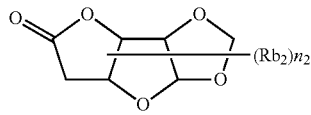
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$), and also, the plurality of substituents ($Rb_2$) may combine with each other to form a ring.

The repeating unit having a lactone structure is preferably a repeating unit represented by the following formula (AII):

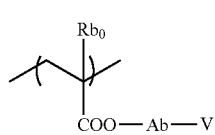
(AII)

In formula (AII), $Rb_0$ represents a hydrogen atom, a halogen atom, or an alkyl group having a carbon number of 1 to 4, which may have a substituent. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent linking group formed by combining these, and is preferably a single bond or a divalent linking group represented by $-Ab_1-CO_2-$.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically includes, for example, a group having a structure represented by any one of formulae (LC1-1) to (LC1-17).

Out of units represented by formula (AII), when Ab is a single bond, repeating units particularly preferred as the repeating unit having a lactone group are set forth below. In specific examples, Rx represents H, $CH_3$, $CH_2OH$ or $CF_3$. By selecting an optimal lactone group, the pattern profile and the iso/dense bias are improved.

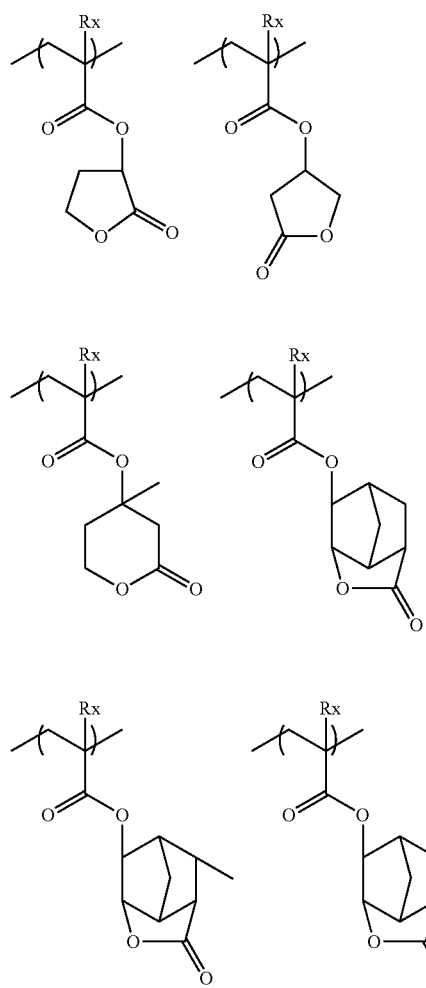

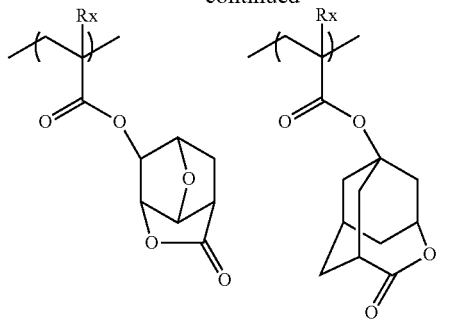

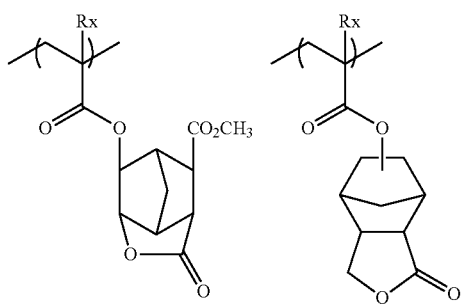

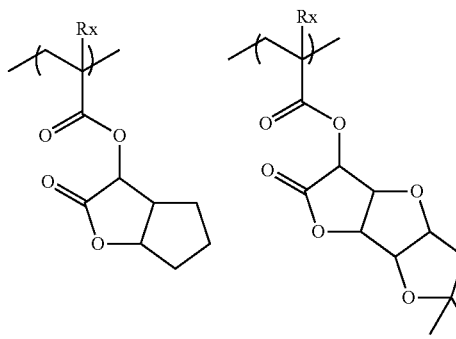

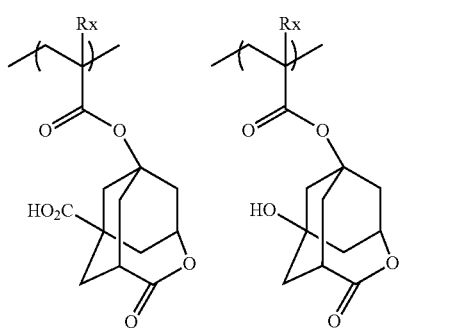

Also, it is one of preferred embodiments of the resin (A) that the linking group Ab in formula (AII) is a divalent linking group represented by $-Ab_1-CO_2-$. In this case, $Ab_1$ is preferably a linear or branched alkylene group having a carbon number of 1 to 4, more preferably a methylene group. Specific examples thereof include structures set forth below.

In specific examples, R represents a hydrogen atom, an alkyl group which may have a substituent, or a halogen atom, preferably a hydrogen atom, a methyl group, a hydroxymethyl group or an acetoxymethyl group.

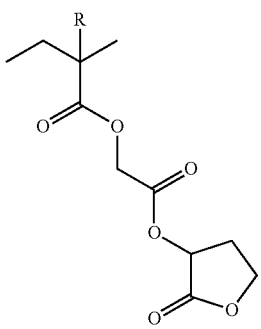

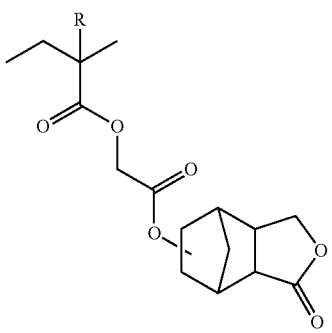

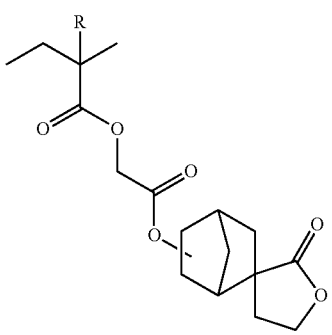

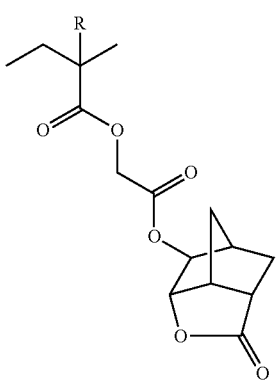

A more preferred embodiment of formula (AII) is a structure represented by the repeating unit of the following formula (3-1):

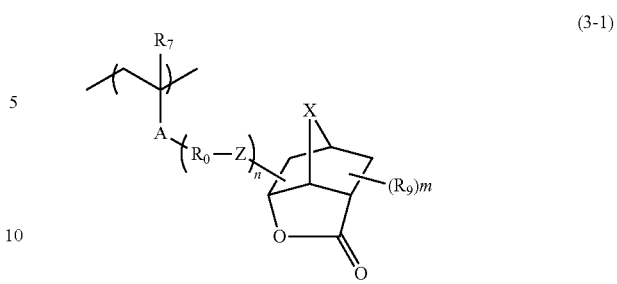

In formula (3-1), $R_7$ represents a hydrogen atom, a halogen atom, or an alkyl group which may have a substituent.

A represents an ester bond (—COO—).

$R_0$ represents an alkylene group, a cycloalkylene group or a combination thereof and when a plurality of $R_0$'s are present, each $R_0$ may be the same as or different from every other $R_0$.

Z represents an ether bond, an ester bond, an amide bond, a urethane bond or a urea bond and when a plurality of Z's are present, each Z may be the same as or different from every other Z.

n is a repetition number of the structure represented by —$R_0$—Z— in the repeating unit represented by formula (3-1) and represents an integer of 1 to 5. n is preferably 0 or 1.

$R_9$ represents an alkyl group, a cycloalkyl group, an alkoxycarbonyl group, a cyano group, a hydroxyl group or an alkoxy group. When a plurality of $R_9$'s are present, each $R_9$ may be the same as or different from every other $R_9$, and two members thereof may form a ring.

X represents an alkylene group, an oxygen atom or a sulfur atom.

m is the number of substituents and represents an integer of 0 to 5. m is preferably 0 or 1.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, and an acetoxy group such as acetyl group and propionyl group. $R_7$ is preferably a hydrogen atom, a methyl group, a trifluoromethyl group or a hydroxymethyl group.

The alkylene group in $R_0$ is preferably an alkylene group having a carbon number of 1 to 10, more preferably from 1 to 5, and examples thereof include a methylene group, an ethylene group and a propylene group. The cycloalkylene group in $R_0$ is preferably a cycloalkylene having a carbon number of 3 to 20, and examples thereof include a cyclohexylene group, a cyclopentylene group, a norbornylene group and an adamantylene group. For bringing about the effects of the present invention, an alkylene group is more preferred, and a methylene group is still more preferred.

The alkyl group of $R_9$ is preferably an alkyl group having a carbon number of 1 to 4, more preferably a methyl group or an ethyl group, and most preferably a methyl group. The cycloalkyl group may be a cycloalkyl group having a carbon number of 3 to 6, and examples thereof include a cyclopropyl group, a cyclobutyl group, a cyclopentyl group and a cyclohexyl group. The alkoxycarbonyl group is preferably an alkoxycarbonyl group having a carbon number of 2 to 5, and examples thereof include a methoxycarbonyl group, an ethoxycarbonyl group, an n-butoxycarbonyl group and a tert-butoxycarbonyl group. The acyloxy group is preferably an alkoxy group having a carbon number of 1 to 4, and examples thereof include a methoxy group, an ethoxy group, a propoxy group, an isopropoxy group and a butoxy group. Each of the groups for $R_9$ may have a substituent, and examples of the substituent include a hydroxy group, an alkoxy group such as methoxy group and ethoxy group, a cyano group, and a halogen atom such as fluorine atom.

$R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is 1, at least one $R_9$ is preferably substituted at the α- or β-position, more preferably at the α-position, of the carbonyl group of lactone.

Specific examples of the lactone structure-containing repeating unit represented by formula (3-1) are set forth below, but the present invention is not limited thereto. In the formulae, R represents a hydrogen atom, an alkyl group which may have a substituent, or a halogen atom, preferably a hydrogen atom, a methyl group, a hydroxymethyl group or an acetoxymethyl group.

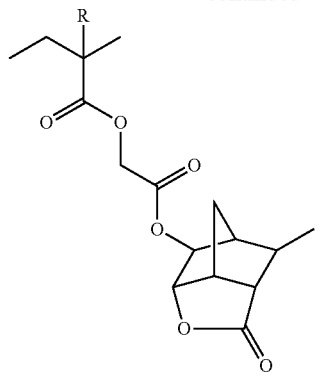

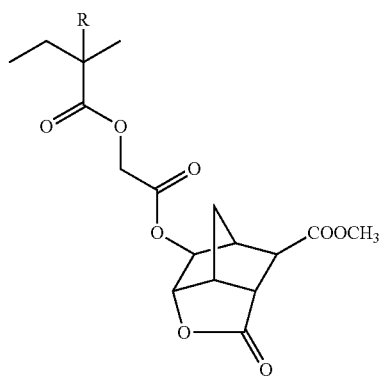

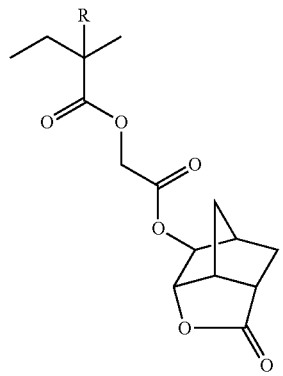

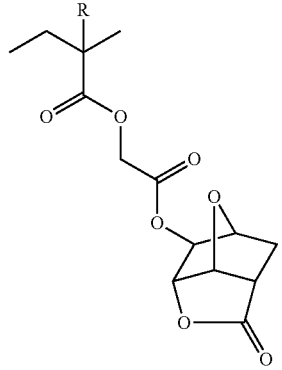

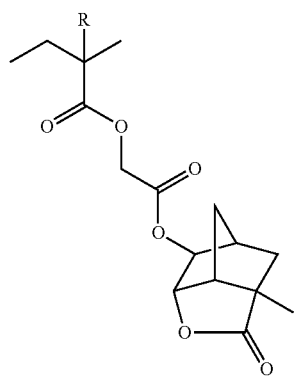

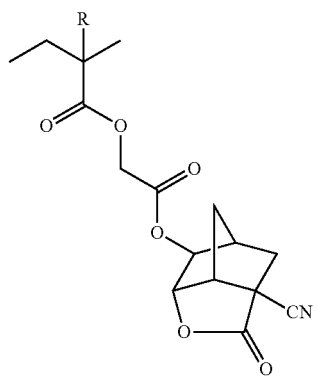

35
-continued
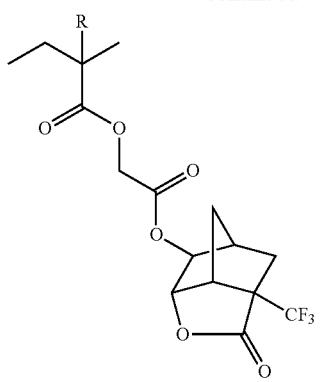
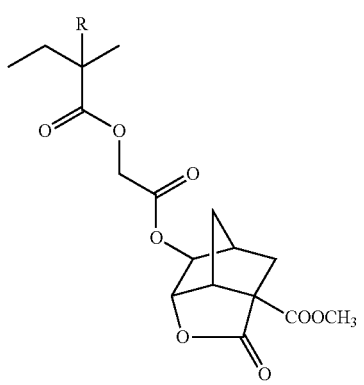
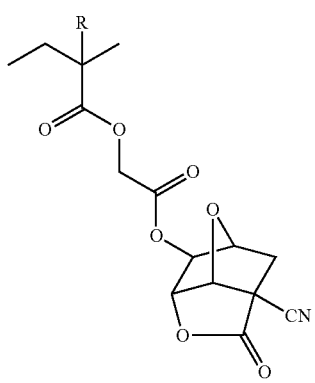
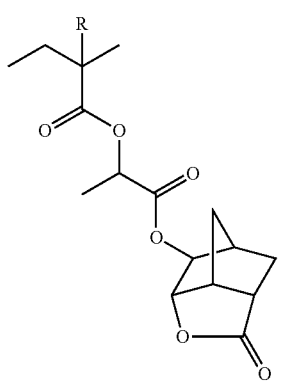
36
-continued
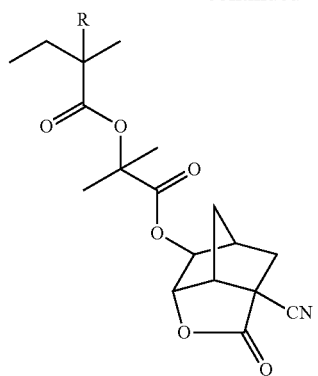
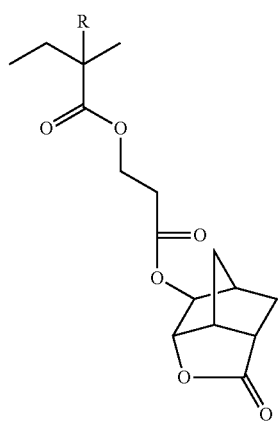
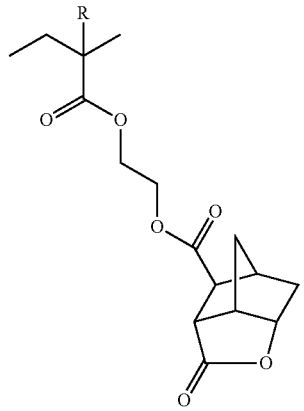
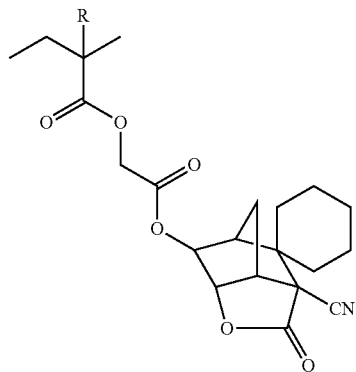

-continued

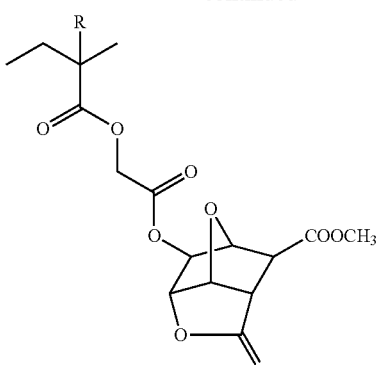

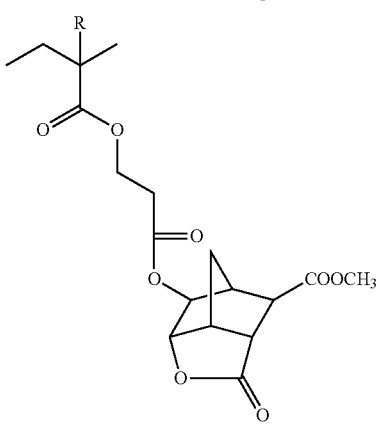

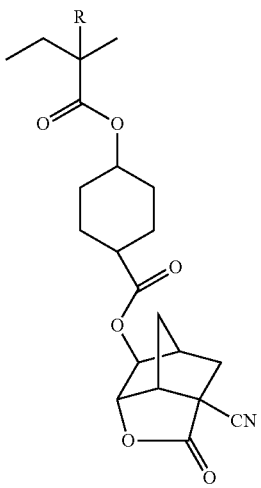

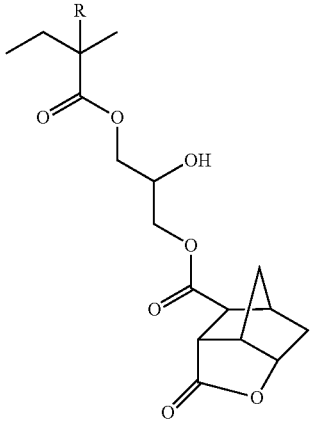

-continued

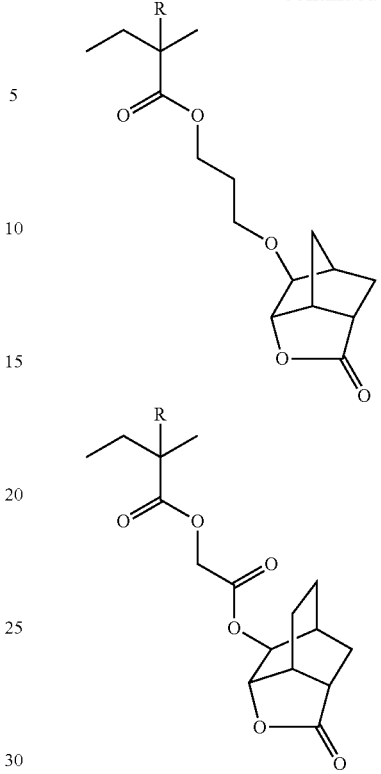

The repeating unit having a lactone group usually has an optical isomer, but any optical isomer may be used.

The content of the repeating unit having a lactone group is preferably from 15 to 60 mol %, more preferably from 20 to 50 mol %, still more preferably from 30 to 50 mol %, based on all repeating units in the resin.

Two or more kinds of lactone repeating units may also be used in combination for raising the effects of the present invention. When using lactone repeating units in combination, out of formula (3-1), two or more kinds of lactone repeating units where n is 1 are preferably selected and used in combination. It is also preferred to use in combination a lactone repeating unit where Ab in formula (AII) is a single bond and a lactone repeating unit where n is 1 out of formula (3-1).

The resin (A) preferably contains a repeating unit having a hydroxyl group or a cyano group and being not acid-decomposable. Thanks to this repeating unit, the adherence to substrate is enhanced. The repeating unit having a hydroxyl group or a cyano group is preferably a repeating unit having an alicyclic hydrocarbon structure substituted with a hydroxyl group or a cyano group. The alicyclic hydrocarbon structure in the alicyclic hydrocarbon structure substituted with a hydroxyl group or a cyano group is preferably an adamantyl group, a diamantyl group or a norbornyl group. Preferred examples of the alicyclic hydrocarbon structure substituted with a hydroxyl group or a cyano group include a monohydroxyadamantyl group, a dihydroxyadamantyl group, a monohydroxydiamantyl group, a dihydroxydiamantyl group, and a norbornyl group substituted with a cyano group.

The repeating unit having the above-described atomic group includes repeating units represented by the following formulae (AIIa) to (AIId):

In formulae (AIIa) to (AIId), $R_{1c}$ represents a hydrogen atom, a methyl group, a trifluoromethyl group or a hydroxymethyl group.

Each of $R_{2c}$ to $R_{4c}$ independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (AIIa), more preferably, two members out of $R_{2c}$ to $R_{4c}$ are a hydroxyl group and the remaining is a hydrogen atom.

The content of the repeating unit having a hydroxyl group or a cyano group is preferably from 5 to 40 mol %, more preferably from 5 to 30 mol %, still more preferably from 10 to 25 mol %, based on all repeating units in the resin (A).

Specific examples of the repeating unit having a hydroxyl group or a cyano group are set forth below, but the present invention is not limited thereto.

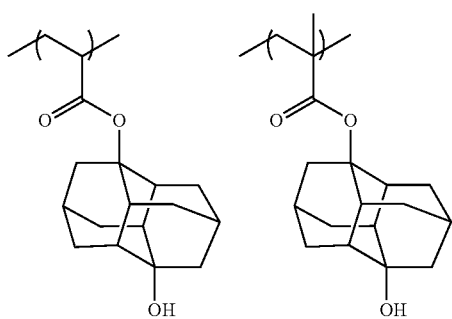

The resin used for the resist composition in the present invention may contain a repeating unit having an alkali-soluble group. The alkali-soluble group includes a carboxyl group, a sulfonamide group, a sulfonylimide group, a bis-sulfonylimide group, and an aliphatic alcohol substituted with an electron-withdrawing group at the α-position (e.g., hexafluoroisopropanol). A carboxyl group is preferred. By virtue of containing an alkali-soluble group-containing repeating unit in the resin, the resolution increases when performing development with an alkali developer.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto. In specific examples, Rx represents H, $CH_3$, $CH_2OH$ or $CF_3$.

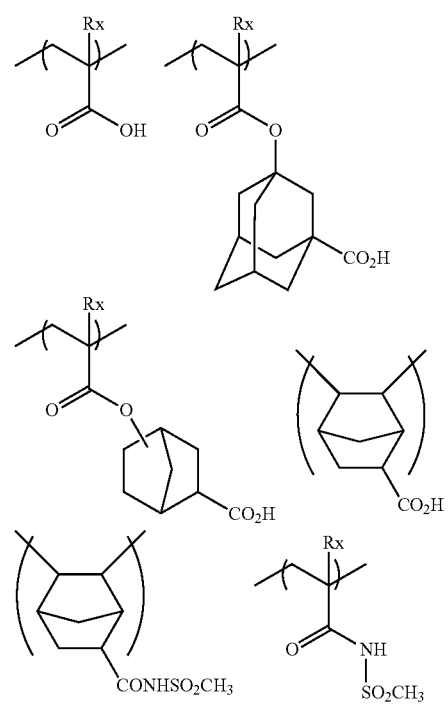

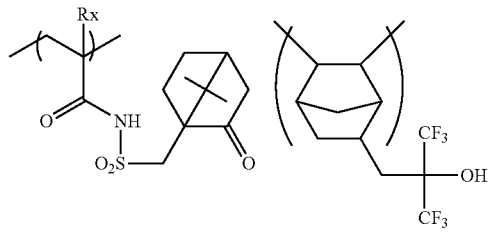

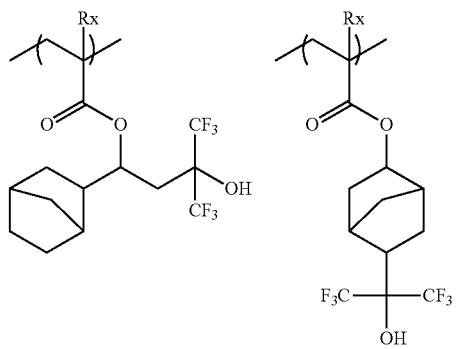

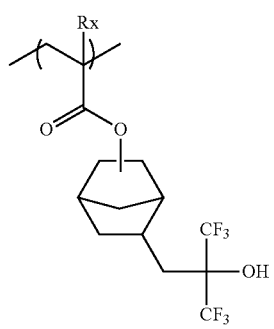

The resin (A) for use in the present invention preferably further contains a repeating unit having a cyclic hydrocarbon structure free from a polar group (e.g., hydroxyl group, cyano group) and not exhibiting acid decomposability. Thanks to this repeating unit, the dissolving out of low molecular components from the resist film to the immersion liquid at the immersion exposure can be reduced and at the same time, the solubility of the resin at the development using an organic solvent-containing developer can be appropriately adjusted. This repeating unit includes a repeating unit represented by formula (4):

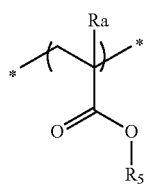

(4)

In formula (4), R_5 represents a hydrocarbon group having at least one cyclic structure and having no polar group (e.g., hydroxyl group, cyano group).

Ra represents a hydrogen atom, an alkyl group or a —$CH_2$—O—$Ra_z$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group, a perhydronaphthalenyl group, a biphenyl group and a 4-cyclohexylphenyl group. Examples of the crosslinked cyclic hydrocarbon ring include a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by condensing a plurality of 5- to 8-membered cycloalkane rings). Preferred examples of the crosslinked cyclic hydrocarbon ring include a norbornyl group, an adamantyl group, a bicyclooctanyl group and a tricyclo[5.2.1.0^{2,6}]decanyl group, with a norbornyl group and an adamantyl group being more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the cycloalkyl group is preferably a cycloalkyl group having a carbon number of 3 to 20; the aralkyl group is preferably a benzyl group or a naphthyl methyl group; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the alkoxycarbonyl group is preferably an alkoxycarbonyl group having a carbon number of 2 to 4; and the aralkyloxycarbonyl group is preferably a benzyloxycarbonyl group or the like.

$R_5$ may also be an aryl group or an aralkyl group.

The aryl group is preferably an aryl group having a carbon number of 6 to 12, and specific examples thereof include a phenyl group, a naphthyl group and a biphenyl group. The aryl group may be further substituted with an alkyl group, a cycloalkyl group or the like.

The aralkyl group is preferably an aralkyl group having a carbon number of 7 to 15, and specific examples thereof include a benzyl group, a naphthylmethyl group and a naphthylethyl group. The aralkyl group may be further substituted with an alkyl group, a cycloalkyl group or the like.

The content of the repeating unit having a cyclic hydrocarbon structure free from a polar group and not exhibiting acid decomposability is preferably from 0 to 40 mol %, more preferably from 0 to 20 mol %, based on all repeating units in the resin (A).

In the case where the resin (A) has a repeating unit having an alicyclic hydrocarbon structure free from a polar group and not exhibiting acid decomposability, the content of the repeating unit having an alicyclic hydrocarbon structure free from a polar group and not exhibiting acid decomposability is preferably from 1 to 20 mol % based on all repeating unit in the resin (A).

Specific examples of the repeating unit having a cyclic hydrocarbon structure free from a polar group and not exhibiting acid decomposability are set forth below, but the present invention is not limited thereto. In the formulae, Ra represents H, $CH_3$, $CH_2OH$ or $CF_3$.

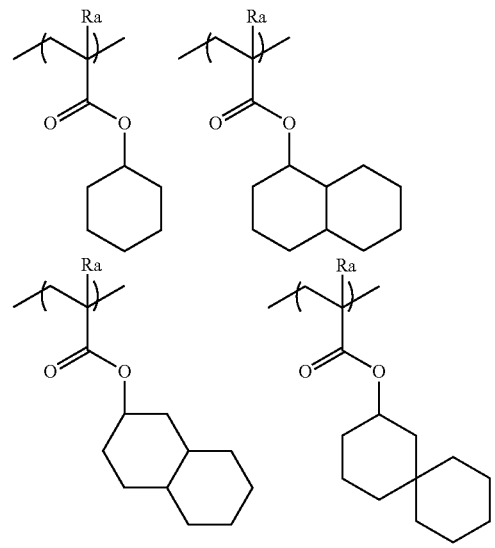

-continued

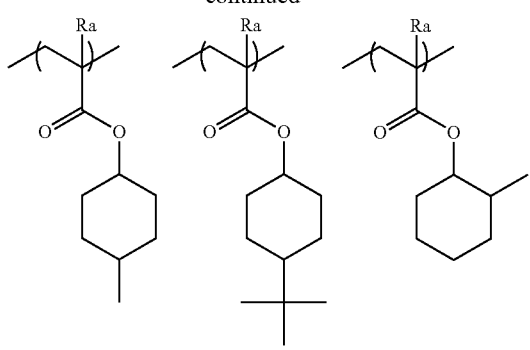

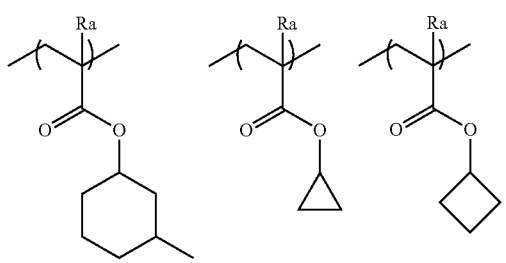

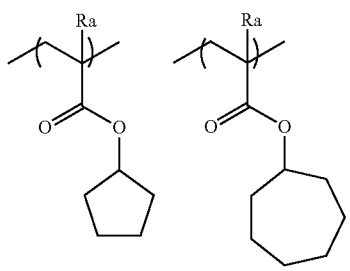

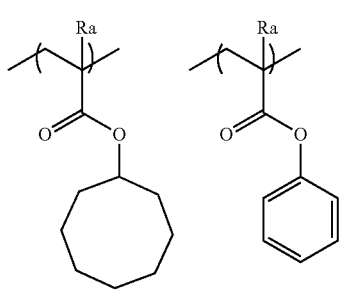

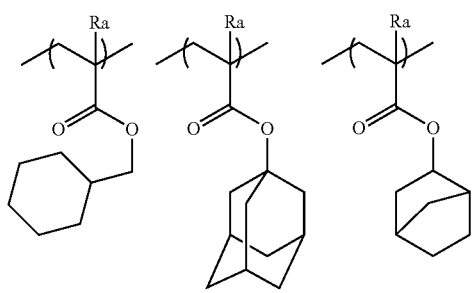

-continued

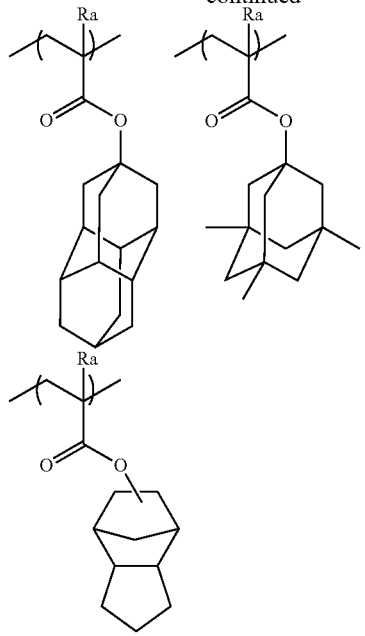

The resin for use in the resist composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin used for the resist composition in the present invention, particularly (1) solubility in the coating solvent, (2) film-forming property (glass transition point), (3) developability, (4) film loss, (5) adherence of unexposed area to substrate, (6) dry etching resistance and the like can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these compounds, an addition-polymerizable unsaturated compound copolymerizable with the monomers corresponding to the above-described various repeating structural units may be copolymerized.

In the resin (A) used for the resist composition in the present invention, the molar ratio of respective repeating structural units contained is appropriately determined to control the dry etching resistance of resist, suitability for standard developer, adherence to substrate, resist profile and performances generally required of a resist, such as resolution, heat resistance and sensitivity.

In the case where the resist composition in the present invention is used for ArF exposure, it is preferred in view of transparency to ArF light to have substantially no aromatic group (specifically, the ratio of an aromatic group-containing repeating unit in the resin is preferably 5 mol % or less, more preferably 3 mol % or less, and ideally 0 mol %), and the resin (A) preferably has a monocyclic or polycyclic alicyclic hydrocarbon structure.

Also, the resin (A) preferably contains no fluorine atom and no silicon atom in view of compatibility with the later-described hydrophobic resin (E).

The resin (A) used for the resist composition in the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the content of the acrylate-based repeating unit is preferably 50 mol % or less based on all repeating units. It is also preferred that the resin is a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted with a hydroxyl group or a cyano group, and from 0 to 20 mol % of other (meth)acrylate-based repeating units.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is collected by a method such as powder or solid recovery. The concentration of the solute in the reaction solution is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin (A) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is in the range above, deterioration of heat resistance, dry etching resistance and developability as well as deterioration of the film-forming property due to increase in the viscosity can be prevented.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the roughness is more improved.

The amount of the resin (A) blended in the entire resist composition for use in the present invention is preferably from 50 to 99 mass %, more preferably from 60 to 95 mass %, based on the entire solid content.

As regards the resin (A) for use in the present invention, one kind of a resin may be used or a plurality of kinds of resins may be used in combination.

(B) Compound Capable of Generating an Acid Upon Irradiation with an Actinic Ray or Radiation The resist composition for use in the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a known compound that generates an acid upon irradiation with an actinic ray or radiation and is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone and o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used. Furthermore, compounds capable of generating an acid by the effect of light described, for example, in U.S. Pat. No. 3,779,778 and European Patent 126,712 may also be used.

Out of the acid generators, preferred compounds are compounds represented by the following formulae (ZI), (ZII) and (ZIII):

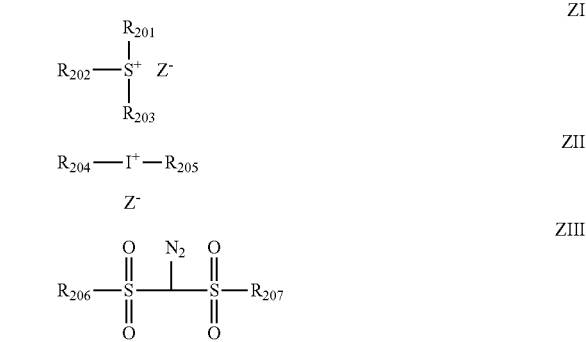

In formula (ZI), each of $R_{201}$, $R_{202}$ and $R_{203}$ independently represents an organic group. The carbon number of the organic group as $R_{201}$, $R_{202}$ and $R_{203}$ is generally from 1 to 30, preferably from 1 to 20. Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene). $Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methide anion.

The non-nucleophilic anion is an anion having an extremely low ability of causing a nucleophilic reaction, and this anion can suppress the decomposition with aging due to an intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion and aliphatic carboxylate anion may be an alkyl group or a cycloalkyl group but is preferably an alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion, aliphatic carboxylate anion, aromatic sulfonate anion and aromatic carboxylate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

One preferred embodiment of the aliphatic sulfonate anion is an anion that produces an acid represented by the following formula (I):

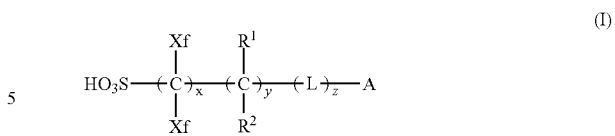

In the formula, each Xf independently represents a fluorine atom or an alkyl group substituted with at least one fluorine atom. Each of $R^1$ and $R^2$ independently represents a group selected from a hydrogen atom, a fluorine atom, an alkyl group and an alkyl group substituted with at least one fluorine atom, and when a plurality of $R^1$'s or $R^2$'s are present, each $R^1$ or $R^2$ may be the same as or different from every other $R^1$ or $R^2$. L represents a single bond or a divalent linking group, and when a plurality of L's are present, each L may be the same as or different from every other L. A represents a group having a cyclic structure. x represents an integer of 1 to 20, y represents an integer of 0 to 10, and z represents an integer of 0 to 10.

Formula (I) is described in more detail.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4, more preferably a fluorine atom or $CF_3$.

The alkyl group of $R^1$ and $R^2$ may have a substituent (preferably a fluorine atom) and is preferably an alkyl group having a carbon number of 1 to 4, more preferably a perfluoroalkyl group having a carbon number of 1 to 4, still more preferably $CF_3$.

Each of $R^1$ and $R^2$ is preferably a fluorine atom or $CF_3$.

y is preferably an integer of 0 to 4, more preferably 0, x is preferably an integer of 1 to 8, more preferably from 1 to 4, and z is preferably an integer of 0 to 8, more preferably from 0 to 4.

The divalent linking group of L is not particularly limited, and examples thereof include —COO—, —OCO—, —CO—, —O—, —S—, —SO—, —SO$_2$—, an alkylene group, a cycloalkylene group, an alkenylene group, and a linking group formed by connecting a plurality of these members. The divalent linking group is preferably a linking group having a total carbon number of 12 or less. Above all, —COO—, —OCO—, —CO—, —O— and —SO$_2$— are preferred, and —COO—, —OCO— and —SO$_2$— are more preferred.

The group having a cyclic structure of A is not particularly limited as long as it has a cyclic structure, and examples thereof include an alicyclic group, an aryl group and a heterocyclic structure-containing group (including not only those having aromaticity but also those having no aromaticity).

The alicyclic group may be monocyclic or polycyclic and is preferably a monocyclic cycloalkyl group such as cyclopentyl group, cyclohexyl group and cyclooctyl group, or a polycyclic cycloalkyl group such as norbornyl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film at the PEB (post-exposure baking) step can be suppressed and mask error enhancement factor (MEEF) can be improved. MEEF indicates a variation of the pattern size with respect to the mask dimension error and when this value is large, the mask production requires a very high cost and at the same time, the yield in device production decreases.

Examples of the aryl group include a benzene ring, a naphthalene ring, a phenanthrene ring and an anthracene ring. Among these, naphthalene having low absorbance is preferred in view of absorbance for light at 193 nm.

Examples of the heterocyclic structure-containing group include a furan ring, a thiophene ring, a benzofuran ring, a benzothiophene ring, a dibenzofuran ring, a dibenzothiophene ring, a pyridine ring and a piperidine ring. Among these, a furan ring, a thiophene ring, a pyridine ring and a piperidine ring are preferred. Also, a heterocyclic structure having a nitrogen atom or an oxygen atom is preferred.

The cyclic structure-containing group also includes a lactone structure, and specific examples thereof include the above-described lactone structures represented by formulae (LC1-1) to (LC1-17) which the resin (A) may have.

The above-described cyclic structure-containing group may have a substituent, and examples of the substituent include an alkyl group (may be linear, branched or cyclic; preferably having a carbon number of 1 to 12), a cycloalkyl group (may be monocyclic, polycyclic or spirocyclic; preferably having a carbon number of 3 to 20), an aryl group (preferably having a carbon number of 6 to 14), a hydroxy group, an alkoxy group, an alkylcarbonyloxy group, an amido group, a urethane group, a ureido group, an alkylthio group, a sulfonamido group and an alkylsulfonyl group. Incidentally, the carbon constituting the cyclic structure-containing group (the carbon contributing to ring formation) may be a carbonyl carbon.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The bis(alkylsulfonyl)amide anion and tris(alkylsulfonyl)methide anion specifically include anions represented by the following formulae:

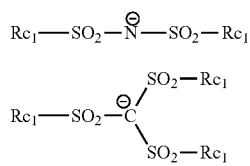

In formulae AN2 and AN3, each $Rc_1$ independently represents an organic group. The organic group in $Rc_1$ includes an organic group having a carbon number of 1 to 30 and is preferably an alkyl group which may be substituted, an aryl group, or a group formed by connecting a plurality of these groups through a single bond or a linking group such as —O—, —CO$_2$—, —S—, —SO$_3$— and —SO$_2$N($Rd_1$)—. Furthermore, the plurality of $Rc_1$'s may combine with each other through a single bond or a linking group such as alkylene group to form a ring structure.

$Rd_1$ represents a hydrogen atom or an alkyl group and may form a ring structure together with the alkyl or aryl group to which $Rd_1$ is bonded.

The alkyl group of $Rc_1$ is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group.

The aryl group of $Rc_1$ is includes an aryl group having a carbon number of 6 to 14, such as phenyl group, tolyl group and naphthyl group.

Examples of the substituent of these alkyl and aryl groups include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

$Rc_1$ is preferably an alkyl group.

The organic group of $Rc_1$ may be an alkyl group substituted with a fluorine atom or a fluoroalkyl group at the 1-position (the carbon atom bonded to SO$_2$), or a phenyl group substituted with a fluorine atom or a fluoroalkyl group. By virtue of having a fluorine atom or a fluoroalkyl group, the acidity of the acid generated upon irradiation with light increases and the sensitivity is enhanced.

Other examples of the non-nucleophilic anion include a phosphorus fluoride anion (e.g., $PF_6^-$), a boron fluoride anion (e.g., $BF_4^-$) and an antimony fluoride anion (e.g., $SbF_6^-$).

The non-nucleophilic anion of $Z^-$ is preferably an aliphatic sulfonate anion substituted with a fluorine atom at the α-position of the sulfonic acid (the carbon atom bonded to the sulfonic acid), an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium, compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole structure, a furan structure, a thiophene structure, an indole structure, a benzofuran structure and a benzothiophene structure. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

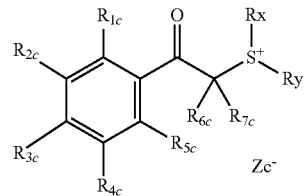

(ZI-3)

In formula (ZI-3), each of $R_{1c}$ to $R_{5c}$ independently represents a hydrogen atom, an alkyl group, a cycloalkyl group, an alkoxy group, a phenyl group, a phenylthio group or a halogen atom. Each of $R_{6c}$ and $R_{7c}$ independently represents a hydrogen atom, an alkyl group, a cycloalkyl group, a halogen atom, a cyano group or an aryl group. Each of $R_x$ and $R_y$ independently represents an alkyl group, a cycloalkyl group, an allyl group, a 2-oxoalkyl group, a 2-oxocycloalkyl group, an alkoxycarbonylalkyl group or a vinyl group.

Any two or more members out of $R_{1c}$ to $R_{5c}$, a pair of $R_{6c}$ and $R_{7c}$, or a pair of $R_x$ and $R_y$ may combine together to form a ring structure. This ring structure may contain an oxygen atom, a sulfur atom, an ester bond or an amide bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The above-described ring structure includes an aromatic or non-aromatic hydrocarbon ring, an aromatic or non-aromatic heterocycle, and a polycyclic condensed ring formed by combining two or more of these rings. The ring structure is a 3- to 10-membered ring, preferably a 4- to 8-membered ring, more preferably a 5- or 6-membered ring.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl). The aryl group as $R_{6c}$ and $R_{7c}$ is preferably an aryl group having a carbon number of 5 to 15, and examples thereof include a phenyl group and a naphthyl group.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group and a hexylene group. Also, the ring formed by combining $R_{6c}$ and $R_{7c}$ may contain a heteroatom such as oxygen atom in the ring.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylalkyl group are the same as those of the alkoxy group in $R_{1c}$ to $R_{5c}$. The alkyl group is, for example, an alkyl group having a carbon number of 1 to 12, preferably a linear alkyl group having a carbon number of to 5 (e.g., methyl, ethyl).

The allyl group is not particularly limited but is preferably an allyl group substituted with an unsubstituted, monocyclic or polycyclic cycloalkyl group.

The vinyl group is not particularly limited but is preferably a vinyl group substituted with an unsubstituted, monocyclic or polycyclic cycloalkyl group.

The ring structure which may be formed by combining $R_x$ and $R_y$ with each other includes a 5- or 6-membered ring formed by divalent $R_x$ and $R_y$ (for example, a methylene group, an ethylene group or a propylene group) together with the sulfur atom in formula (ZI-3), and a 5-membered ring (that is, a tetrahydrothiophene structure) is particularly preferred.

Each of $R_x$ and $R_y$ is preferably an alkyl or cycloalkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group. Specific examples and preferred embodiments of these aryl, alkyl and cycloalkyl groups are the same as those of the aryl, alkyl and cycloalkyl group described in $R_{201}$ to $R_{203}$ of the compound (ZI-1).

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

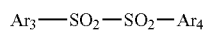

ZIV

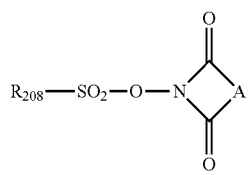

ZV

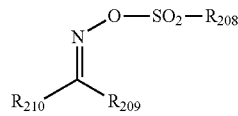

ZVI

In formulae (ZIV) to (ZVI), each of $Ar_3$ and $Ar_4$ independently represents an aryl group. Each of $R_{208}$, $R_{209}$ and $R_{210}$ independently represents an alkyl group, a cycloalkyl group or an aryl group. A represents an alkylene group, an alkenylene group or an arylene group.

Specific examples of the aryl group of $Ar_3$, $Ar_4$, $R_{208}$, $R_{209}$ and $R_{210}$ are the same as those of the aryl group as $R_{201}$, to $R_{203}$ in formula (ZI). Specific examples of the alkyl and cycloalkyl groups of $R_{208}$, $R_{209}$ and $R_{210}$ are the same as those of the alkyl and cycloalkyl groups of $R_{201}$ to $R_{203}$ in formula (ZI).

The alkylene group of A includes an alkylene group having a carbon number of 1 to 12 (e.g., methylene, ethylene, propylene, isopropylene, butylene, isobutylene), the alkenylene of A includes an alkenylene group having a carbon number of 2 to 12 (e.g., vinylene, propenylene, butenylene), and the arylene group of A includes an arylene group having a carbon number of 6 to 10 (e.g., phenylene, tolylene, naphthylene).

Among the acid generators, more preferred are the compounds represented by formulae (ZI) to (ZIII). The acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are set forth below.

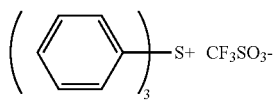

(z1)

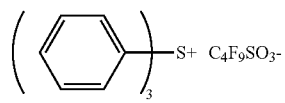

(z2)

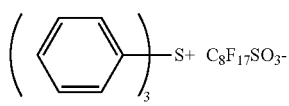

(z3)

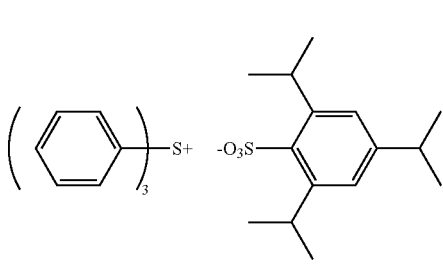

(z4)

-continued
(z5) 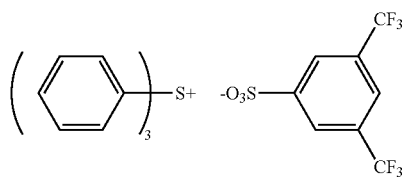
(z6) 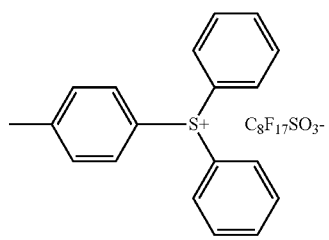
(z7) 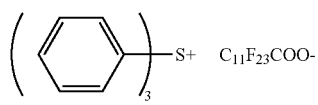
(z8) 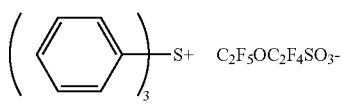
(z9) 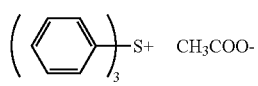
(z10) 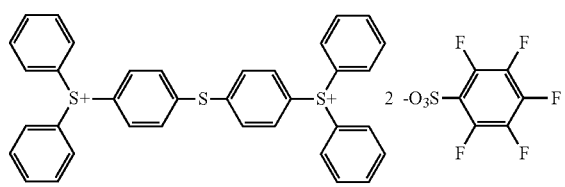
(z11) 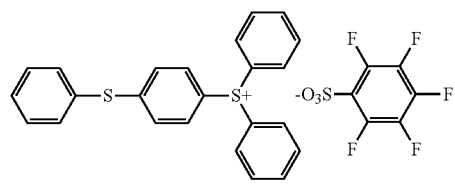
(z12) 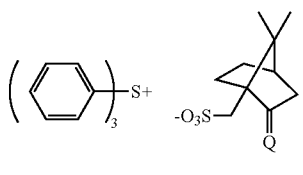
(z13) 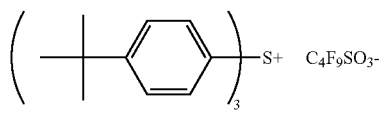
(z14) 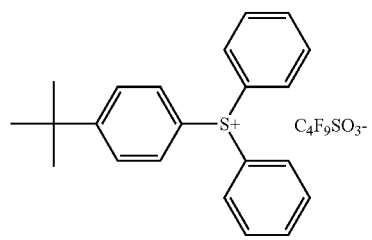
(z15) 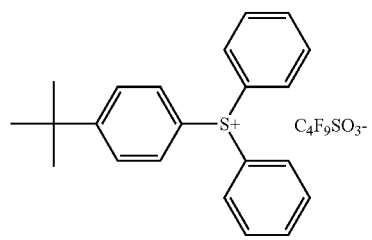
(z16) 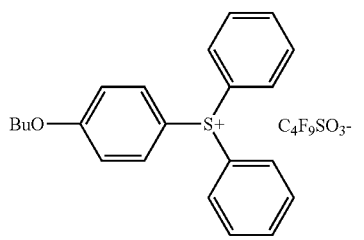
(z17) 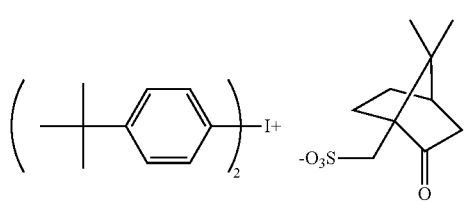
(z18) 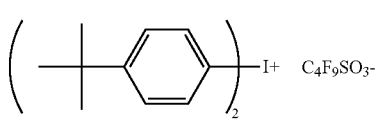
(z19) 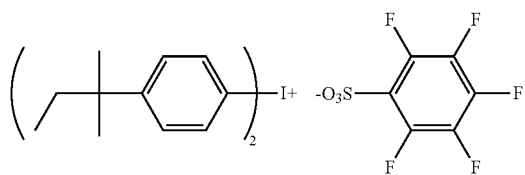
(z20) 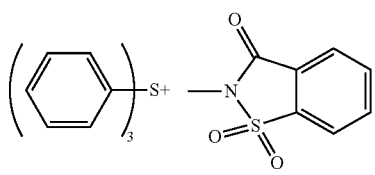

-continued
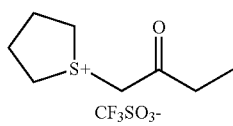 (z21)
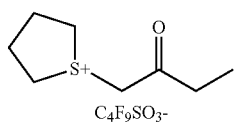 (z22)
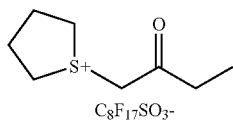 (z23)
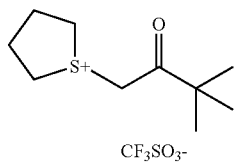 (z24)
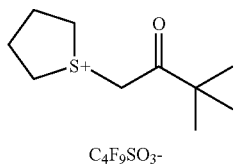 (z25)
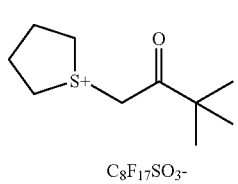 (z26)
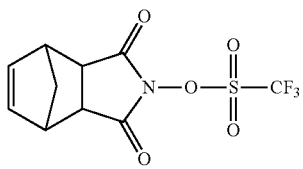 (z27)
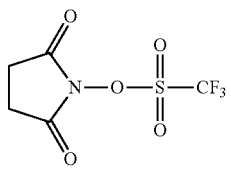 (z28)
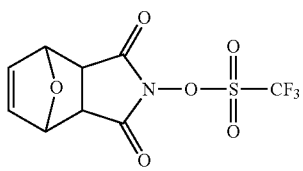 (z29)
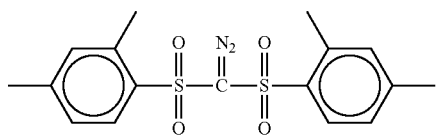 (z30)
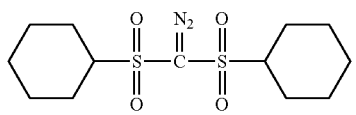 (z31)
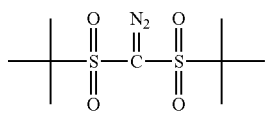 (z32)
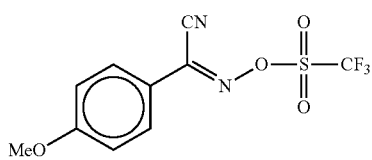 (z33)
 (z34)
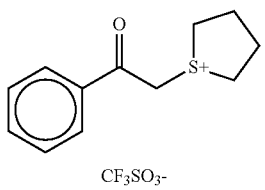 (z35)
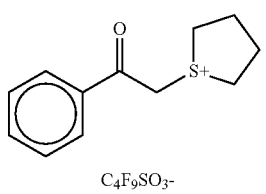 (z36)

-continued
(z37) 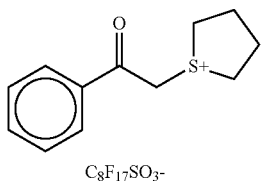
(z38) 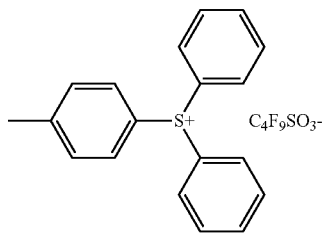
(z39) 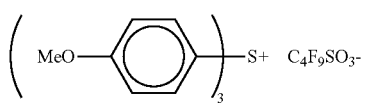
(z40) 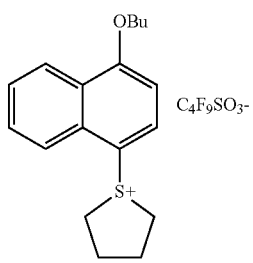
(z41) 
(z42) 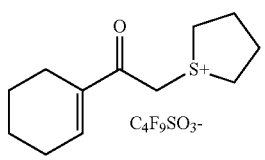
(z43) 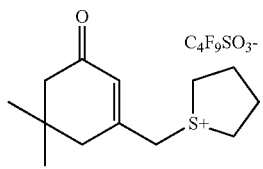
(z44) 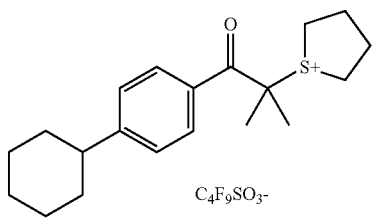
(z45) 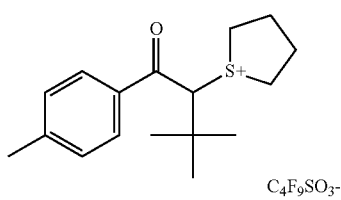
(z46) 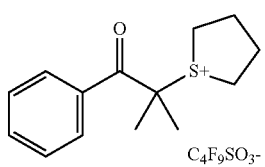
(z47) 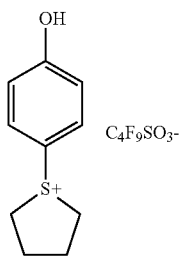
(z48) 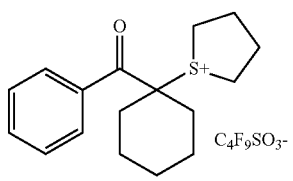
(z49) 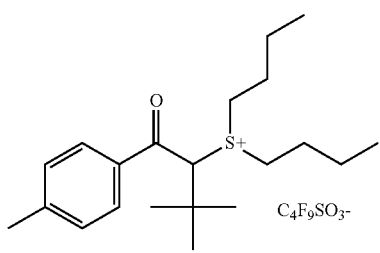
(z50) 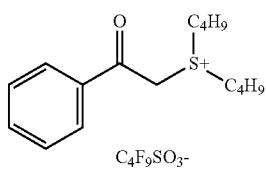

-continued
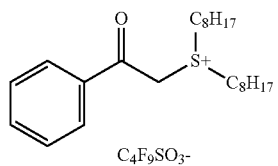 (z51)
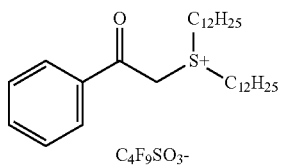 (z52)
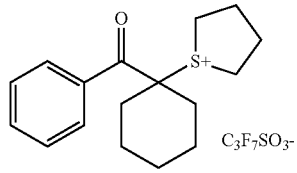 (z53)
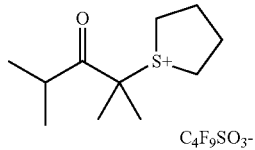 (z54)
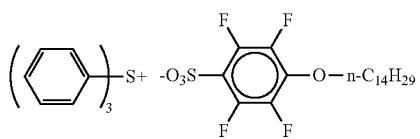 (z55)
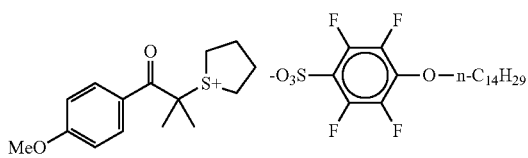 (z56)
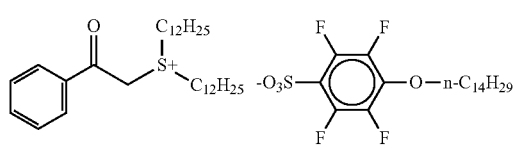 (z57)
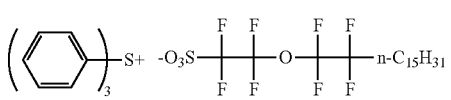 (z58)
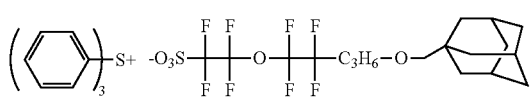 (z59)
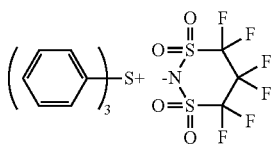 (z60)
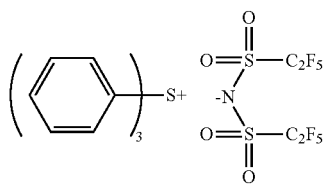 (z61)
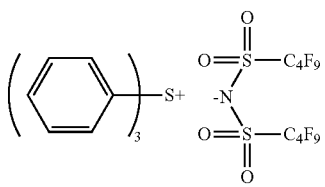 (z62)
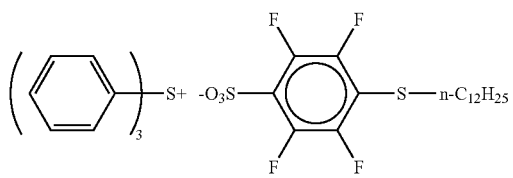 (z63)
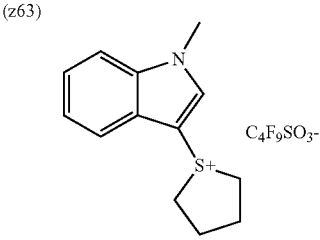 (z64)
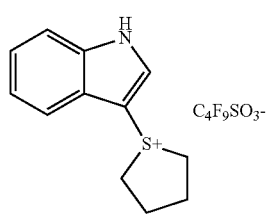 (z65)
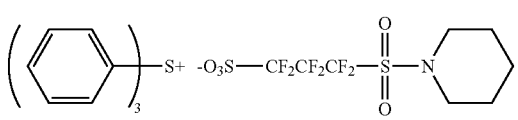 (z66)
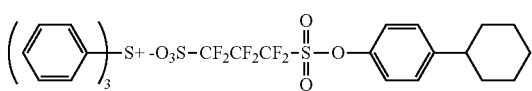 (z68)

-continued
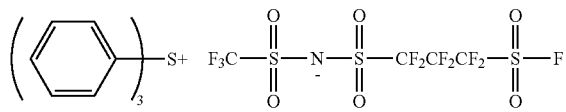 (z69)
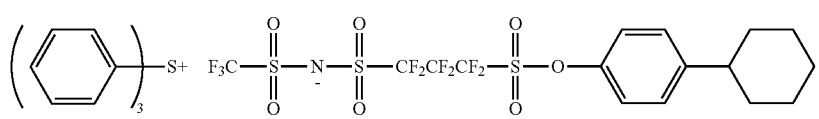 (z70)
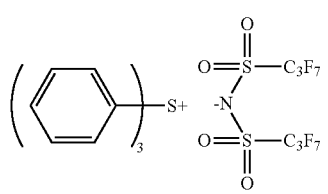 (z71)
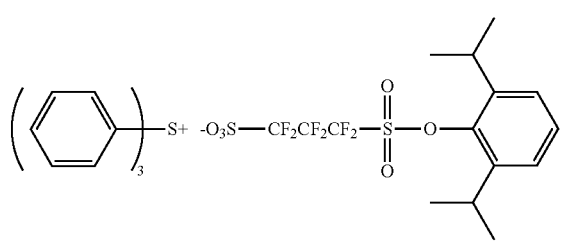 (z72)
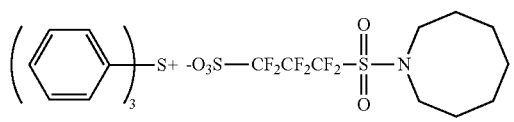 (z73)
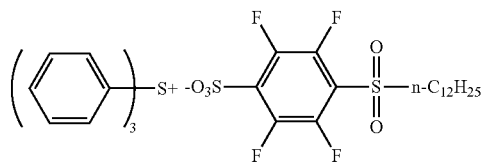 (z74)
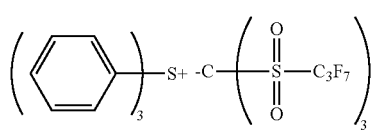 (z75)
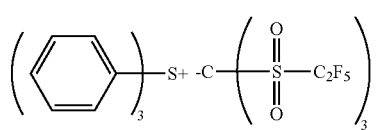 (z76)
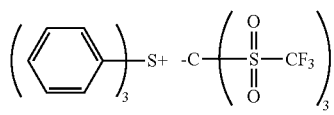 (z77)
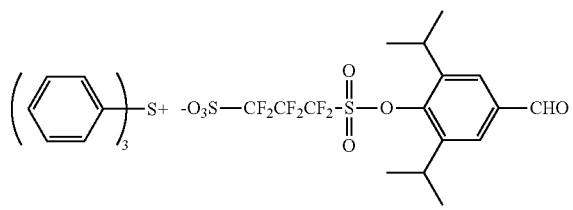 (z78)
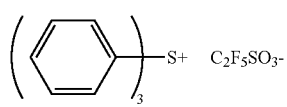 (z79)
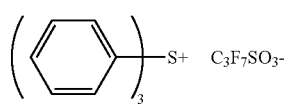 (z80)
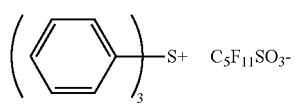 (z81)
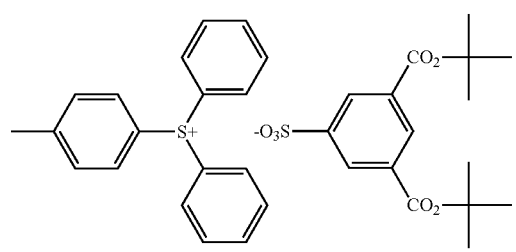 (z82)

-continued
(z83) 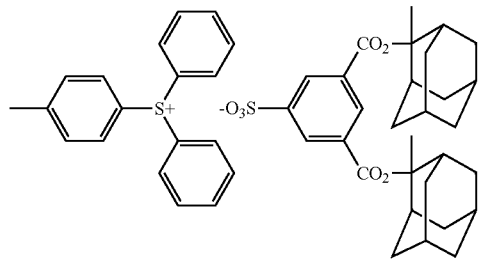
(z84) 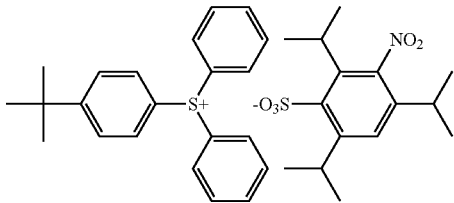
(z85) 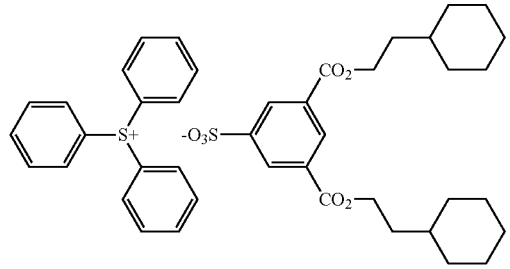
(z86) 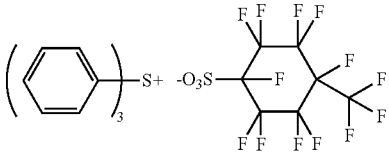
(z87) 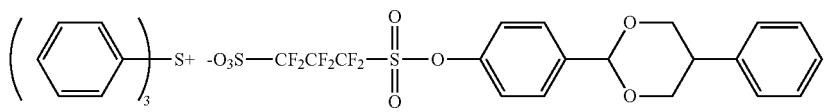
(z88) 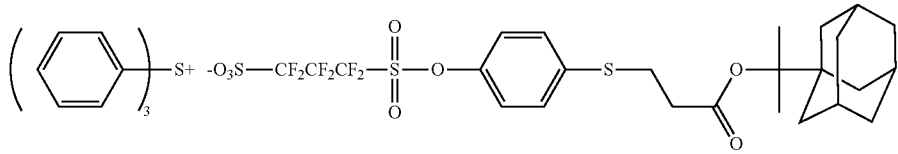
(z89) 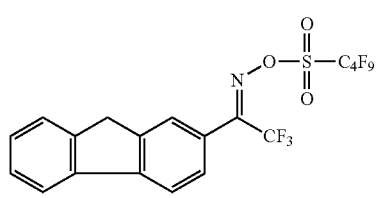
(z90) 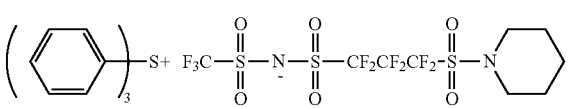
(z91) 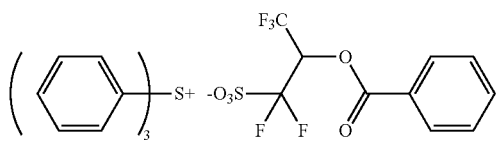
(z92) 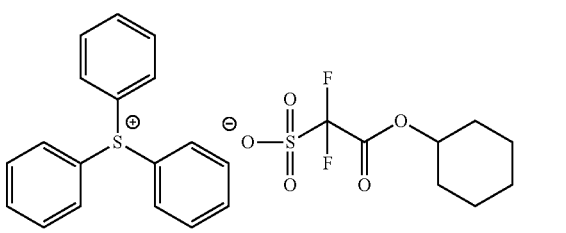
(z93) 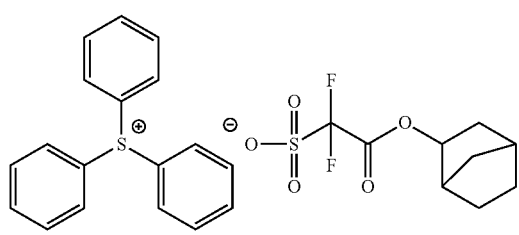
(z94) 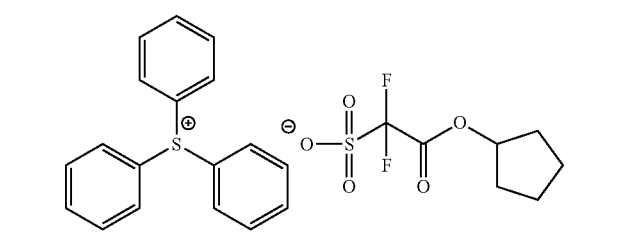

-continued

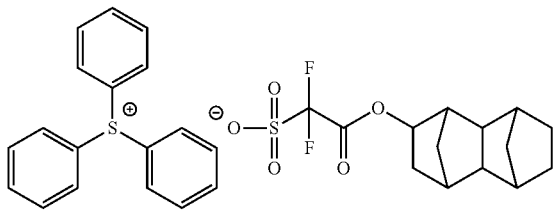
(z95) (z96)

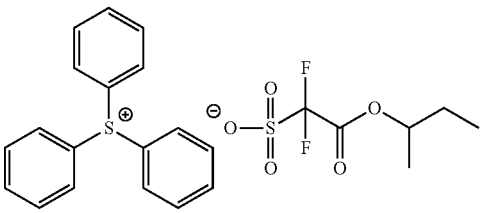
(z97) (z98)

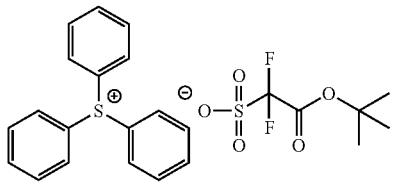
(z99) (z100)

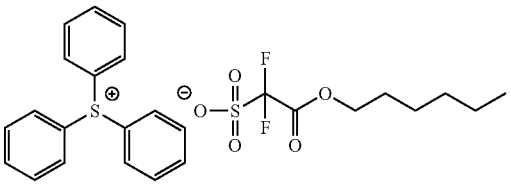
(z101) (z102)

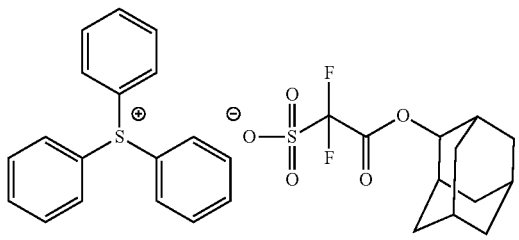
(z103)

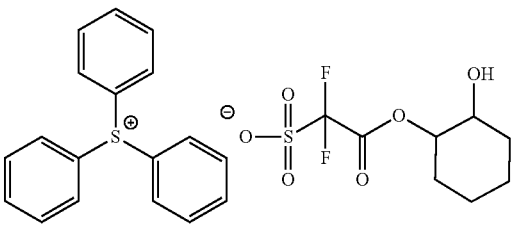

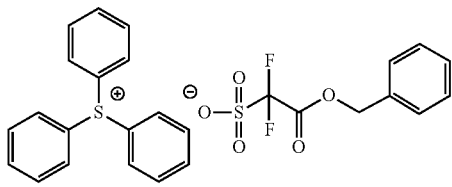

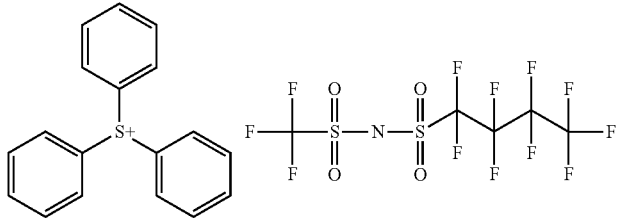

As for the acid generator, one kind of an acid generator may be used alone, or two or more kinds of acid generators may be used in combination. The content of the acid generator in the resist composition is preferably from 0.1 to 20 mass %, more preferably from 0.5 to 10 mass %, still more preferably from 1 to 7 mass %, based on the entire solid content of the resist composition.

(C) Basic Compound or Ammonium Salt Compound whose Basicity Decreases Upon Irradiation with an Actinic Ray or Radiation The resist composition for use in the present invention contains a basic compound or ammonium salt compound whose basicity decreases upon irradiation with an actinic ray or radiation (hereinafter sometimes referred to as a "compound (PA)").

The compound (PA) is preferably (PA') a compound having a basic functional group or an ammonium group and a group capable of generating an acidic functional group upon irradiation with an actinic ray or radiation. That is, the compound (PA) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is produced due to decomposition of the compound (PA) or (PA') upon irradiation with an actinic ray or radiation and whose basicity is decreased includes compounds represented by the following formulae (PA-I), (PA-II) and (PA-III), and from the standpoint that excellent effects can be attained in a high level in terms of both LWR and DOF, compounds represented by formulae (PA-II) and (PA-III) are preferred.

The compound represented by formula (PA-I) is described below.

$$Q\text{-}A_1\text{-}(X)_n\text{-}B\text{-}R \qquad \text{(PA-I)}$$

In formula (PA-I), $A_1$ represents a single bond or a divalent linking group.

Q represents —SO$_3$H or —CO$_2$H. Q corresponds to an acidic functional group that is generated upon irradiation with an actinic ray or radiation.

X represents —SO$_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group in $A_1$ is preferably a divalent organic group having a carbon number of 2 to 12, and examples thereof include an alkylene group and a phenylene group. An alkylene group having at least one fluorine atom is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are replaced by fluorine atoms, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx is preferably a monovalent organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes particularly a group where a cycloalkyl group is substituted on a linear or branched alkyl group (for example, an adamantylmethyl group, an adamantylethyl group, a cycohexylethyl group and a camphor residue structure).

The cycloalkyl group in Rx may have a substituent and is preferably a cycloalkyl group having a carbon number of 3 to 20, and the cycloalkyl group may contain an oxygen atom in the ring.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent and is, for example, a group having a double bond at an arbitrary position of the alkyl group described for Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure and a pyrazinium structure.

The basic functional group is preferably a functional group having a nitrogen atom, more preferably a structure having a primary to tertiary amino group or a nitrogen-containing heterocyclic structure. From the standpoint of enhancing the basicity, it is preferred that all atoms adjacent to nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. Each of these groups may have a substituent.

The alkyl group, cycloalkyl group, aryl group, aralkyl group and alkenyl group in the alkyl group, cycloalkyl group, aryl group, aralkyl group and alkenyl group as R containing a basic functional group or an ammonium, group are the same as the alkyl group, cycloalkyl group, aryl group, aralkyl group and alkenyl group described for Rx.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)-, R and Rx preferably combine together to form a ring. By virtue of forming a ring structure, the stability is enhanced and the composition using this compound is also enhanced in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure composed by combining two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

The compound represented by formula (PA-II) is described below.

$$Q_1\text{-}X\text{—}NH\text{—}X_2\text{-}Q_2 \tag{PA-II}$$

In formula (PA-II), each of $Q_1$ and $Q_2$ independently represents a monovalent organic group, provided that either one of $Q_1$ and $Q_2$ has a basic functional group. $Q_1$ and $Q_2$ may combine together to form a ring, and the ring formed may have a basic functional group.

Each of $X_1$ and $X_2$ independently represents —CO— or —SO$_2$—.

Here, —NH— corresponds to an acidic functional group that is generated upon irradiation with an actinic ray or radiation.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group of $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group of $Q_1$ and $Q_2$ may have a substituent and is preferably a cycloalkyl group having a carbon number of 3 to 20, and the ring may contain an oxygen atom or a nitrogen atom.

The aryl group of $Q_1$ and $Q_2$ may have a substituent and is preferably an aryl group having a carbon number of 6 to 14.

The aralkyl group of $Q_1$ and $Q_2$ may have a substituent and is preferably an aralkyl group having a carbon number of 7 to 20.

The alkenyl group of $Q_1$ and $Q_2$ may have a substituent and includes a group having a double bond at an arbitrary position of the alkyl group above.

Examples of the substituent which each of these groups may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Preferred examples of the partial structure of the basic functional group which at least either $Q_1$ or $Q_2$ has are the same as those of the basic functional group in R of formula (PA-I).

When $Q_1$ and $Q_2$ combine together to form a ring and the ring formed has a basic functional group, examples of the structure include a structure where an alkylene group, an oxy group, an imino group or the like is further bonded to the organic group of $Q_1$ or $Q_2$.

In formula (PA-II), at least either one of $X_1$ and $X_2$ is preferably —SO$_2$—.

The compound represented by formula (PA-III) is described below.

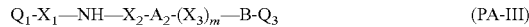

$$Q_1\text{-}X_1\text{—}NH\text{—}X_2\text{-}A_2\text{-}(X_3)_m\text{—}B\text{-}Q_3 \tag{PA-III}$$

In formula (PA-III), each of $Q_1$ and $Q_3$ independently represents a monovalent organic group, provided that either one of $Q_1$ and $Q_3$ has a basic functional group. $Q_1$ and $Q_3$ may combine together to form a ring, and the ring formed may have a basic functional group.

Each of $X_1$, $X_2$ and $X_3$ independently represents —CO— or —SO$_2$—.

$A_2$ represents a divalent linking group.

B represents a single bond, an oxygen atom or —N(Qx)-.

Qx represents a hydrogen atom or a monovalent organic group.

When B is —N(Qx)-, $Q_3$ and Qx may combine together to form a ring.

m represents 0 or 1.

Here, —NH— corresponds to an acidic functional group that is generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

When $Q_1$ and $Q_3$ combine together to form a ring and the ring formed has a basic functional group, examples of the structure include a structure where an alkylene group, an oxy group, an imino group or the like is further bonded to the organic group of $Q_1$ or $Q_3$.

The divalent linking group of $A_2$ is preferably a fluorine atom-containing divalent linking group having a carbon number of 1 to 8, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of hydrogen atoms are replaced by fluorine atoms, more preferably a perfluoroalkylene group, still more preferably a perfluoroethylene group having a carbon number of 2 to 4.

The monovalent organic group of Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —SO$_2$—.

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

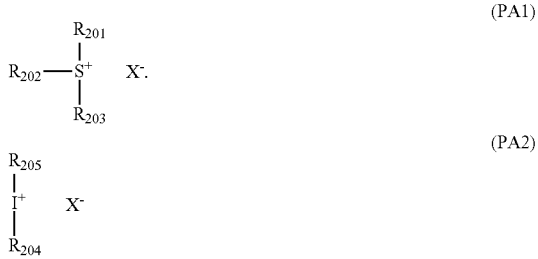

(PA1)

(PA2)

In formula (PA1), each of $R_{201}$, $R_{202}$ and $R_{203}$ independently represents an organic group, and specific examples thereof are the same as those for $R_{201}$, $R_{202}$ and $R_{203}$ of formula (ZI) in the component (B).

$X^-$ represents a sulfonate or carboxylate anion resulting from elimination of a hydrogen atom in the —SO$_3$H moiety or —COOH moiety of the compound represented by formula (PA-I), or an anion resulting from elimination of a hydrogen atom in the —NH— moiety of the compound represented by formula (PA-II) or (PA-III).

In formula (PA2), each of $R_{204}$ and $R_{205}$ independently represents an aryl group, an alkyl group or a cycloalkyl group. Specific examples thereof are the same as those for $R_{204}$ and $R_{205}$ of formula (ZII) in the component (B).

$X^-$ represents a sulfonate or carboxylate anion resulting from elimination of a hydrogen atom in the —SO$_3$H moiety or —COOH moiety of the compound represented by formula (PA-I), or an anion resulting from elimination of a hydrogen atom in the —NH— moiety of the compound represented by formula (PA-II) or (PA-III).

The compound (PA) decomposes upon irradiation with an actinic ray or radiation to produce, for example, a compound represented by formula (PA-I), (PA-II) or (PA-III).

The compound represented by formula (PA-I) is a compound having a sulfonic acid or carboxylic acid group together with a basic functional group or an ammonium group and thereby being reduced in or deprived of the basicity or changed from basic to acidic as compared with the compound (PA).

The compound represented by formula (PA-II) or (PA-III) is a compound having an organic sulfonylimino or organic carbonylimino group together with a basic functional group and thereby being reduced in or deprived of the basicity or changed from basic to acidic as compared with the compound (PA).

In the present invention, the expression "reduced in the basicity upon irradiation with an actinic ray or radiation" means that the acceptor property for a proton (an acid generated upon irradiation with an actinic ray or radiation) of the compound (PA) is decreased by the irradiation with an actinic ray or radiation. The expression "reduced in the acceptor property" means that at the occurrence of an equilibrium reaction of producing a noncovalent bond complex as a proton adduct from a basic functional group-containing compound and a proton or at the occurrence of an equilibrium reaction of causing the counter cation of the ammonium group-containing compound to be exchanged with a proton, the equilibrium constant in the chemical equilibrium decreases.

A compound (PA) whose basicity decreases upon irradiation with an actinic ray or radiation is contained in the resist film, so that in the unexposed area, the acceptor property of the compound (PA) is sufficiently brought out and an unintended reaction between an acid diffused from the exposed area or the like and the resin (A) can be inhibited, whereas in the exposed area, the acceptor property of the compound (PA) decreases and the intended reaction of an acid with the resin (A) unfailingly occurs. By virtue of such an operation mechanism, a pattern excellent in terms of line width variation (LWR), focus latitude (DOF) and pattern profile is considered to be obtained.

The basicity can be confirmed by measuring the pH, or a calculated value can be computed using a commercially available software.

Specific examples of the compound (PA) capable of producing a compound represented by formula (PA-I) upon irradiation with an actinic ray or radiation are set forth below, but the present invention is not limited thereto.

(PA-1)

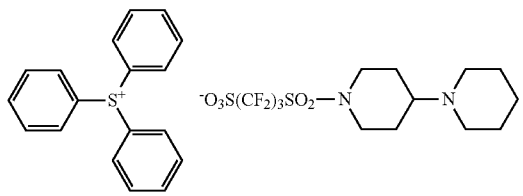

(PA-2)

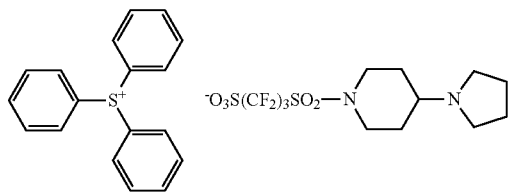

(PA-3)

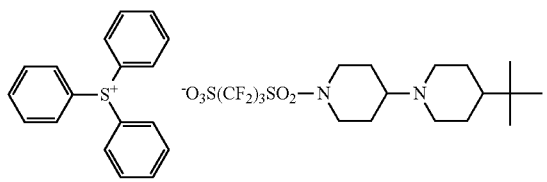

(PA-4)

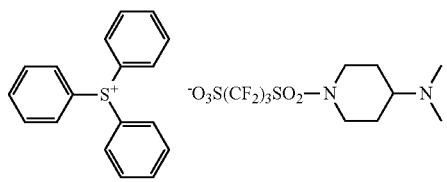

-continued
(PA-5) 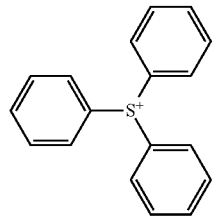 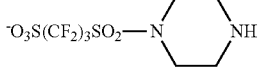
(PA-6) 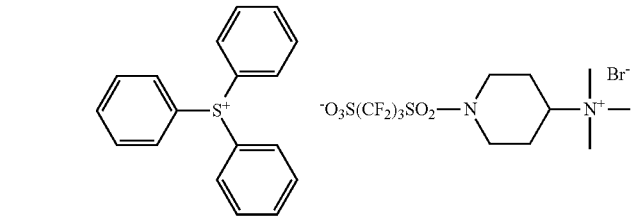
(PA-7) 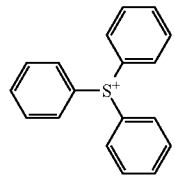 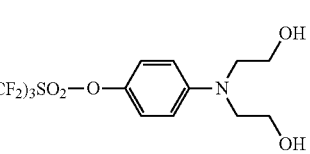
(PA-8) 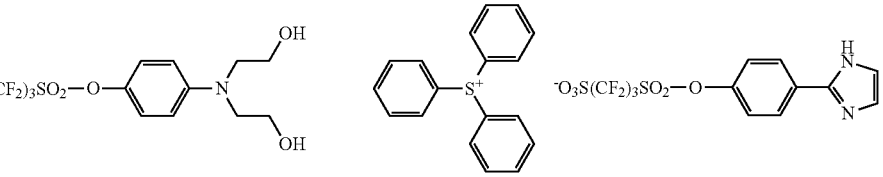
(PA-9) 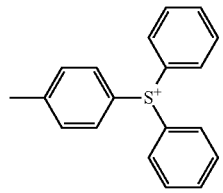 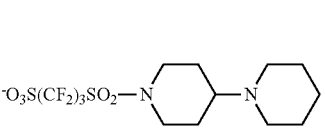
(PA-10) 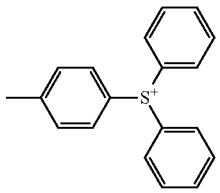
(PA-11) 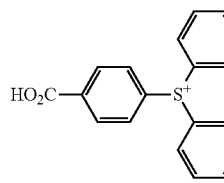 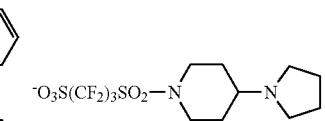
(PA-12) 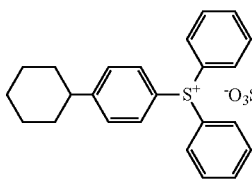
(PA-13) 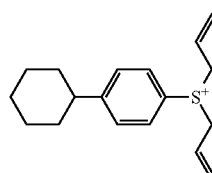 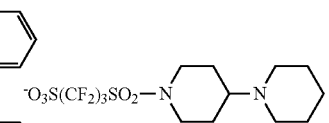
(PA-14) 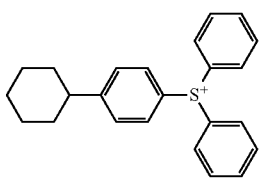
(PA-15) 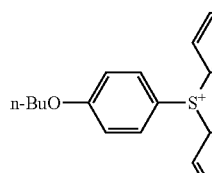 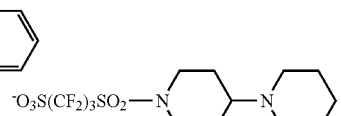
(PA-16) 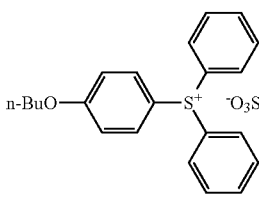
(PA-17) 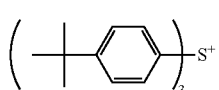 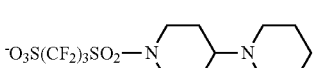
(PA-18) 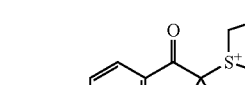 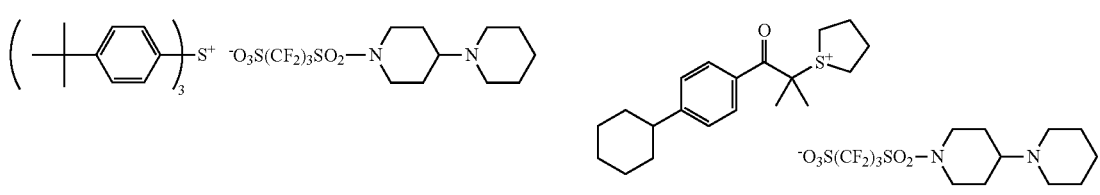

-continued
(PA-19)
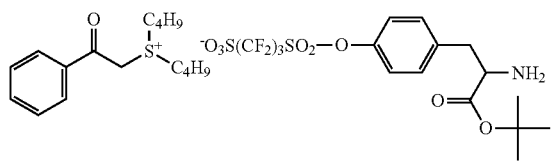
(PA-20)
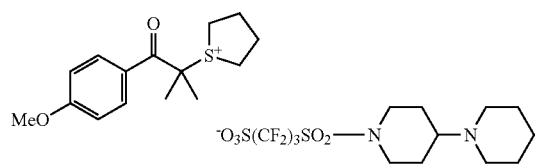
(PA-21)
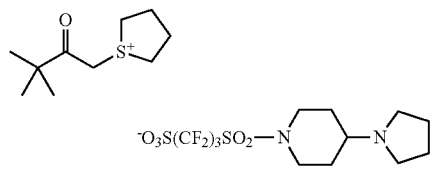
(PA-22)
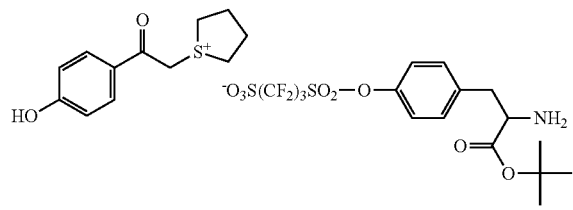
(PA-23)
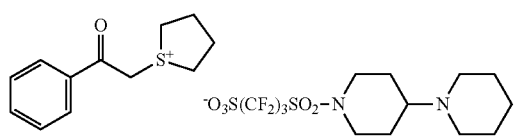
(PA-24)
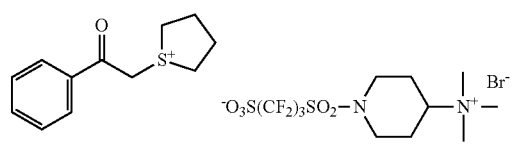
(PA-25)
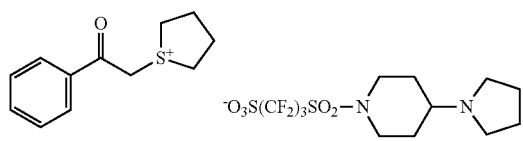
(PA-26)
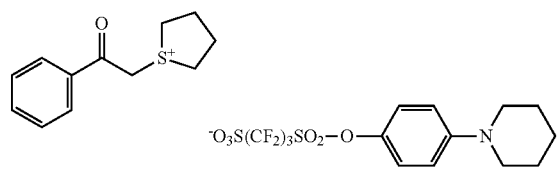
(PA-27)
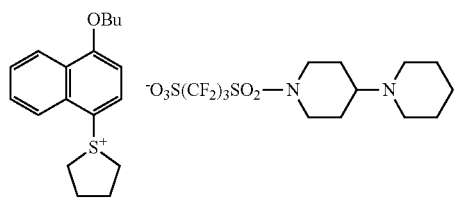
(PA-28)
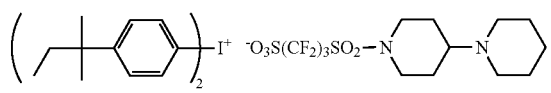
(PA-29)
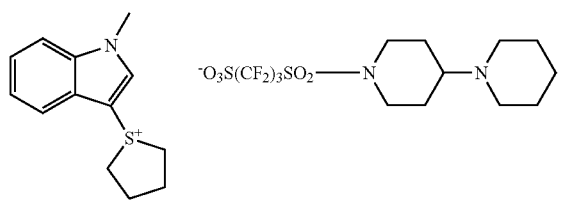
(PA-30)
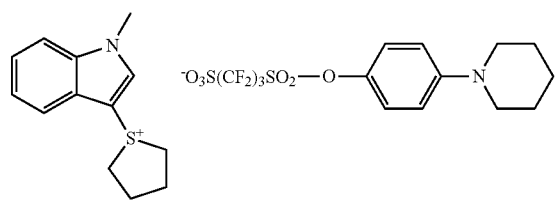
(PA-31)
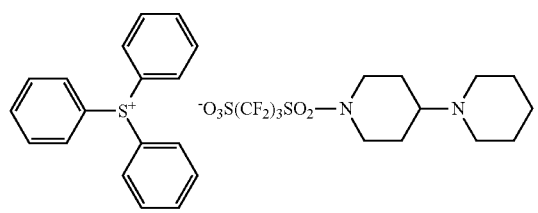
(PA-32)
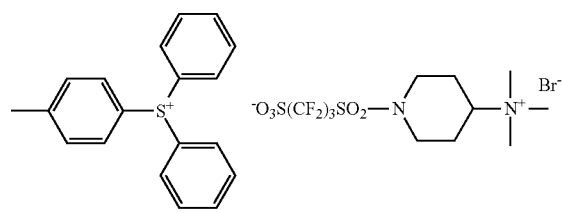

-continued
(PA-33)
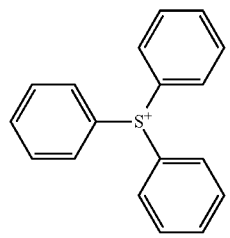
(PA-34)
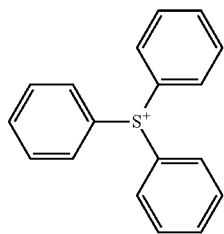
(PA-35)
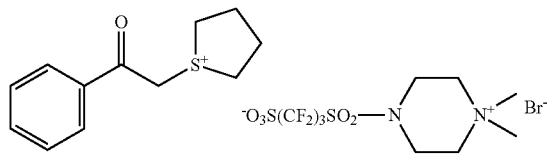
(PA-36)
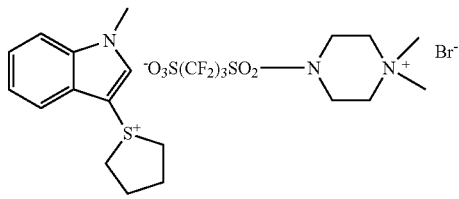
(PA-37)
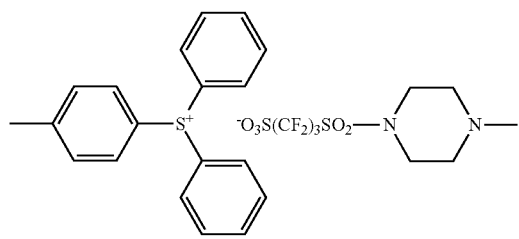
(PA-38)
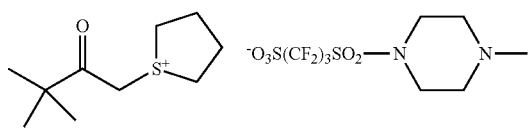
(PA-39)
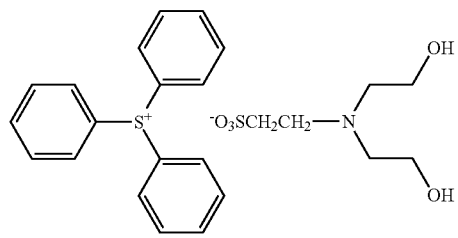
(PA-40)
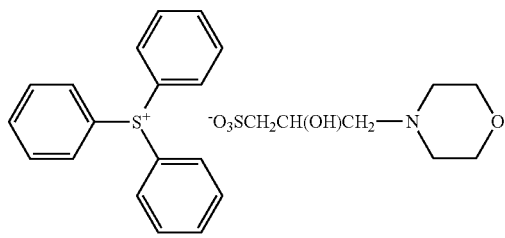
(PA-41)
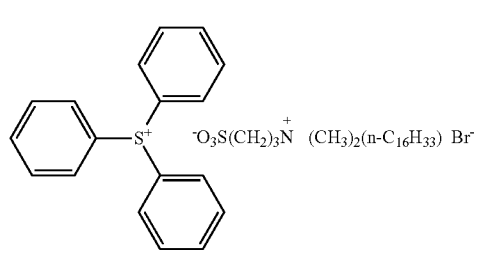
(PA-42)
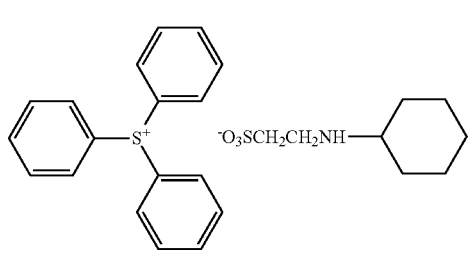
(PA-43)
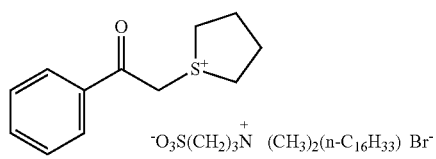
(PA-44)
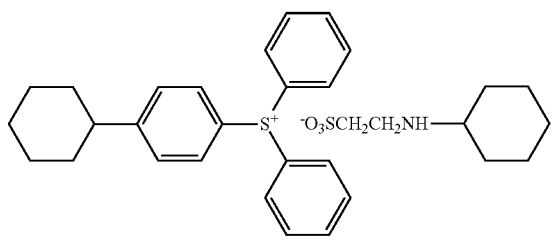

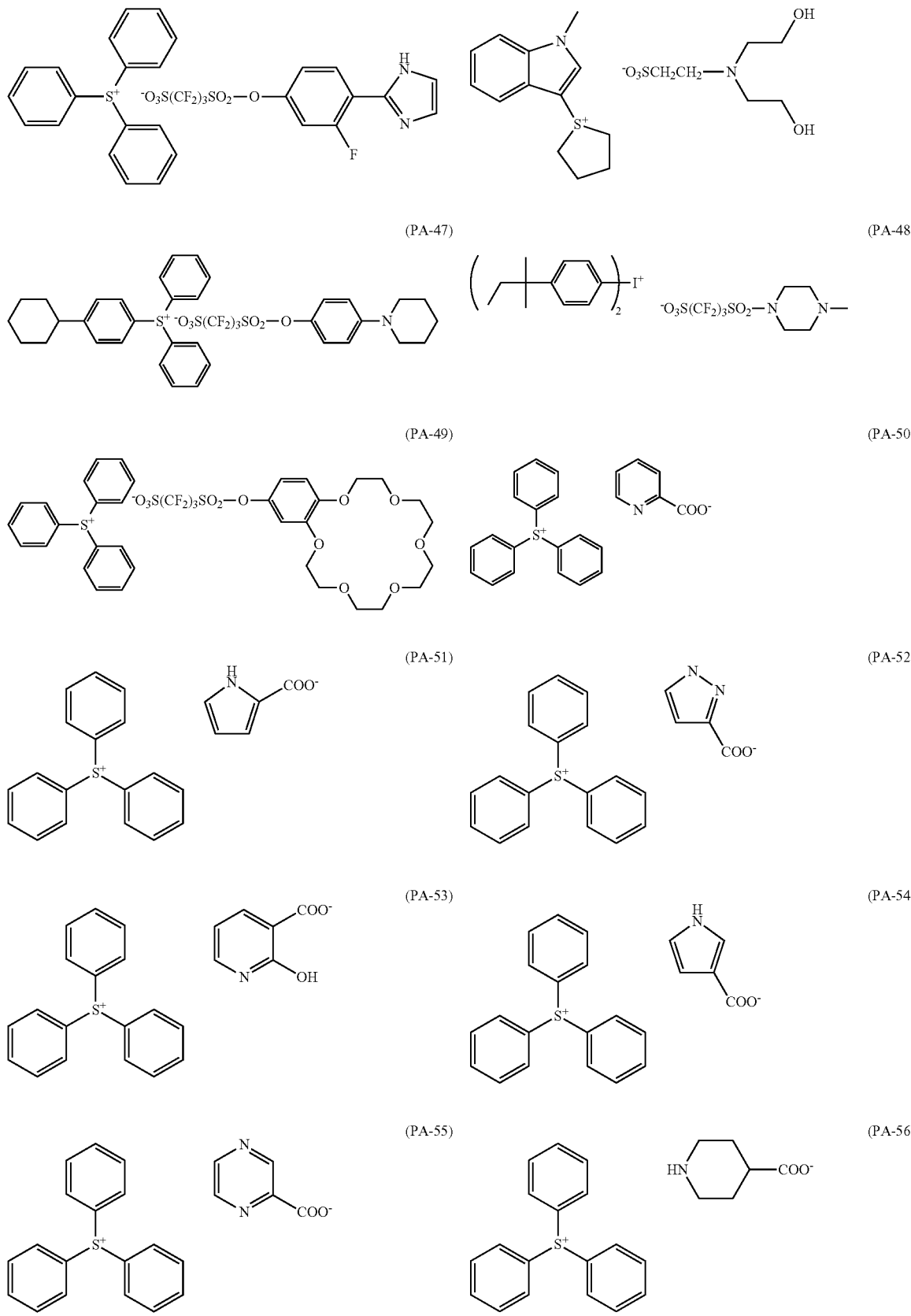

-continued

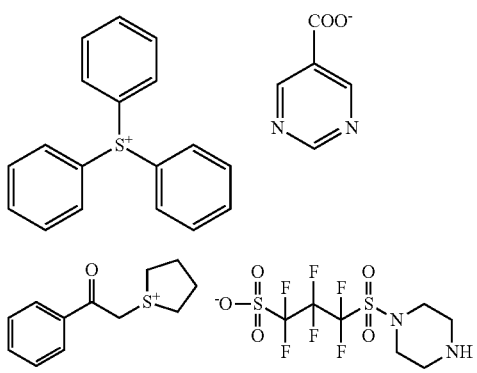
(PA-57)

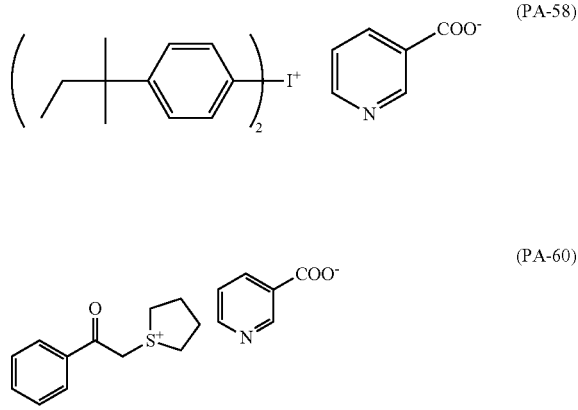
(PA-58)

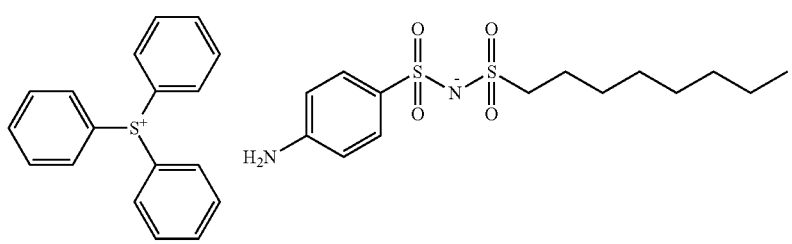

(PA-59) (PA-60)

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may also be performed in accordance with the synthesis method described in JP-A-7-333851.

Specific examples of the compound (PA) capable of producing a compound represented by formula (PA-II) or (PA-III) upon irradiation with an actinic ray or radiation are set forth below, but the present invention is not limited thereto.

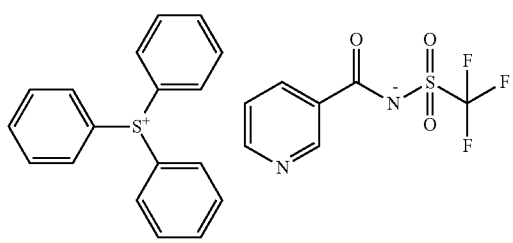
(PA-61)

(PA-62)

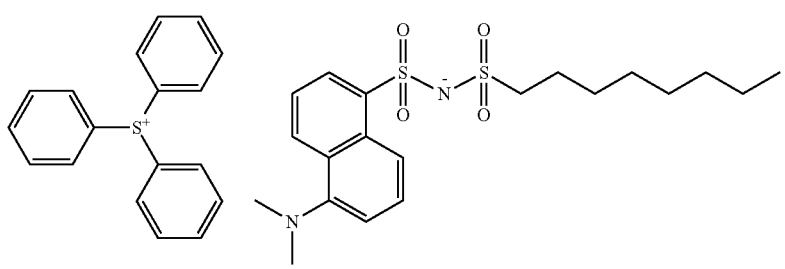
(PA-63)

(PA-64)
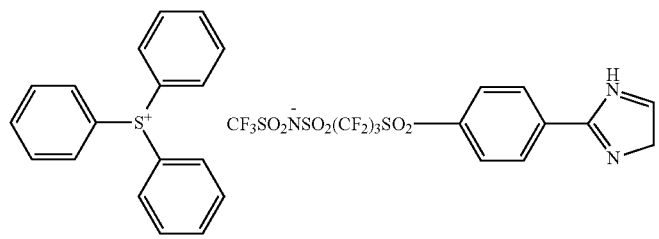
(PA-65)
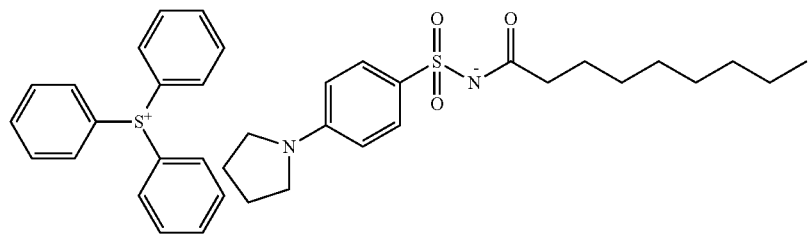
(PA-66)
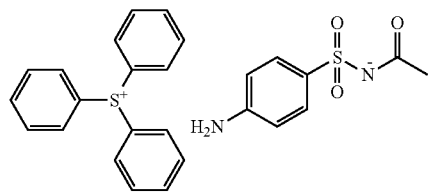
(PA-67)
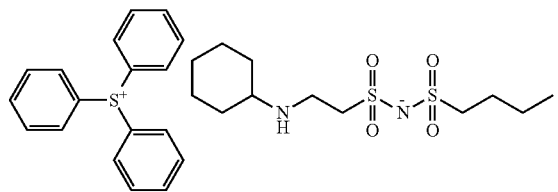
(PA-68)
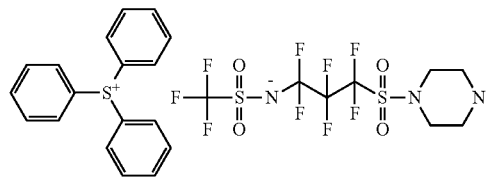
(PA-69)
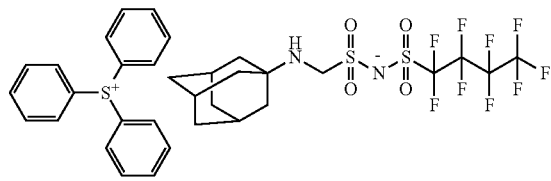
(PA-70)
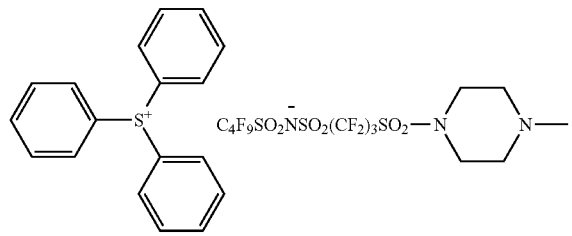
(PA-71)
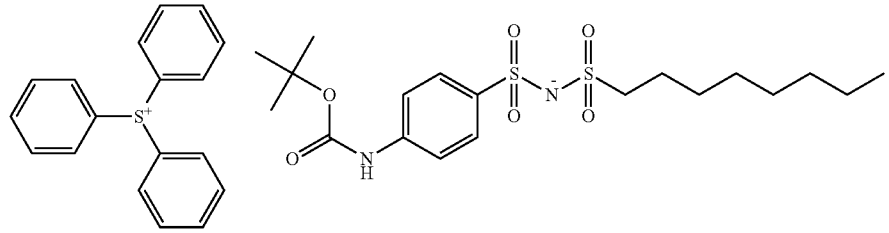
(PA-72)
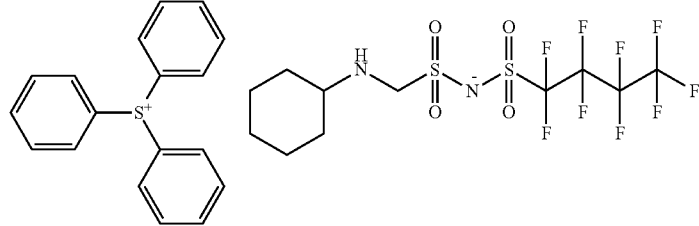

-continued
(PA-73)
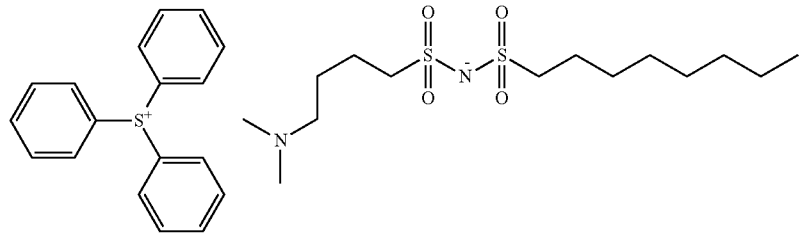
(PA-74)
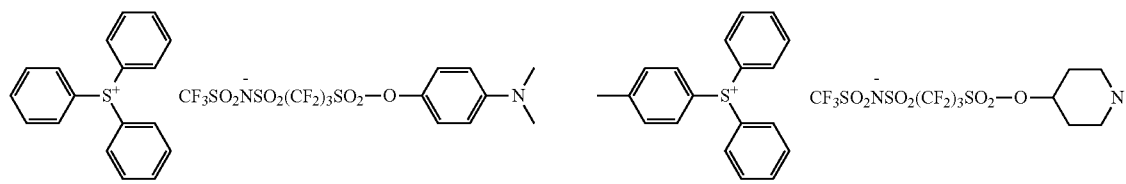
(PA-75)
(PA-76)
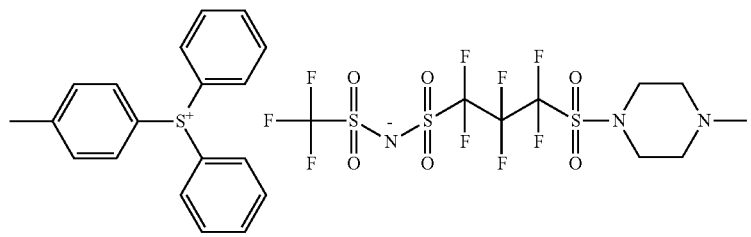
(PA-77)
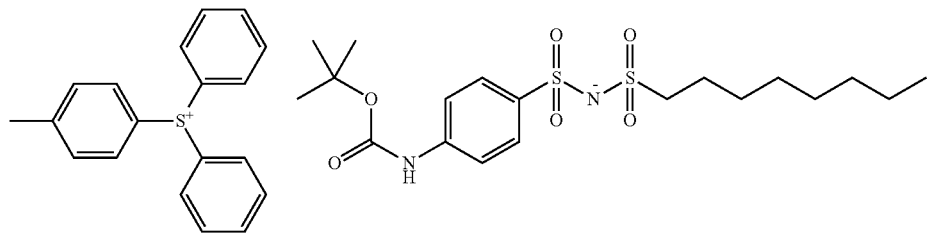
(PA-78)
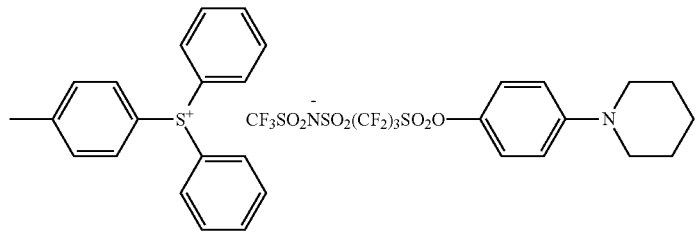
(PA-79)
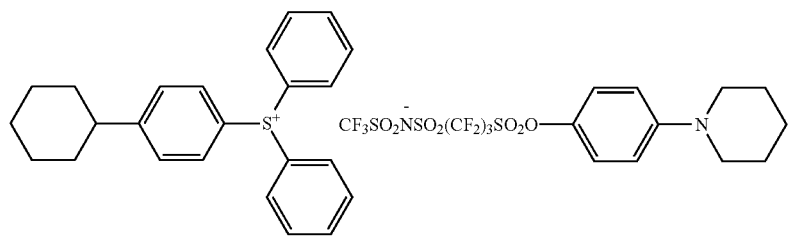

-continued
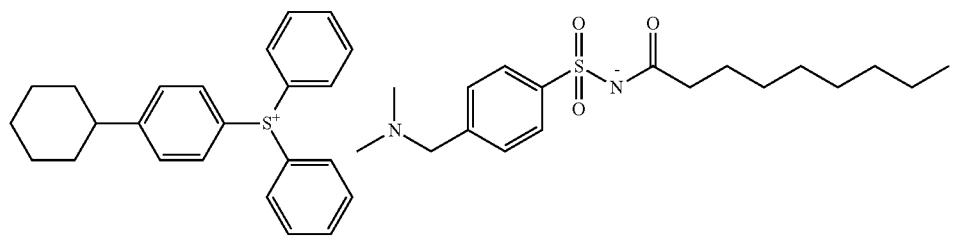
(PA-80)
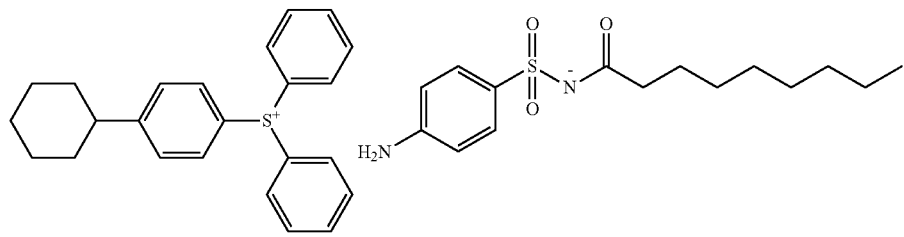
(PA-81)
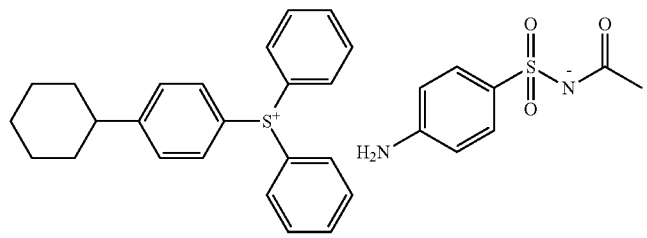
(PA-82)
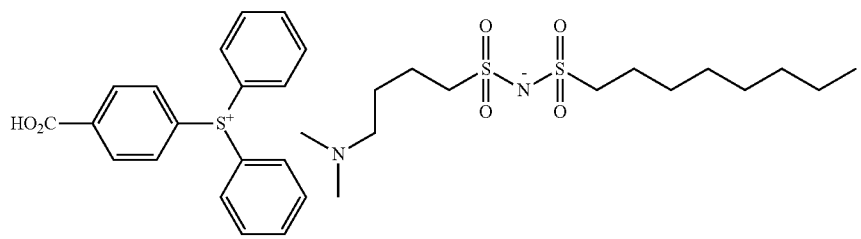
(PA-83)
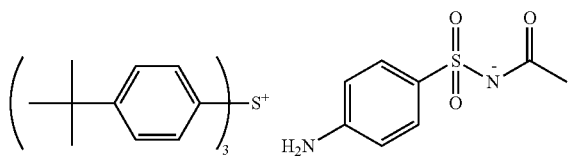
(PA-84)
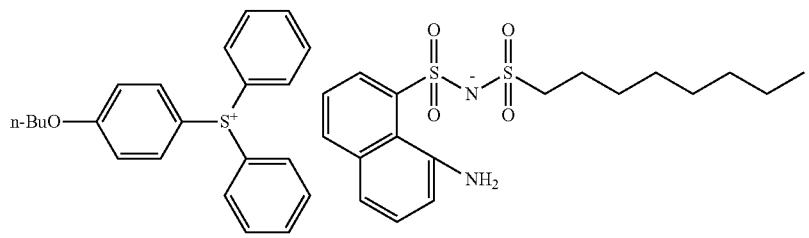
(PA-85)
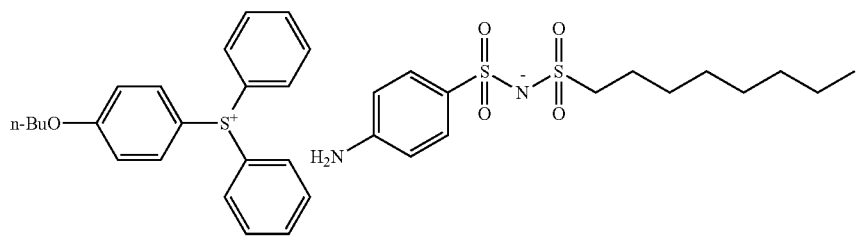
(PA-86)

-continued
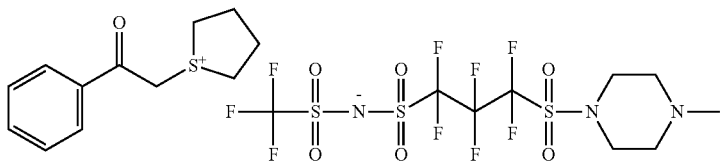
(PA-87)
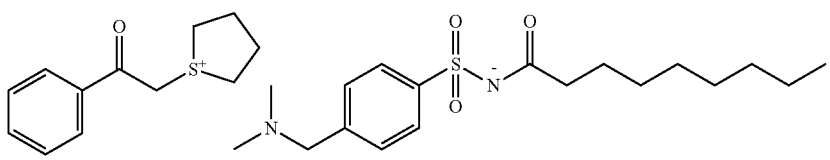
(PA-88)
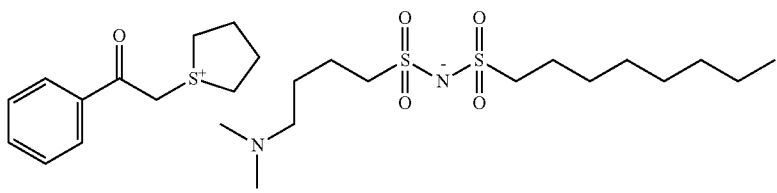
(PA-89)
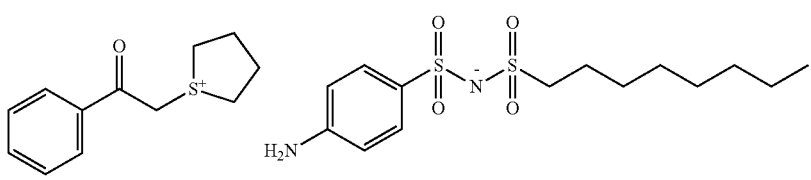
(PA-90)
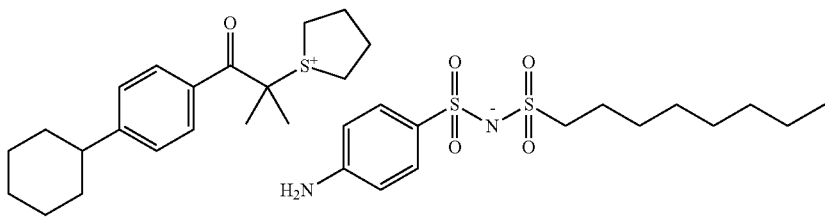
(PA-91)
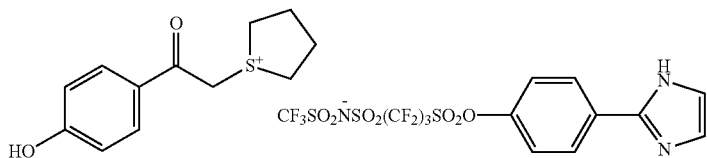
(PA-92)
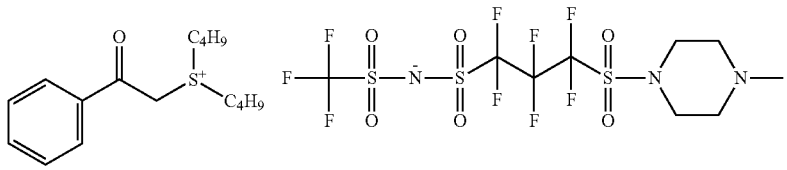
(PA-93)
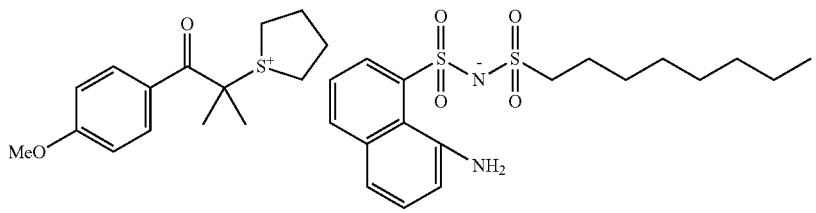
(PA-94)

-continued
(PA-95)
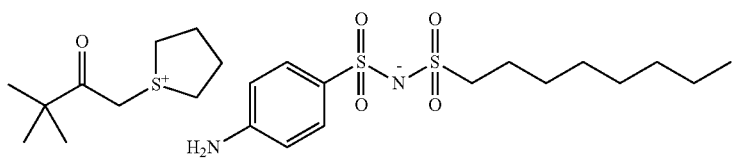
(PA-96)
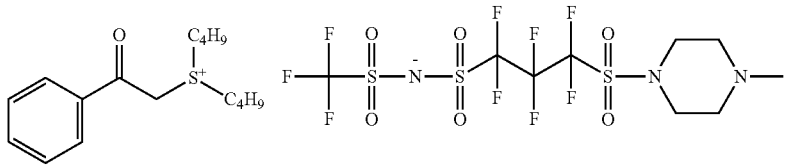
(PA-97)
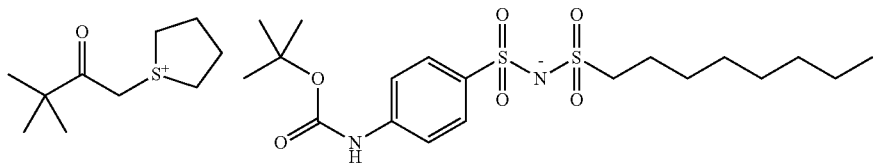
(PA-98)
(PA-99)
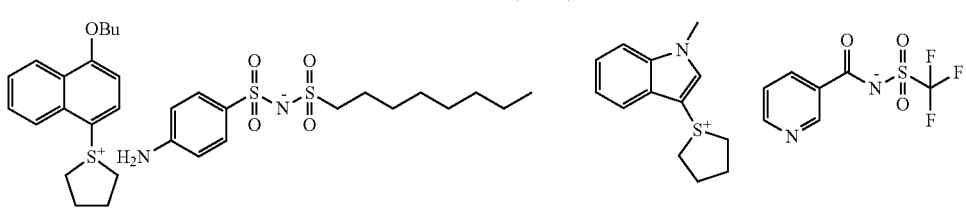
(PA-100)
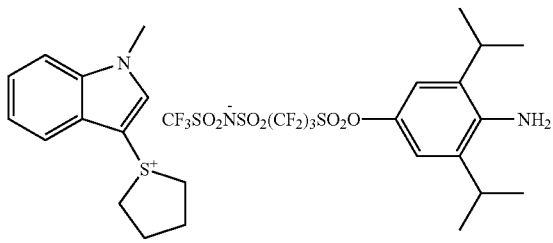
(PA-101)
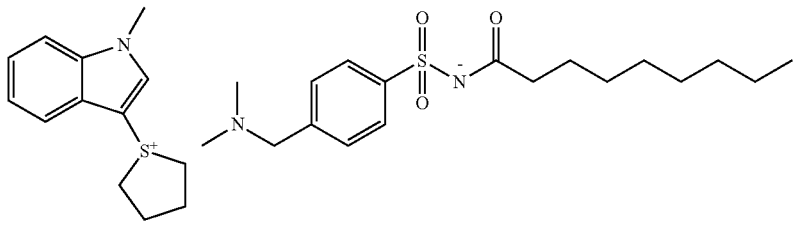
(PA-102)
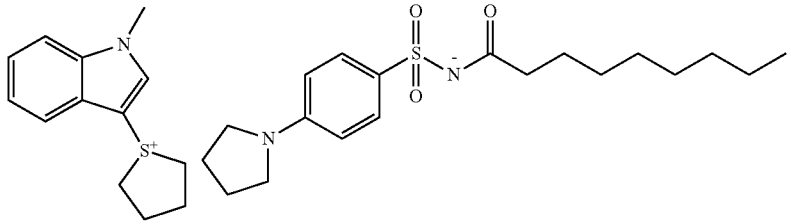
(PA-103)
(PA-104)
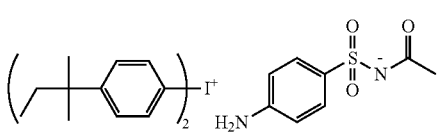
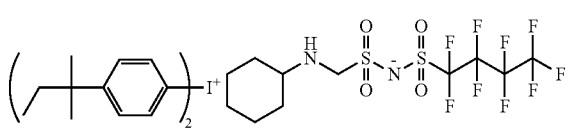

-continued
(PA-105)
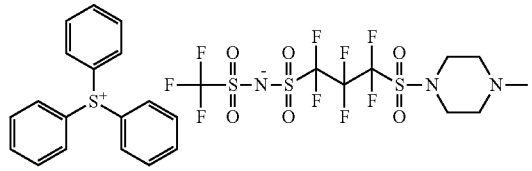
(PA-106)
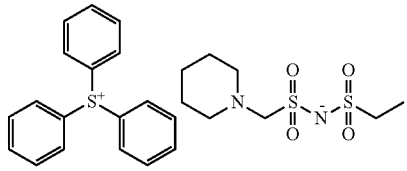
(PA-107)
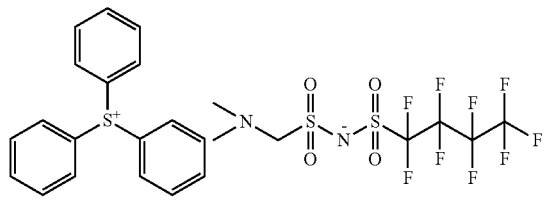
(PA-108)
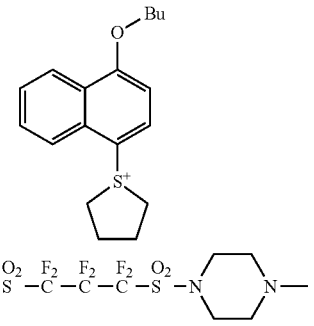
(PA-109)
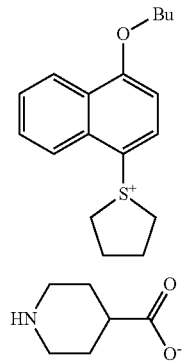
(PA-110)
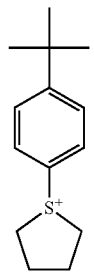
(PA-111)
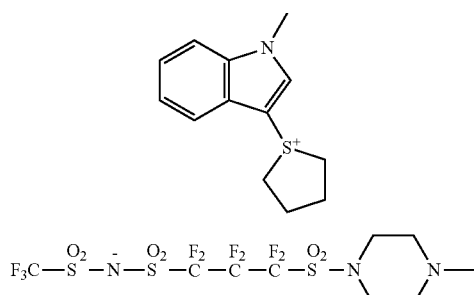
(PA-112)
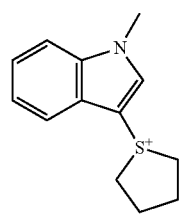
(PA-113)
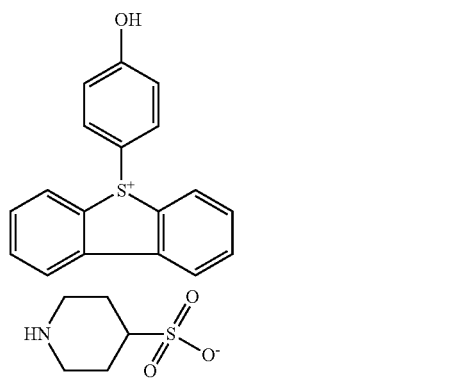
(PA-114)
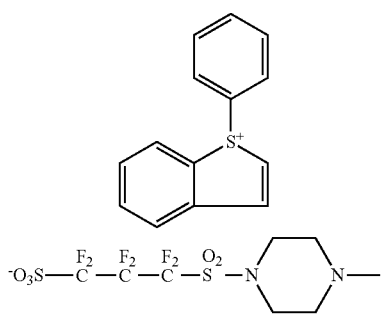

-continued
(PA-115)
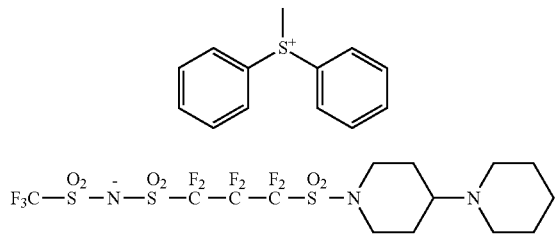
(PA-116)
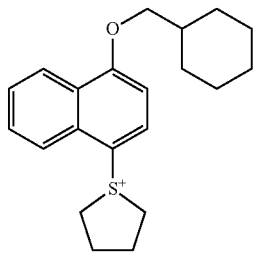
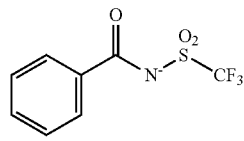
(PA-117)
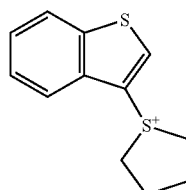
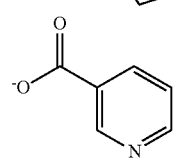
(PA-118)
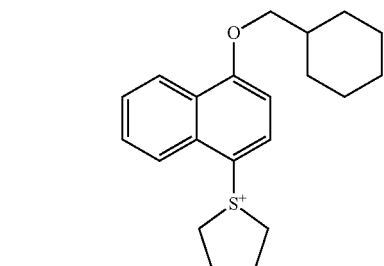
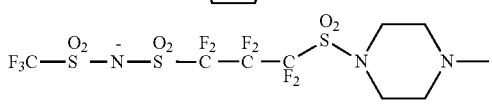
(PA-119)
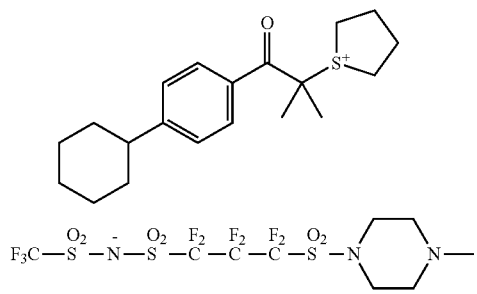
(PA-120)
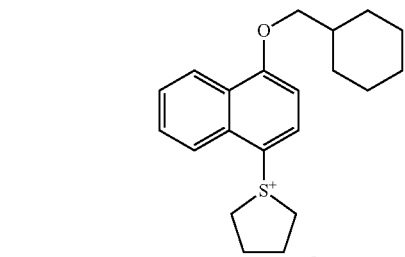
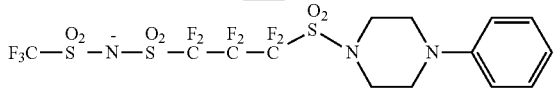
(PA-121)
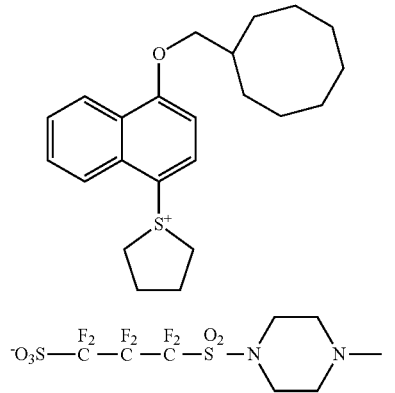
(PA-122)
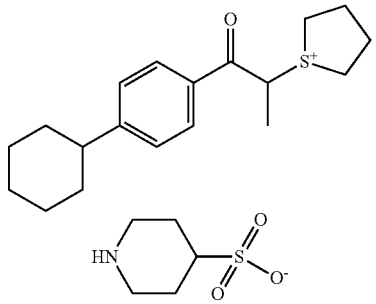
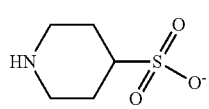

-continued
(PA-123)
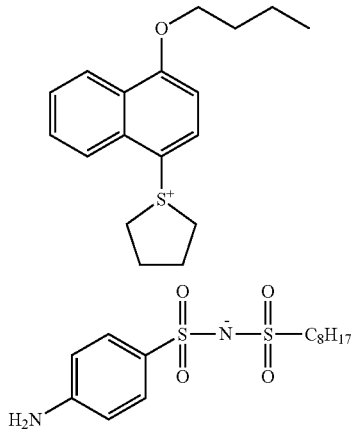
(PA-124)
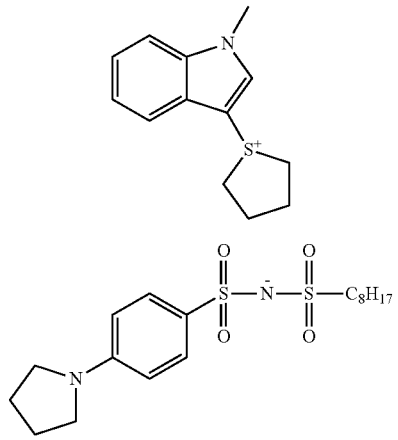
(PA-125)
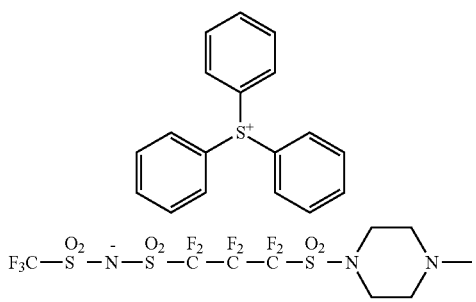
(PA-126)
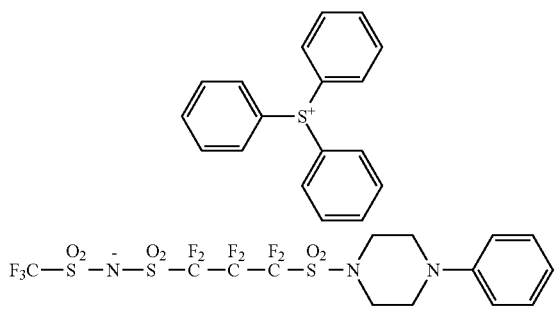
(PA-127)
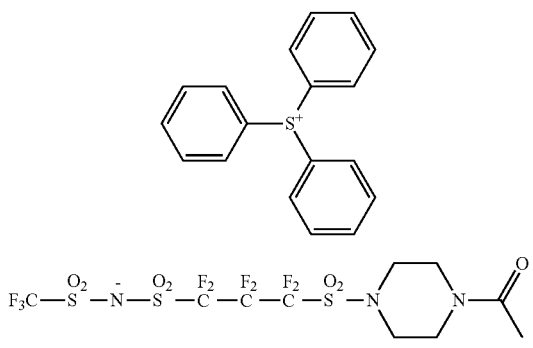
(PA-128)
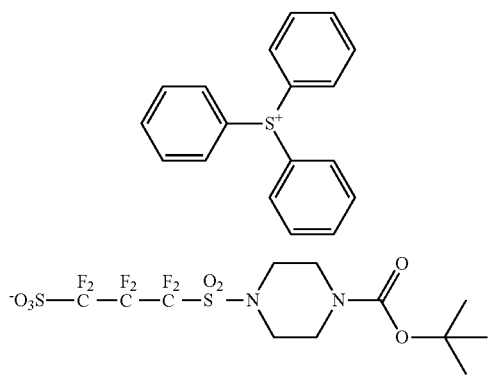
(PA-129)
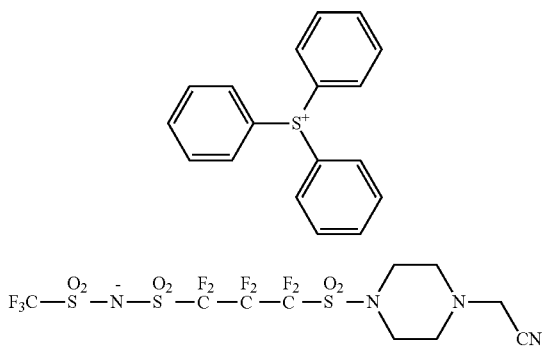
(PA-130)
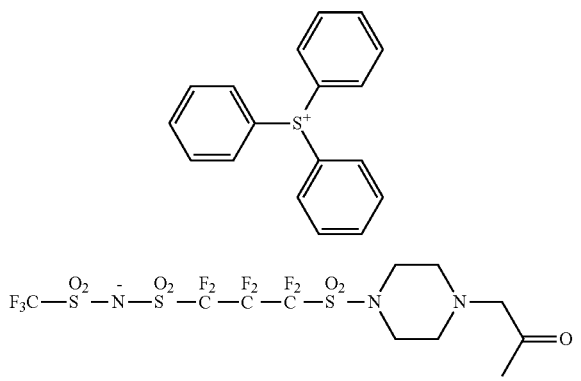

-continued
(PA-131)
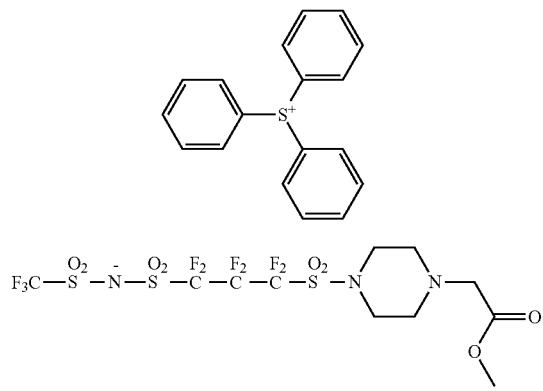
(PA-132)
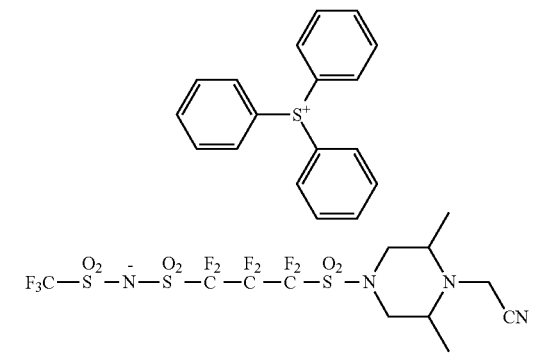
(PA-133)
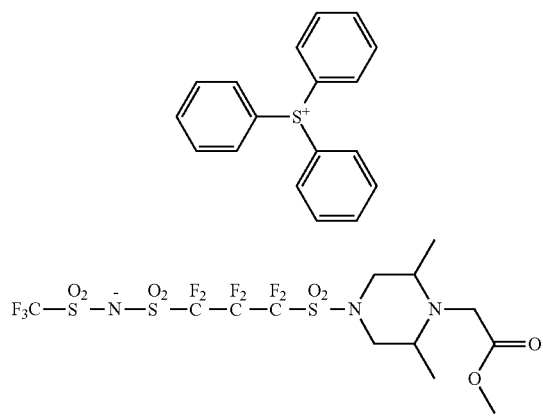
(PA-134)
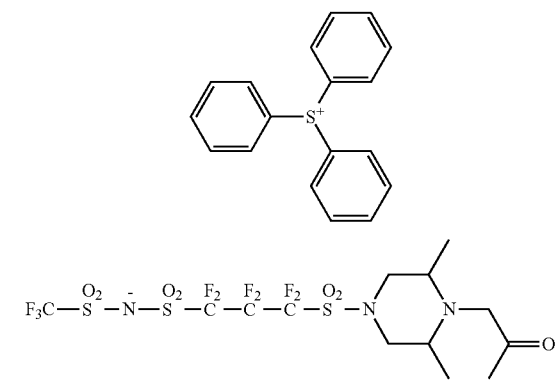
(PA-135)
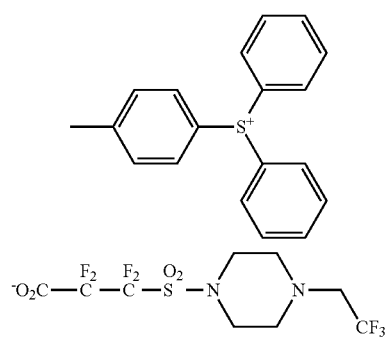
(PA-136)
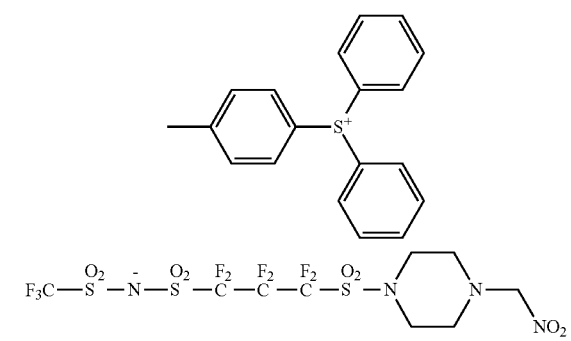

-continued
(PA-137)
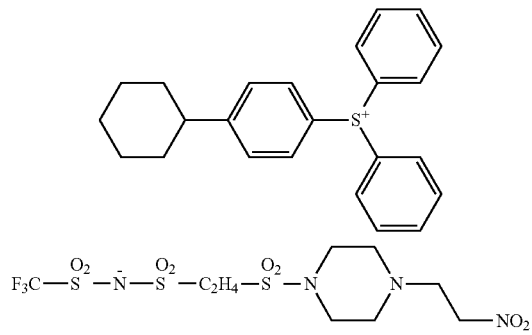
(PA-138)
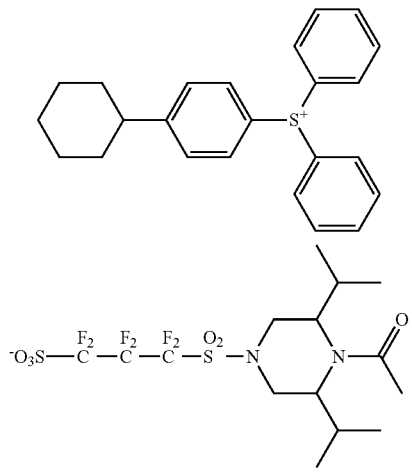
(PA-139)
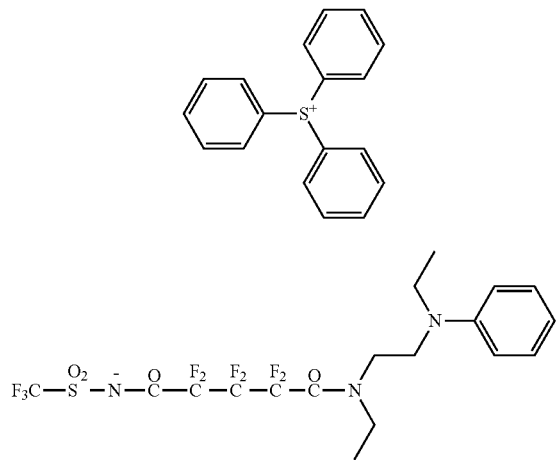
(PA-140)
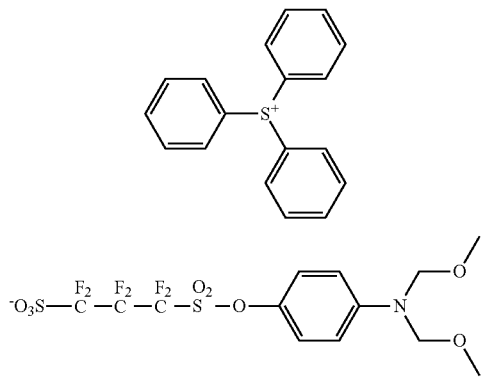
(PA-141)
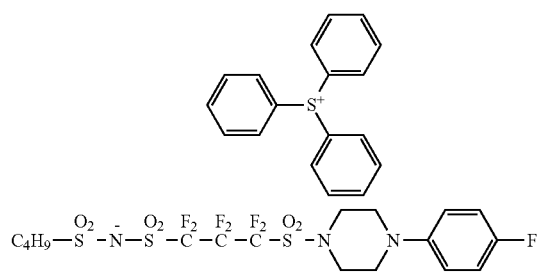
(PA-142)
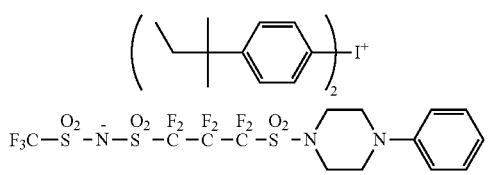
(PA-143)
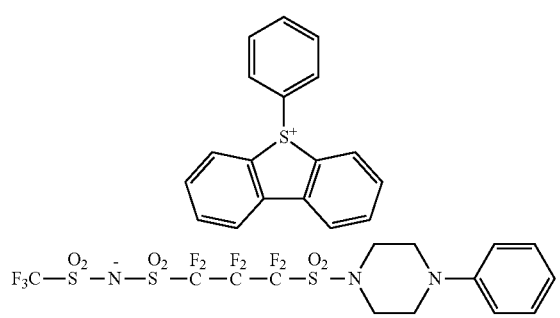
(PA-144)
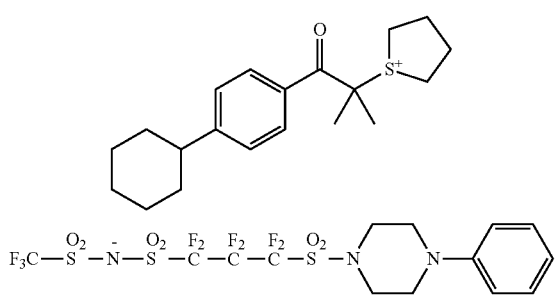

(PA-145)

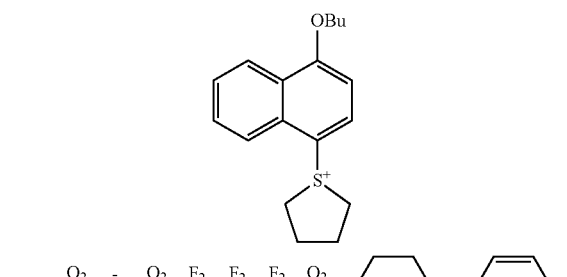

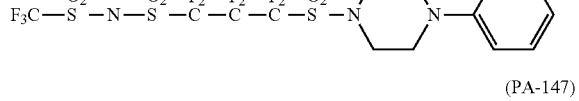

(PA-146)

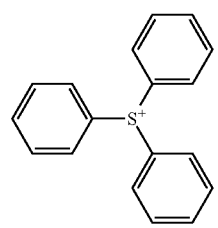

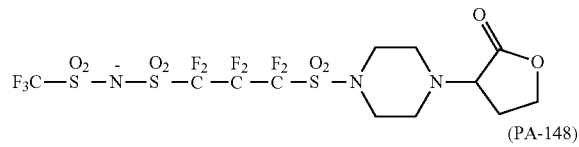

(PA-147)

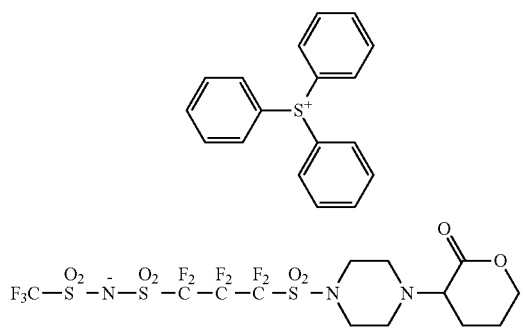

(PA-148)

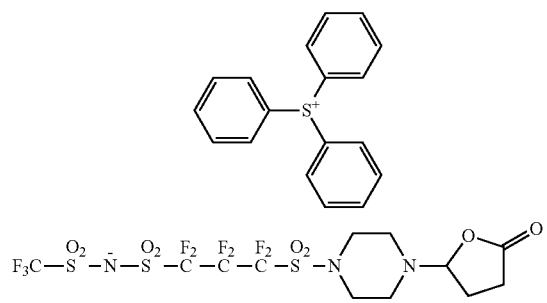

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing the partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing the partial structure represented by formula (PA-II). The amine or alcohol containing the partial structure represented by formula (PA-II) or (PA-III) can be synthesized by reacting an amine or alcohol with an anhydride (e.g., $(R'O_2C)_2O$, $(R'SO_2)_2O$) or an acid chloride compound (e.g., $R'O_2CCl$, $R'SO_2Cl$) under basic conditions (R' is, for example, a methyl group, an n-octyl group or a trifluoromethyl group). In particular, the synthesis may be performed in accordance with synthesis examples and the like in JP-A-2006-330098.

The molecular weight of the compound (PA) is preferably from 500 to 1,000.

The content of the compound (PA) in the resist composition for use in the present invention is preferably from 0.1 to 20 mass %, more preferably from 0.1 to 10 mass %, based on the solid content of the composition.

(D) Solvent

The resist composition for use in the present invention preferably contains a solvent.

Examples of the solvent which can be used at the time of preparing the resist composition for use in the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples and preferred examples of these solvents are the same as those described in paragraphs [0244] to [0248] of JP-A-2008-292975.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether or ethyl lactate. The solvent not containing a hydroxyl group is preferably, for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate, ethyl ethoxy propionate, 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more, is particularly preferred in view of coating uniformity.

The solvent is preferably a mixed solvent of two or more kinds of solvents containing propylene glycol monomethyl ether acetate.

(E) Hydrophobic Resin

The resist composition for use in the present invention may contain a hydrophobic resin having at least either a fluorine atom or a silicon atom particularly when the resist composition is applied to immersion exposure. The hydrophobic resin (E) is unevenly distributed to the film surface layer and when the immersion medium is water, the static/dynamic contact angle on the resist film surface for water as well as the followability of immersion liquid can be enhanced. The hydrophobic resin (E) is, as described above, unevenly distributed to the interface but unlike a surfactant, need not have necessarily a hydrophilic group in the molecule and may not contribute to uniform mixing of polar/nonpolar substances.

The fluorine atom or silicon atom in the hydrophobic resin (E) may be present in the main chain of the resin or may be substituted on the side chain.

The hydrophobic resin (E) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and, may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

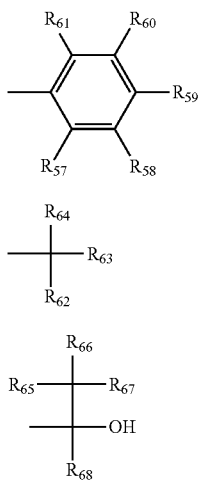

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Examples of the repeating unit having a fluorine atom are set forth below, but the present invention is not limited thereto. In examples, $X_1$ represents a hydrogen atom, —CH$_3$, —F or —CF$_3$. $X_2$ represents —F or —CF$_3$. In this connection, specific examples also include fluorine-containing repeating units contained in Resins (HR-1) to (HR-69) set forth later.

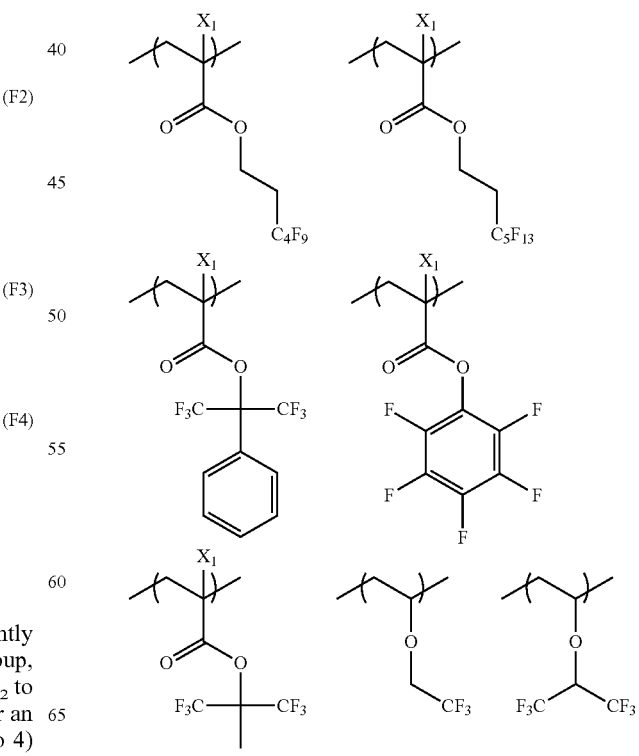

-continued

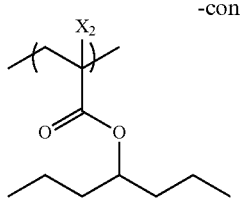
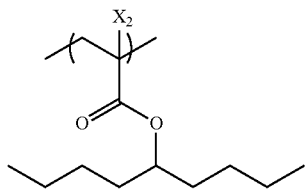
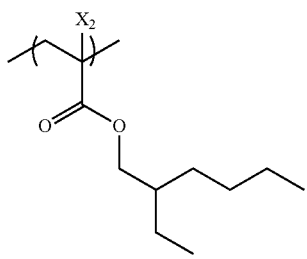
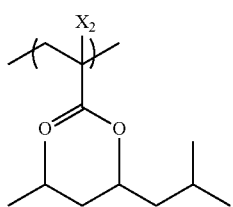
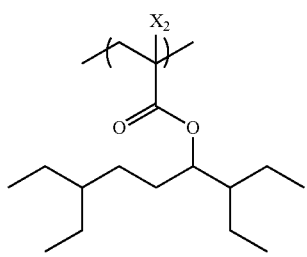
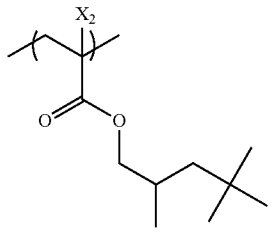
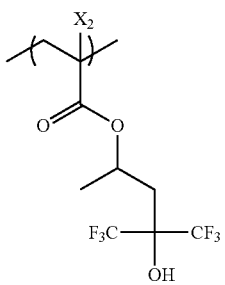

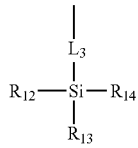
(CS-1)

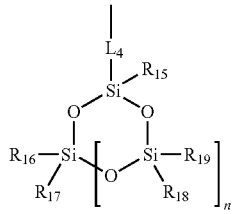
(CS-2)

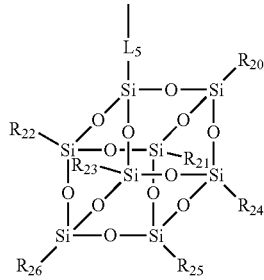
(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a single group or a combination of two or more groups, selected from the group consisting of an alkylene group, a phenylene group, an ether group, a thioether group, a carbonyl group, an ester group, an amide group, a urethane group and a urea group.

n represents an integer of 1 to 5. n is preferably an integer of 2 to 4.

Specific examples of the repeating unit having a group represented by formula (CS-1) to (CS-3) are set forth below, but the present invention is not limited thereto. In this connection, specific examples also include silicon atom-containing repeating units contained in Resins (HR-1) to (HR-69) set forth later. In specific examples, $X_1$ represents a hydrogen atom, —$CH_3$, —F or —$CF_3$.

The silicon atom-containing partial structure of the hydrophobic resin (E) is preferably an alkylsilyl structure (preferably a trialkylsilyl group) or a cyclic siloxane structure.

Specific examples of the alkylsilyl structure and cyclic siloxane structure include the groups represented by the following formulae (CS-1) to (CS-3):

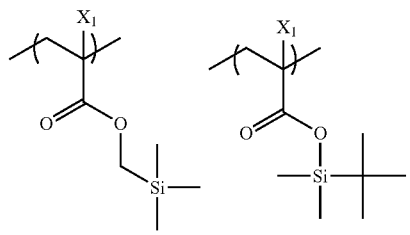

-continued

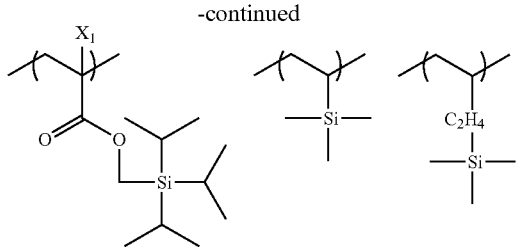

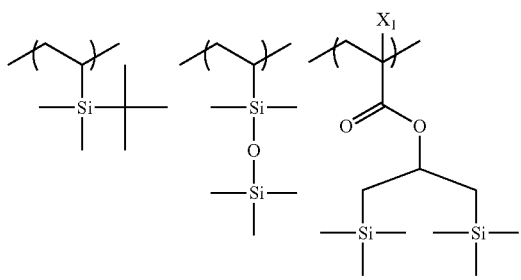

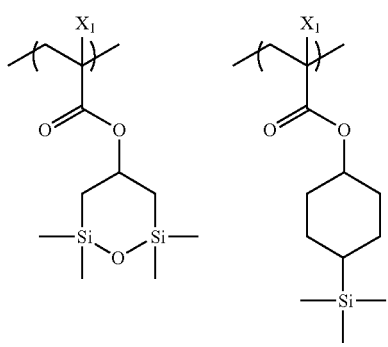

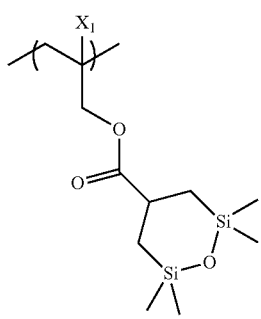

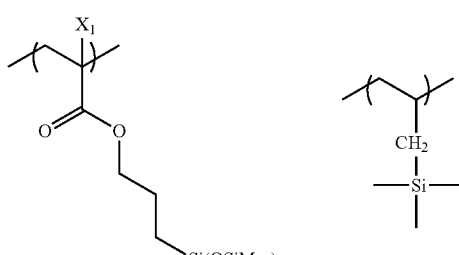

The hydrophobic resin (E) may further contain a repeating unit represented by the following formula (III):

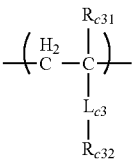

(III)

In formula (III), $R_{c31}$ represents a hydrogen atom, an alkyl group, an alkyl group which may be substituted with a fluorine atom, a cyano group or a —CH$_2$—O—Rac$_2$ group, wherein Rac$_2$ represents a hydrogen atom, an alkyl group or an acyl group. $R_{c31}$ is preferably a hydrogen atom, a methyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine or silicon atom-containing group or the like.

$L_{c3}$ represents a single bond or a divalent linking group.

In formula (III), the alkyl group of $R_{c32}$ is preferably a linear or branched alkyl group having a carbon number of 3 to 20.

The cycloalkyl group of $R_{c32}$ is preferably a cycloalkyl group having a carbon number of 3 to 20.

The alkenyl group of $R_{c32}$ is preferably an alkenyl group having a carbon number of 3 to 20.

The cycloalkenyl group of $R_{c32}$ is preferably a cycloalkenyl group having a carbon number of 3 to 20.

The aryl group of $R_{c32}$ is preferably an aryl group having a carbon number of 6 to 20, more preferably a phenyl group or a naphthyl group.

$R_{c32}$ is preferably an unsubstituted alkyl group or a fluorine atom-substituted alkyl group.

The divalent linking group of $L_{c3}$ is preferably an ester bond, an alkylene group (preferably having a carbon number of 1 to 5), an oxy group or a phenylene group.

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably occupies from 10 to 100 mol %, more preferably from 30 to 100 mol %, based on all repeating units in the hydrophobic resin (E). In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably occupies from 10 to 100 mol %, more preferably from 20 to 100 mol %, based on all repeating units in the hydrophobic resin (E).

The standard polystyrene-equivalent weight average molecular of the hydrophobic resin (E) is preferably from 1,000 to 100,000, more preferably from 1,000 to 50,000, still more preferably from 2,000 to 15,000.

The content of the hydrophobic resin (E) in the composition is preferably from 0.01 to 10 mass %, more preferably from 0.05 to 8 mass %, still more preferably from 0.1 to 5 mass %, based on the entire solid content of the composition for use in the present invention.

In the hydrophobic resin (E), similarly to the resin of the component (A), it is of course preferred that the content of impurities such as metal is small, but also, the content of residual monomers or oligomer components is preferably as close to 0 as possible. Specifically, their content is preferably from 0 to 10 mass %, more preferably from 0 to 5 mass %, still more preferably from 0 to 1 mass %. When these conditions are satisfied, a resist free of extraneous substances in liquid or change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (E), various commercially available products may be used or the resin may be synthesized by a conventional method (for example, radical polymerization). With respect to details of the synthesis/purification methods, reference can be made, for example, to the methods described for the main resin of the resist or description in "Kobunshi Gosei (Polymer Synthesis)" of Dai 5-Han Jikken Kagaku Koza 26, Kobunshi Kagaku (Experimental Chemistry Lecture 26, Polymer Chemistry, 5th Edition), Chapter 2, Maruzen.

Specific examples of the hydrophobic resin (E) are set forth below. Also, the molar ratio of repeating units (corresponding to repeating units starting from the left), weight average molecular weight and polydispersity of each resin are shown in Table 1 later.

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |

TABLE 1-continued

| Resin | Composition | Mw | Mw/Mn |
|---|---|---|---|
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 40/50/10 | 5000 | 1.3 |
| HR-67 | 40/50/10 | 5000 | 1.4 |
| HR-68 | 50/50 | 6000 | 1.6 |
| HR-69 | 39/57/2/2 | 4000 | 1.3 |

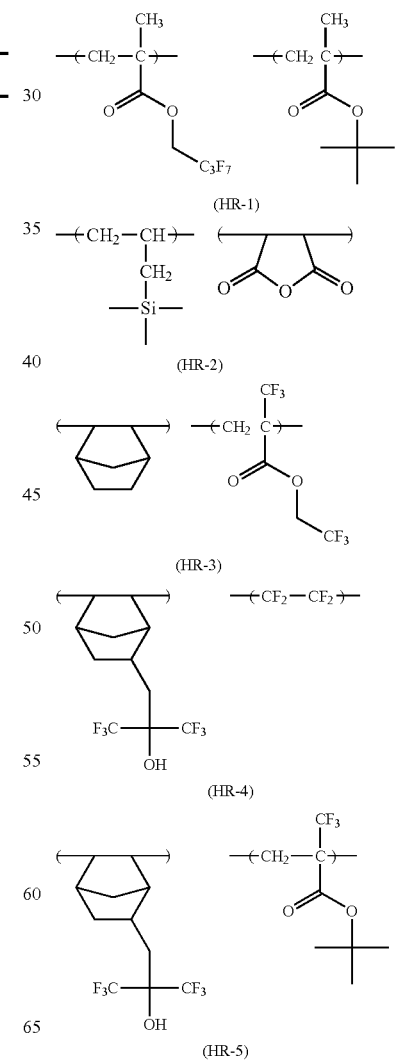

TABLE 1-continued

| Resin | Composition | Mw | Mw/Mn |
|---|---|---|---|

(HR-6), (HR-7), (HR-8), (HR-9), (HR-10), (HR-11), (HR-12), (HR-13), (HR-14), (HR-15), (HR-16), (HR-17), (HR-18)

TABLE 1-continued
| Resin | Composition | Mw | Mw/Mn |
|---|---|---|---|
| (HR-19) | | | |
| (HR-20) | | | |
| (HR-21) | | | |
| (HR-22) | | | |
| (HR-23) | | | |
| (HR-24) | | | |
| (HR-25) | | | |
| (HR-26) | | | |
| (HR-27) | | | |
| (HR-28) | | | |
| (HR-29) | | | |
| (HR-30) | | | |
| (HR-31) | | | |
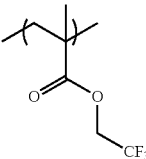

TABLE 1-continued
| Resin | Composition | Mw | Mw/Mn |
|---|---|---|---|
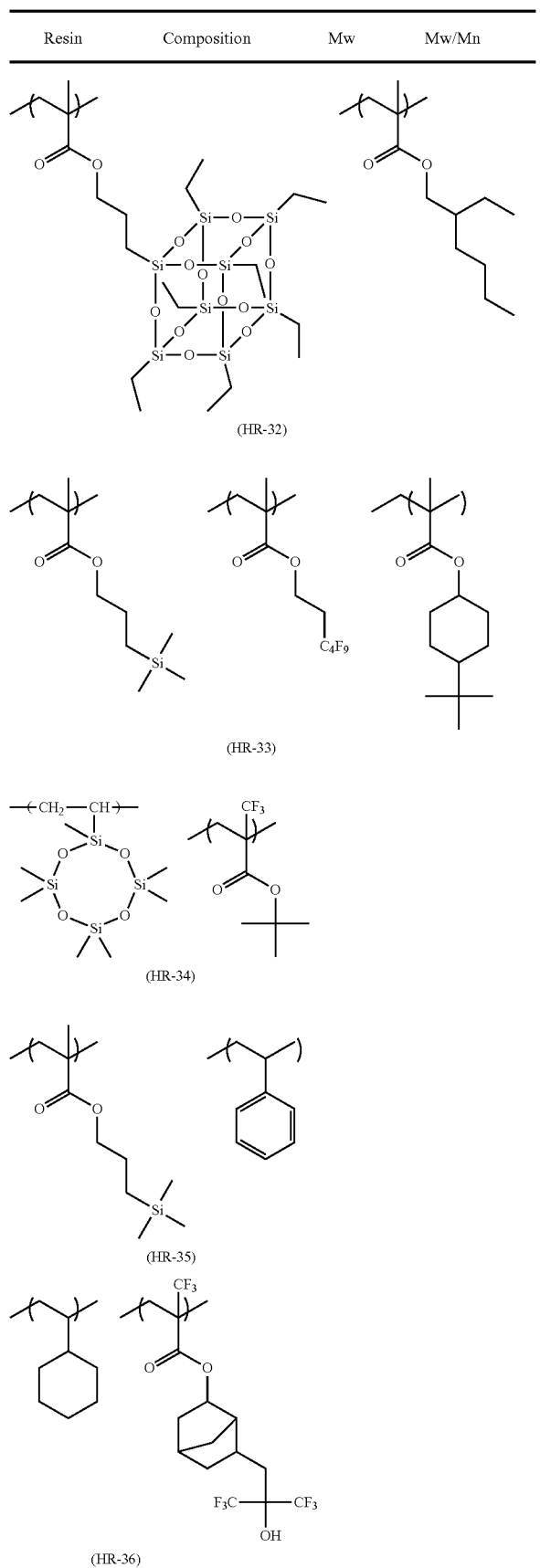
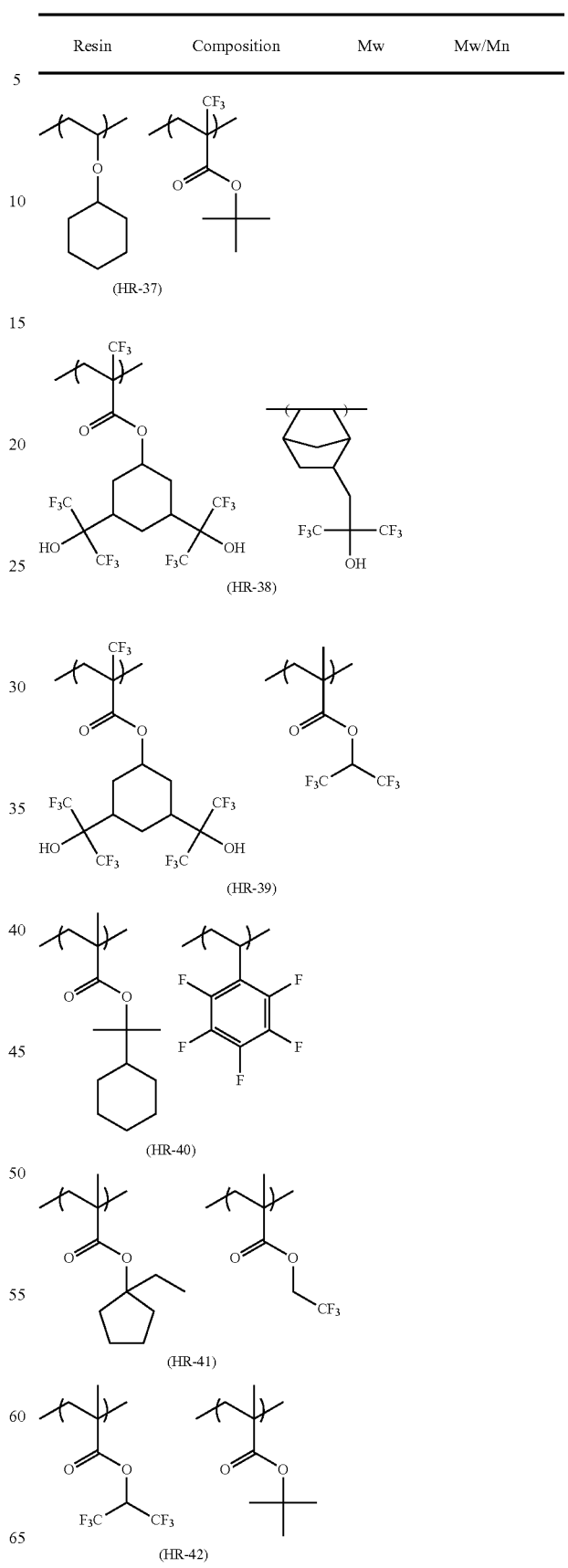

TABLE 1-continued

| Resin | Composition | Mw | Mw/Mn |
|---|---|---|---|

(Chemical structures for HR-43 through HR-54)

TABLE 1-continued
| Resin | Composition | Mw | Mw/Mn |
|---|---|---|---|
(HR-55)
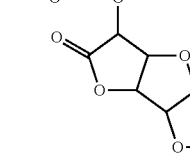
(HR-56)
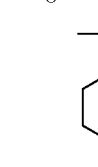
(HR-57)
(HR-58)
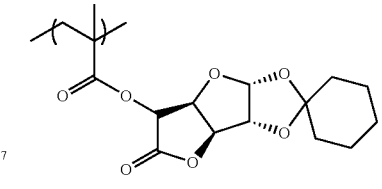
(HR-59)
(HR-60)
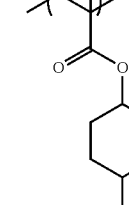
(HR-61)
(HR-62)
(HR-63)
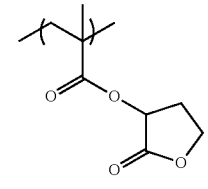
(HR-64)

TABLE 1-continued

| Resin | Composition | Mw | Mw/Mn |
|---|---|---|---|

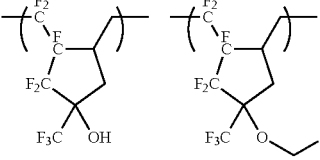
(HR-65)

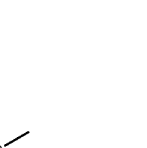
(HR-66)

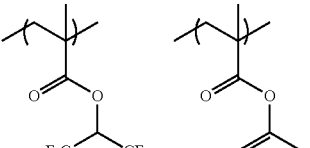
(HR-67)

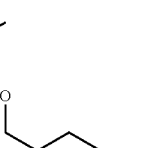
(HR-68)

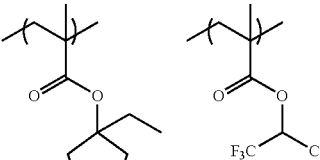
(HR-69)

(F) Surfactant

The resist composition for use in the present invention may further contain a surfactant and in the case of containing a surfactant, it is preferred to contain any one fluorine-containing and/or silicon-containing surfactant (a fluorine-containing surfactant, a silicon-containing surfactant or a surfactant containing both a fluorine atom and a silicon atom) or two or more kinds thereof.

When the composition for use in the present invention contains the surfactant above, a resist pattern with good sensitivity, resolution and adherence as well as little development defect can be obtained in using an exposure light source of 250 nm or less, particularly 220 nm or less.

Examples of the fluorine-containing and/or silicon-containing surfactant include the surfactants described in paragraph [0276] of U.S. Patent Application Publication 2008/0248425, such as EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the above-described type of surfactant include Megaface F178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate) and a (poly(oxypropylene))acrylate (or methacrylate).

In the present invention, a surfactant other than the fluorine-containing and/or silicon-containing surfactant, described in paragraph [0280] of U.S. Patent Application Publication 2008/0248425, may also be used.

One of these surfactants may be used alone, or some of them may be used in combination.

In the present invention, a surfactant may be used or may not be used, but in the case of using a surfactant, the amount of the surfactant used is preferably from 0.0001 to 2 mass %, more preferably from 0.0005 to 1 mass %, based on the entire amount of the resist composition (excluding the solvent).

On the other hand, by setting the amount added of the surfactant to 10 ppm or less based on the entire amount of the resist composition (excluding the solvent), the hydrophobic resin is more unevenly distributed to the surface, so that the resist film surface can be made more hydrophobic and the followability of water at the immersion exposure can be enhanced.

(G) Other Additives

The resist composition for use in the present invention may further contain, for example, a known basic compound other than the component (C), a dye, a plasticizer, a photosensitizer, a light absorber, a dissolution inhibitor and a compound for accelerating dissolution in an alkali developer (for example, a carboxyl group-containing alicyclic or aliphatic compound), if desired.

In particular, the resist composition for use in the present invention may contain a known basic compound other than the component (C) so as to reduce the change of performance with aging from exposure to heating.

Specific examples of such a basic compound include a basic compound having a structure represented by the following formulae (A) to (E):

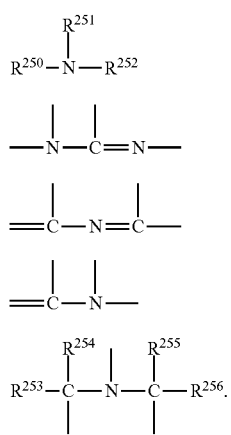

In the formulae, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20) or an aryl group (preferably having a carbon number of 6 to 20), and $R^{250}$ and $R^{251}$ may combine with each other to form a ring.

These groups may have a substituent, and the alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups may contain an oxygen atom, a sulfur atom or a nitrogen atom in the alkyl chain.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these may have a substituent. More preferred examples of the compound include a compound having an imidazole structure, a diazabicyclo structure, an onium hydroxide structure (particularly preferably tetraalkylammonium hydroxide), an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Furthermore, the compound may be at least one kind of a nitrogen-containing compound selected from the group consisting of a phenoxy group-containing amine compound, a phenoxy group-containing ammonium salt compound, a sulfonic acid ester group-containing amine compound and a sulfonic acid ester group-containing ammonium salt compound. Examples of these compounds include, but are not limited to, Compounds (C1-1) to (C3-3) illustrated in paragraph [0066] of U.S. Patent Application Publication 2007/0224539.

The molecular weight of the known basic compound other than the component (C) is preferably from 250 to 2,000, more preferably from 400 to 1,000.

One of these basic compounds is used alone, or two or more thereof are used in combination.

In the case of containing a known basic compound other than the component (C), the content thereof is preferably from 0.05 to 8.0 mass %, more preferably from 0.05 to 5.0 mass %, still more preferably from 0.05 to 4.0 mass %, based on the entire solid content of the resist composition.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition for use in the present invention is usually from 1.0 to 10 mass %, preferably from 2.0 to 5.7 mass %, more preferably from 2.0 to 5.3 mass %. When the solid content concentration is in this range, the resist solution can be uniformly applied on a substrate and moreover, a resist pattern with excellent performance in terms of line edge roughness can be formed. The reasons therefor are not clearly know, but it is considered that by setting the solid content concentration to 10 mass % or less, preferably 5.7 mass % or less, the materials, particularly the photo-acid generator, in the resist solution are prevented from aggregation, as a result, a uniform resist film can be formed.

The solid content concentration is a mass percentage of the mass of resist components excluding solvents, based on the total mass of the resist composition.

<Pattern Forming Method>

The step of forming a film from a resist composition, the step of exposing the film, the baking step and the development step in the pattern forming method of the present invention are described below.

After film formation, the pattern forming method preferably includes a pre-baking step (PB) before the exposure step.

Also, the pattern forming method preferably includes a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) can be applied, and an ArF excimer laser wavelength (193 nm) is preferred.

In the present invention, the exposure of the resist film may be performed by filling a liquid (immersion medium) having a refractive index higher than that of air between the film and the lens at the irradiation with an actinic ray or radiation (immersion exposure). By this exposure, the resolution can be enhanced: The immersion medium used may be any liquid as long as it has a refractive index higher than that of air, but pure water is preferred.

In this case, the above-described hydrophobic resin may be previously added to the resist composition, or after forming a resist film, a sparingly immersion liquid-soluble film (hereinafter, sometimes referred to as a "topcoat") may be provided thereon.

The performance required of the topcoat, the use method thereof and the like are described in Ekishin Lithography no Process to Zairyo (Process and Material of Immersion Lithography), Chapter 7, CMC Shuppan.

In view of transparency to laser at a wavelength of 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (E) is suitable also as the topcoat. Furthermore, a commercially available topcoat material can also be appropriately used.

On peeling off the topcoat after exposure, a developer may be used or a releasing agent may be separately used. The releasing agent is preferably a solvent less permeating the film. From the standpoint that the peeling step can be performed simultaneously with the development step of the film, the topcoat is preferably peelable with a developer.

In the present invention, the substrate on which the film is formed is not particularly limited, and a substrate generally used for lithography in the production of a semiconductor device (e.g., IC), a liquid crystal device or a circuit board such as thermal head and further in other photofabrication processes, such as inorganic substrate (e.g., silicon, SiN, $SiO_2$, SiN) and coating-type inorganic substrate (e.g., SOG), can be used.

As for the organic developer which can be used in performing development with an organic solvent-based developer, a developer containing a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 2-heptanone, 3-heptanone, 4-heptanone, 1-hexanone, 2-hexanone, 3-hexanone, diisobutyl ketone, methyl amyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Above all, an alkyl acetate such as methyl acetate, butyl acetate, ethyl acetate, isopropyl acetate and amyl acetate is preferred.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol.

Examples of the ether-based solvent include, in addition to the glycol ether-based solvents above, anisole, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or water. However, in order to sufficiently bring out the effects of the present invention, the water content of the entire developer is preferably less than 10 mass %, and it is more preferred to contain substantially no water.

That is, the content of the organic solvent in the developer is preferably from 90 to 100 mass %, more preferably from 95 to 100 mass %, based on the entire amount of the developer.

In particular, the organic solvent-containing developer is preferably a developer containing at least one kind of a solvent selected from the group consisting of a ketone-based solvent, an ester-based solvent, an alcohol-based solvent, an amide-based solvent and an ether-based solvent.

The vapor pressure at 20° C. of the organic solvent-containing developer is preferably 5 kPa or less, more preferably 3 kPa or less, still more preferably 2 kPa or less. By setting the vapor pressure of the developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, arnyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate(ethyl 3-ethoxypropionate), 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, 4-methyl-2-pentanol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the developer, a surfactant can be added in an appropriate amount, if desired.

The surfactant is not particularly limited but, for example, an ionic or nonionic fluorine-containing and/or silicon-containing surfactant can be used. Examples of such a fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist residue after development can be greatly reduced.

Details of this mechanism are not clearly known, but it is possibly considered that thanks to the ejection pressure in the above-described range, the pressure imposed on the resist film by the developer is small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of performing the development, a step of stopping the development by replacement with another solvent may be practiced.

A rinsing step (a step of washing the resist film with a rinsing solution containing an organic solvent) is preferably provided after the development using a developer containing an organic solvent.

The rinsing solution for use in the rinsing step after the development with an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent, which are used as a rinsing solution, include those described above as the organic solvent used in the developer.

More preferably, a step of washing the resist film by using a rinsing solution containing at least one kind of an organic solvent selected from the group consisting of a ketone-based solvent, an ester-based solvent, an alcohol-based solvent and an amide-based solvent is preformed after the development; still more preferably, a step of washing the resist film by using a rinsing solution containing an alcohol-based solvent or an ester-based solvent is performed after the development; yet still more preferably, a step of washing the resist film by using a rinsing solution containing a monohydric alcohol is performed after the development; and even yet still more preferably, a step of washing the resist film by using a rinsing solution containing a monohydric alcohol having a carbon number of 5 or more is performed after the development. The monohydric alcohol used in the rinsing step after the development includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content in the rinsing solution is preferably less than 10 mass %, more preferably less than 5 mass %, still more preferably less than 3 mass %. By setting the water content to less than 10 mass %, good development characteristics can be obtained.

In other words, the amount of the organic solvent in the rinsing solution is preferably from 90 to 100 mass %, more preferably from 95 to 100 mass %, and most preferably from 97 to 100 mass %, based on the entire amount of the rinsing solution.

The vapor pressure at 20° C. of the rinsing solution used after the development with an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may also be used after adding thereto a surfactant in an appropriate amount.

In the rinsing step, the wafer after development is washed using the above-described organic solvent-containing rinsing solution. The method for washing treatment is not particularly limited but, for example, a method of continuously ejecting the rinsing solution on a substrate spinning at a constant speed (spin coating method), a method of dipping the substrate in a bath filled with the rinsing solution for a fixed time (dipping method), and a method of spraying the rinsing solution on a substrate surface (spraying method) may be applied. Above all, it is preferred to perform the washing treatment by the spin coating method and after the washing, remove the rinsing solution from the substrate surface by spinning the substrate at a rotational speed of 2,000 to 4,000 rpm.

The pattern forming method of the present invention may include a development step using an alkali developer (a step of forming a positive pattern), in addition to the development step using an organic solvent-containing developer. The development step using an alkali developer may be performed after or before the development step using an organic solvent-containing developer but is preferably performed before the development step using an organic solvent-containing developer. Also, a heating step is preferably performed before each of these development steps.

The developer used when performing the development using an alkali developer is not particularly limited, but an aqueous solution of tetramethylammonium hydroxide (TMAH) is usually used. In the alkali developer, alcohols and a surfactant may be added each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As for the rinsing solution in the rinsing treatment performed after the development using an alkali developer, pure water is used, and the pure water may be used after adding thereto a surfactant in an appropriate amount.

EXAMPLES

The present invention is described below by referring to Examples, but the present invention should not be construed as being limited thereto.

Synthesis Example 1

Synthesis of Resin (P-1)

In a nitrogen stream, 40 g of a 6/4 (by mass) mixed solvent of propylene glycol monomethyl ether acetate (PGMEA, another name: 1-methoxy-2-acetoxypropane) and propylene glycol monomethyl ether (PGME, another name: 1-methoxy-2-propanol) was charged into a three-neck flask and heated at 80° C. (Solvent 1). Monomers corresponding to the following repeating units were dissolved at a molar ratio of 20/20/10/20/30 in a 6/4 (by mass) mixed solvent of propylene glycol monomethyl ether acetate and propylene glycol monomethyl ether to prepare a 22 mass % monomer solution (400 g), and polymerization initiator V-601 (produced by Wako Pure Chemical Industries, Ltd.) in a concentration of 8 mol % based on the monomers was added thereto and dissolved. The resulting solution was added dropwise to Solvent 1 over 6 hours. After the completion of dropwise addition, the reaction was further allowed to proceed at 80° C. for 2 hours. The resulting reaction solution was left standing to cool and then poured in 3,600 ml of hexane/400 ml of ethyl acetate. The powder precipitated was collected by filtration and dried, as a result, 74 g of Resin (P-1) was obtained. The weight average molecular weight of the obtained Resin (P-1) was 10,000 in terms of standard polystyrene and the polydispersity (Mw/Mn) was 1.4.

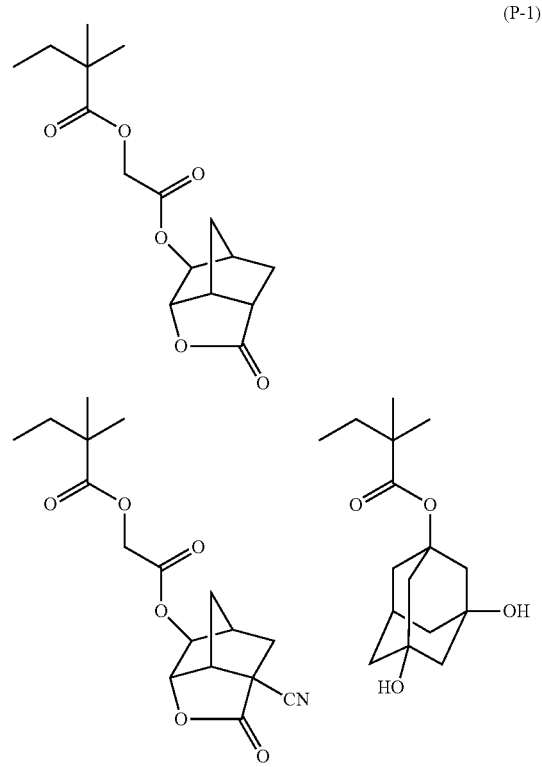

(P-1)

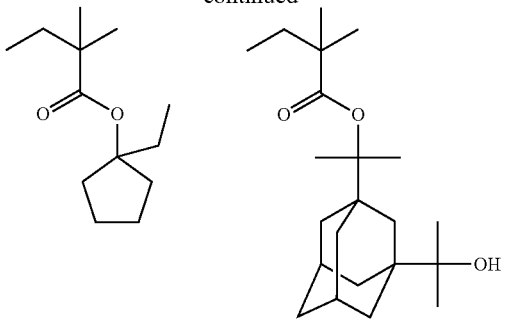

Resins (P-2) to (P-4) and Hydrophobic Resins (1b) to (4b) were synthesized in the same manner as in Synthesis Example 1 except that monomers corresponding to respective repeating units were used to give a desired compositional ratio (molar ratio). Here, Hydrophobic Resins (1b) to (4b) correspond to the resin (E).

Structures of Resins (P-2) to (P-4) and Hydrophobic Resins (1b) to (4b) are shown below. Also, the compositional ratio (molar ratio), weight average molecular weight and polydispersity of each of Resins (P-2) to (P-4) and Hydrophobic Resins (1b) to (4b) including Resin (P-1) are shown in Table 2 below.

(P-2)

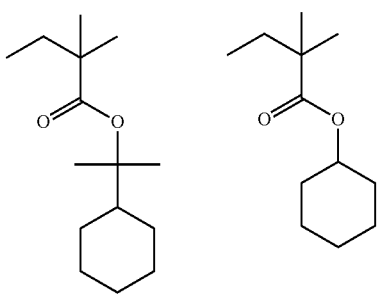

(P-3)

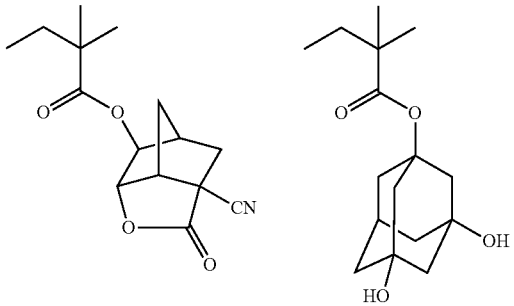

(P-4)

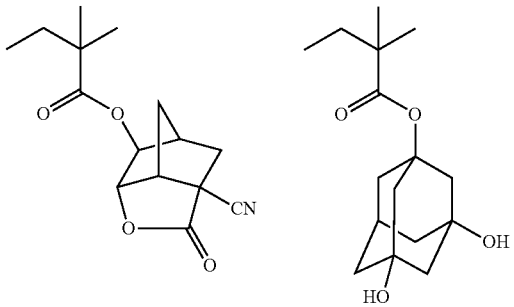

(1b)

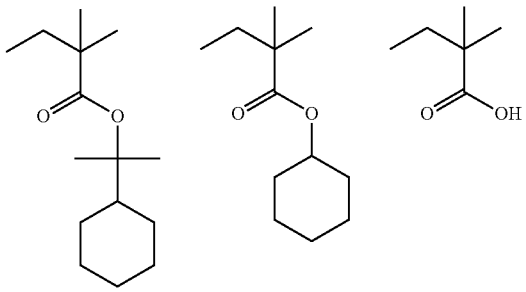

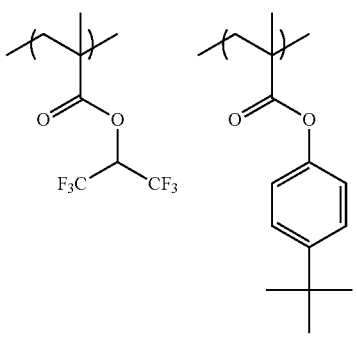

-continued

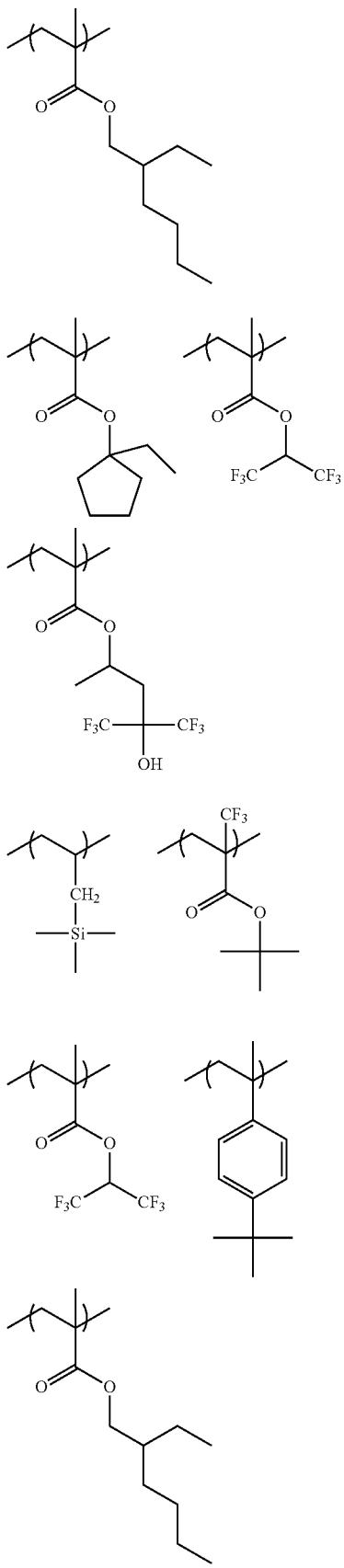

(2b)

(3b)

(4b)

TABLE 2

| Resin | Composition (mol %) | Mw | Mw/Mn |
|---|---|---|---|
| (P-1) | 20/20/10/20/30 | 10000 | 1.4 |
| (P-2) | 40/15/30/15 | 8000 | 1.3 |
| (P-3) | 40/10/40/10 | 6000 | 1.5 |
| (P-4) | 35/10/40/10/5 | 15000 | 1.5 |
| (1b) | 40/50/10 | 5000 | 1.3 |
| (2b) | 40/50/10 | 5000 | 1.4 |
| (3b) | 50/50 | 6000 | 1.6 |
| (4b) | 39/57/2/2 | 4000 | 1.3 |

Synthesis Example 2

Synthesis of Triphenylsulfonium Acetate

Triphenylsulfonium iodide (5.07 g (13 mmol)), 2.25 g (13.5 mmol) of silver acetate, 120 mL of acetonitrile and 60 mL of water were added and stirred at room temperature for 1 hours. The reaction solution was filtered to obtain a triphenylsulfonium acetate solution.

Synthesis Example 3

Synthesis of Compound PAG-1

In a nitrogen stream, 28.0 g (88.55 mmol) of 1,1,2,2,3,3-hexafluoropropane-1,3-disulfonyl difluoride, 17.92 g (177.1 mmol) and 210 mL of diisopropyl ether were cooled with ice, and a mixed solution containing 7.56 g (88.2 mmol) of piperidine and 105 mL of diisopropyl ether was added dropwise thereto over 30 minutes. This mixture was stirred for 1 hour under cooling with ice and further stirred at room temperature for 1 hour. The organic layer was washed sequentially with water, with an aqueous saturated ammonium chloride solution and with water, and the resulting organic layer was dried over sodium sulfate. The solvent was removed, and 140 mL of ethanol and 1,400 mg of sodium hydroxide were added to the residue. After stirring at room temperature for 2 hours, the reaction solution was neutralized by adding dilute hydrochloric acid to obtain a sulfonic acid ethanol solution.

The triphenylsulfonium acetate solution was added to the sulfonic acid solution, and the mixture was stirred at room temperature for 2 hours. Thereafter, 2,100 mL of chloroform was added, and the organic layer was washed sequentially with water, with an aqueous saturated ammonium chloride solution and with water and then purified by column chromatography (SiO$_2$, chloroform/methanol=5/1 (by volume)) to obtain 21.0 g (32.76 mmol) of Compound (PAG-1) shown below, as a white solid.

$^1$H-NMR (300 MH$_z$, CDCl$_3$) δ 1.64 (bs, 6H), 3.29 (bs, 2H), 3.64 (bs, 2H), 7.70 (m, 15H).
$^{19}$F-NMR (300 MHz, CDCl$_3$) δ −111.1 (t, 2F), −114.3 (t, 2F), −119.4 (m, 2F).

(PAG-1)

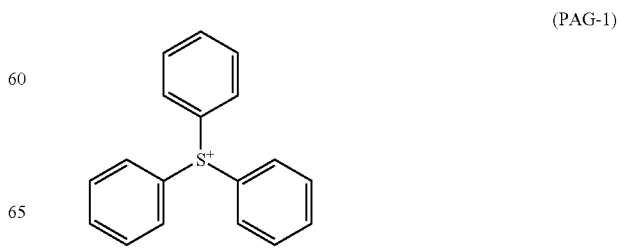

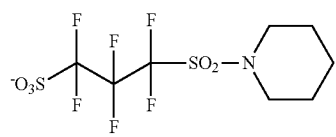
Compounds (PAG-2) to (PAG-7) and (pa-1) to (pa-7) shown below were synthesized in the same manner as in Synthesis Examples 2 and 3 by using compounds corresponding to respective components.
(PAG-2)
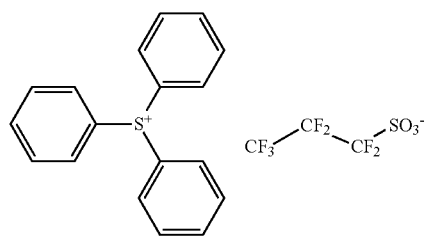
(PAG-3)
(PAG-4)
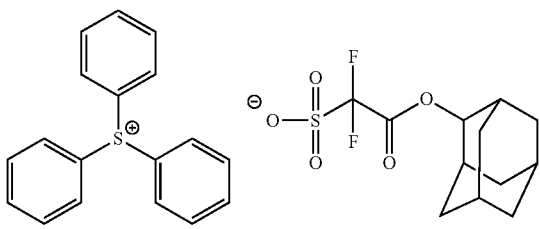
(PAG-5)
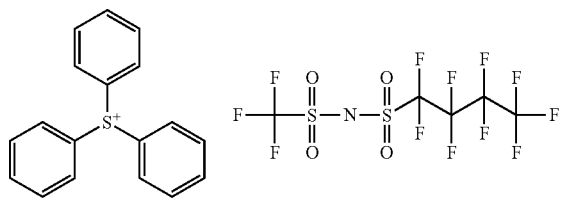
(PAG-6)
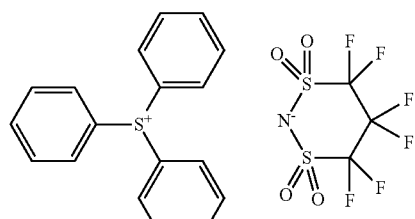
(PAG-7)
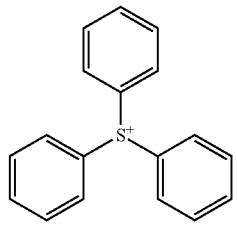
(pa-1)
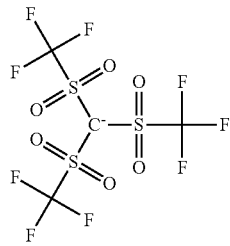
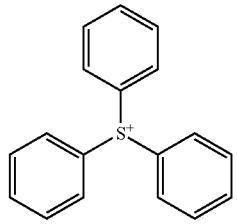
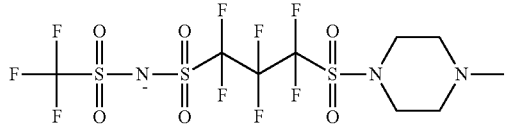
(pa-2)
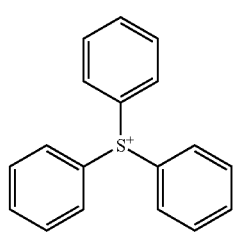
(pa-3)
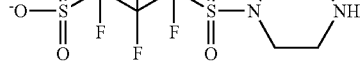
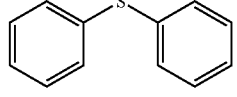
(pa-4)
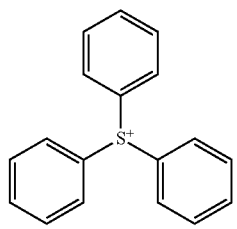
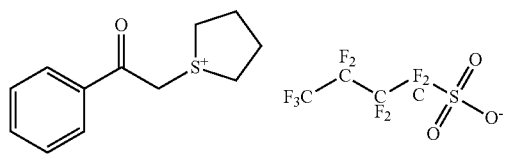

-continued

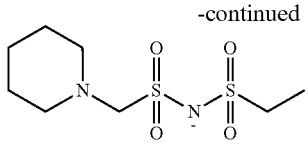

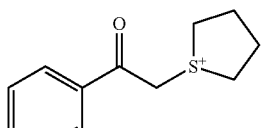

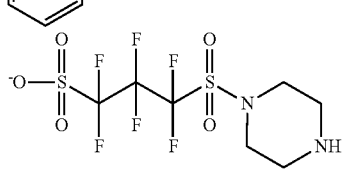

(pa-5)

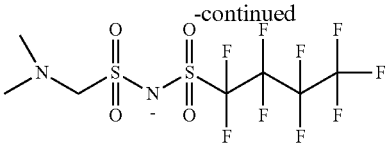

(pa-6)

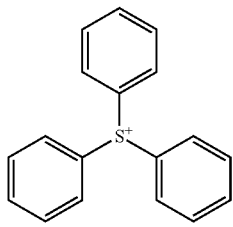

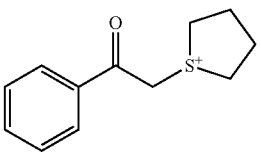 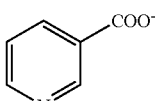

(pa-7)

<Preparation of Resist Composition>

The components shown in Table 3 below were dissolved in the solvent shown in Table 3 to prepare a solution having a solid content concentration of 4 mass %, and the solution was filtered through a polyethylene filter having a pore size of 0.03 µm. In this way, Resist Compositions Ar-1 to Ar-20 and Ar-R1 to Ar-R8 were prepared.

TABLE 3

| Resist | (i) Resin | mass/g | (ii) Acid Generator | mass/g | (iii) Acid Generator Used in Combination | mass/g | (iv) Basic Compound | mass/g | (v) Basic Compound Used in Combination | mass/g | (vi) Surfactant | mass/g | (vii) Hydrophobic Resin | mass/g | (viii) Solvent | mass ratio |
|---|---|---|---|---|---|---|---|---|---|---|---|---|---|---|---|---|
| Ar-1 | (P-1) | 10 | (PAG-1) | 0.8 | | | (pa-1) | 0.15 | | | W-1 | 0.04 | (1b) | 0.06 | A1/B1 | 60/40 |
| Ar-2 | (P-2) | 10 | (PAG-2) | 0.8 | | | (pa-2) | 0.15 | | | W-2 | 0.04 | (2b) | 0.06 | A1/B2 | 80/20 |
| Ar-3 | (P-3) | 10.04 | (PAG-3) | 0.8 | | | (pa-3) | 0.15 | | | | | (3b) | 0.06 | A2/B1 | 70/30 |
| Ar-4 | (P-4) | 10.06 | (PAG-4) | 0.3 | (PAG-1) | 0.5 | (pa-4) | 0.15 | | | W-1 | 0.04 | | | A3/B2 | 80/20 |
| Ar-5 | (P-1) | 10 | (PAG-5) | 0.4 | (PAG-7) | 0.4 | (pa-5) | 0.15 | | | W-2 | 0.04 | (1b) | 0.06 | A1/A2/B1 | 50/4/46 |
| Ar-6 | (P-2) | 10 | (PAG-6) | 0.8 | | | (pa-6) | 0.15 | | | W-3 | 0.04 | (2b) | 0.06 | A1/B1 | 60/40 |
| Ar-7 | (P-3) | 10 | (PAG-7) | 0.8 | | | (pa-7) | 0.15 | | | W-1 | 0.04 | (3b) | 0.06 | A1/B2 | 80/20 |
| Ar-8 | (P-4) | 10 | (PAG-1) | 0.8 | | | (pa-1) | 0.06 | (pa-6) | 0.09 | W-2 | 0.04 | (4b) | 0.06 | A2/B1 | 70/30 |
| Ar-9 | (P-1) | 10 | (PAG-2) | 0.8 | | | (pa-2) | 0.06 | (pa-6) | 0.09 | W-3 | 0.04 | (1b) | 0.06 | A3/B2 | 80/20 |
| Ar-10 | (P-2) | 10 | (PAG-3) | 0.3 | (PAG-1) | 0.5 | (pa-3) | 0.06 | (pa-6) | 0.09 | W-1 | 0.04 | (2b) | 0.06 | A1/A2/B1 | 50/4/46 |
| Ar-11 | (P-3) | 10 | (PAG-4) | 0.4 | (PAG-2) | 0.4 | (pa-4) | 0.06 | (pa-6) | 0.09 | W-2 | 0.04 | (3b) | 0.06 | A1/B1 | 60/40 |
| Ar-12 | (P-4) | 10 | (PAG-5) | 0.8 | | | (pa-5) | 0.09 | (pa-7) | 0.09 | W-3 | 0.04 | (4b) | 0.06 | A1/B2 | 80/20 |
| Ar-13 | (P-1) | 10 | (PAG-6) | 0.8 | | | (pa-1) | 0.06 | (pa-4) | 0.09 | W-1 | 0.04 | (1b) | 0.06 | A2/B1 | 70/30 |
| Ar-14 | (P-2) | 10 | (PAG-7) | 0.8 | | | (pa-2) | 0.06 | (pa-4) | 0.09 | W-2 | 0.04 | (2b) | 0.06 | A3/B2 | 80/20 |
| Ar-15 | (P-3) | 10 | (PAG-1) | 0.8 | | | (pa-3) | 0.06 | (pa-4) | 0.09 | W-3 | 0.04 | (3b) | 0.06 | A1/A2/B1 | 50/4/46 |
| Ar-16 | (P-4) | 10 | (PAG-2) | 0.3 | (PAG-1) | 0.5 | (pa-4) | 0.06 | (B-1) | 0.09 | W-1 | 0.04 | (4b) | 0.06 | A1/B1 | 60/40 |
| Ar-17 | (P-1) | 10 | (PAG-3) | 0.4 | (PAG-5) | 0.4 | (pa-5) | 0.06 | (B-2) | 0.09 | W-2 | 0.04 | (1b) | 0.06 | A1/B2 | 80/20 |
| Ar-18 | (P-2) | 10 | (PAG-4) | 0.8 | | | (pa-6) | 0.06 | (B-3) | 0.09 | W-3 | 0.04 | (2b) | 0.06 | A2/B1 | 70/30 |
| Ar-19 | (P-3) | 10 | (PAG-5) | 0.8 | | | (pa-7) | 0.06 | (pa-6) | 0.09 | W-1 | 0.04 | (3b) | 0.06 | A3/B2 | 80/20 |
| Ar-20 | (P-4) | 10 | (PAG-6) | 0.8 | | | (pa-1) | 0.06 | (pa-6) | 0.09 | W-2 | 0.04 | (4b) | 0.06 | A1/A2/B1 | 50/4/46 |
| Ar-R1 | (P-1) | 10 | (PAG-7) | 0.8 | | | (B-1) | 0.06 | (B-3) | 0.09 | W-3 | 0.04 | (1b) | 0.06 | A1/B1 | 60/40 |
| Ar-R2 | (P-2) | 10 | (PAG-1) | 0.3 | (PAG-4) | 0.5 | (B-2) | 0.15 | | | W-1 | 0.04 | (2b) | 0.06 | A1/B2 | 80/20 |
| Ar-R3 | (P-3) | 10 | (PAG-2) | 0.4 | (PAG-3) | 0.4 | (B-3) | 0.15 | | | W-2 | 0.04 | (3b) | 0.06 | A2/B1 | 70/30 |
| Ar-R4 | (P-4) | 10 | (PAG-3) | 0.5 | (PAG-7) | 0.3 | (B-1) | 0.15 | | | W-3 | 0.04 | (4b) | 0.06 | A3/B2 | 80/20 |
| Ar-R5 | (P-1) | 10 | (PAG-4) | 0.8 | | | (B-2) | 0.06 | (B-3) | 0.09 | W-1 | 0.04 | (1b) | 0.06 | A1/A2/B1 | 50/4/46 |
| Ar-R6 | (P-2) | 10 | (PAG-5) | 0.8 | | | (B-3) | 0.06 | (B-1) | 0.09 | W-2 | 0.04 | (2b) | 0.06 | A1/B1 | 60/40 |
| Ar-R7 | (P-3) | 10 | (PAG-6) | 0.3 | | | (B-1) | 0.06 | (B-2) | 0.09 | W-3 | 0.04 | (3b) | 0.06 | A1/B2 | 80/20 |
| Ar-R8 | (P-4) | 10 | (PAG-7) | 0.4 | (PAG-1) | 0.4 | (B-2) | 0.15 | | | W-1 | 0.04 | (4b) | 0.06 | A2/B1 | 70/30 |

Abbreviations in Table 3 are as follows.
B-1 to B-3: Each indicates the compound shown below.

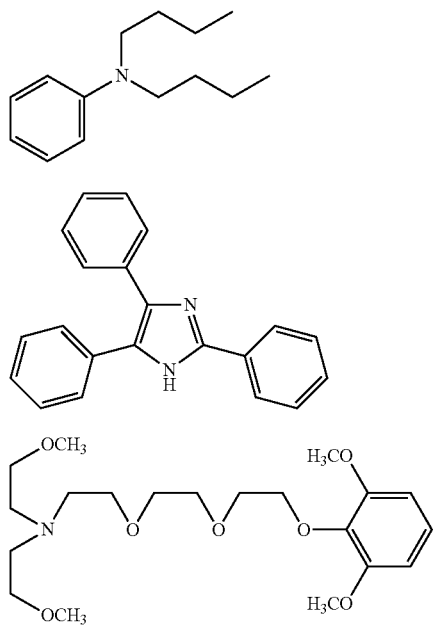

W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: polysiloxane polymer KP-341 (produced by Shin-Etsu Chemical Co., Ltd.) (silicon-containing)
A1: Propylene glycol monomethyl ether acetate (PGMEA)
A2: γ-Butyrolactone
A3: Cyclohexanone
B1: Propylene glycol monomethyl ether (PGME)
B2: Ethyl lactate Using the prepared resist composition, a resist pattern was formed by the following method.

Example 1

Exposure→Baking→Development, abbr.: E-B-D

An organic antireflection film, ARC29A (produced by Nissan Chemical Industries, Ltd.), was applied on a silicon wafer and baked at 205° C. for 60 seconds to form an antireflection film having a film thickness of 86 nm, and Resist Composition Ar-1 was applied thereon and baked at 100° C. for 60 seconds to form a resist film having a film thickness of 100 nm. The obtained wafer was subjected to pattern exposure using an ArF excimer laser scanner (PAS5500/1100, manufactured by ASML, NA: 0.75, Dipole, σo/σi=0.89/0.65) through an exposure mask (100-nm line-and-space (1/1)) (the exposure dose was set to an exposure dose at which a pattern with a pitch of 200 nm and a line width of 100 nm is obtained by the later-described development). Thereafter, the wafer was heated at 105° C. for 60 seconds, developed by puddling a developer for 30 seconds, rinsed by puddling a rinsing solution (1-hexanol) for 30 seconds and then spun at a rotational speed of 4,000 rpm for 30 seconds to obtain a line-and-space resist pattern of 100 nm (1:1).

Examples 2 to 17 and 21 to 37 and Comparative Examples 1 to 5 and 9

Line-and-space resist patterns of 100 nm (1:1) were obtained in the same manner as in the method of Example 1 except for employing the resist, developer, rinsing solution and conditions shown in Table 4.

Example 18

Exposure→Baking→Aqueous Alkali Development (Positive Image Formation)→Baking→Development with an Organic Solvent-Containing Developer (Negative Image Formation, abbr.: E-B-P-B-N An organic antireflection film, ARC29A (produced by Nissan Chemical Industries, Ltd.), was applied on a silicon wafer and baked at 205° C. for 60 seconds to form an antireflection film having a film thickness of 86 nm, and Resist Composition Ar-18 was applied thereon and baked at 100° C. for 60 seconds to form a resist film having a film thickness of 100 nm. The obtained wafer was subjected to pattern exposure using an ArF excimer laser scanner (PAS5500/1100, manufactured by ASML, NA: 0.75, Dipole, σo/σi=0.89/0.65) through an exposure mask (200-nm line-and-space (1/1)). (the exposure dose was set to an exposure dose at which a pattern with a pitch of 400 nm and a line width of 300 nm is obtained by the later-described positive development). Thereafter, the wafer was heated at 105° C. for 60 seconds, developed by puddling an aqueous tetramethylammonium hydroxide (TMAH) solution (2.38 mass %) (positive developer) for 30 seconds (positive development), and rinsed by puddling pure water for 30 seconds to obtain a pattern having a pitch of 400 nm and a line width of 300 nm. Furthermore, the wafer was heated at 105° C. for 60 seconds, developed by puddling an organic solvent-containing developer (butyl acetate) for 30 seconds (negative development), rinsed by puddling a rising solution (4-methyl-2-pentanol) for 30 seconds and then spun at a rotational speed of 4,000 rpm for 30 seconds to obtain a line-and-space resist pattern of 100 nm (1:1).

Example 38

A line-and-space resist pattern of 100 nm (1:1) was obtained in the same manner as in the method of Example 18 except for using the developer (2nd time) shown in Table 4.

Example 19

Exposure Baking→Development with an Organic Solvent-Containing Developer (Negative Image Formation)→Baking→Aqueous Alkali Development (Positive Image Formation), abbr.: E-B-N-B-P An organic antireflection film, ARC29A (produced by Nissan Chemical Industries, Ltd.), was applied on a silicon wafer and baked at 205° C. for 60 seconds to form an antireflection film having a film thickness of 86 nm, and Resist Composition Ar-19 was applied thereon and baked at 100° C. for 60 seconds to form a resist film having a film thickness of 100 nm. The obtained wafer was subjected to pattern exposure using an ArF excimer laser scanner (PAS5500/1100, manufactured by ASML, NA: 0.75, Dipole, σo/σi=0.89/0.65) through an exposure mask (200-nm line-and-space (1/1)) (the exposure dose was set to an exposure dose at which a pattern with a pitch of 400 nm and a line width of 300 nm is obtained by the later-described negative development). Thereafter, the wafer was heated at 105° C. for 60 seconds, developed by puddling an organic solvent-containing developer (butyl acetate) for 30 seconds (negative development), rinsed by puddling a rising solution (1-hexanol) for 30 seconds and then spun at a rotational speed of 4,000 rpm for 30 seconds to obtain a pattern having a pitch of 400 nm and a line width of 300 nm. Furthermore, the wafer was heated at 105° C. for 60 seconds, developed by puddling an aqueous tetramethylammonium hydroxide solution (2.38 mass %) (positive developer) for 30 seconds (positive development), and rinsed by puddling pure water for 30 seconds to obtain a line-and-space resist pattern of 100 nm (1:1).

Example 39

A line-and-space resist pattern of 100 nm (1:1) was obtained in the same manner as in the method of Example 19 except for using the developer (1st time) and the rinsing solution (1st time) shown in Table 4.

Example 20

Immersion Exposure→Baking→Development, abbr.: iE-B-D

An organic antireflection film, ARC29SR (produced by Nissan Chemical Industries, Ltd.), was applied on a silicon wafer and baked at 205° C. for 60 seconds to form an antireflection film having a film thickness of 95 nm, and Resist Composition Ar-20 was applied thereon and baked at 100° C. for 60 seconds to form a resist film having a film thickness of 100 nm. The obtained wafer was subjected to pattern exposure using an ArF excimer laser immersion scanner (XT17001, manufactured by ASML, NA: 1.20, C-Quad, outer sigma: 0.981, inner sigma: 0.895, XY deflection) through an exposure mask (100-nm line-and-space (1/1)) (the exposure dose was set to an exposure dose at which a pattern with a pitch of 200 nm and a line width of 100 nm is obtained by the later-described development). As for the immersion liquid, ultrapure water was used. Thereafter, the wafer was heated at 105° C. for 60 seconds, developed by puddling a developer (butyl acetate) for 30 seconds, rinsed by puddling a rising solution (4-methyl-2-pentanol) for 30 seconds and then spun at a rotational speed of 4,000 rpm for 30 seconds to obtain a line-and-space resist pattern of 100 nm (1:1).

Example 40

A line-and-space resist pattern of 100 nm (1:1) was obtained in the same manner as in the method of Example 20 except for using the developer (1st time) shown in Table 4.

Comparative Example 6

A line-and-space resist pattern of 100 nm (1:1) was obtained in the same manner as in the method of Example 20 except for employing the resist and conditions shown in Table 4.

Comparative Example 7

A line-and-space resist pattern of 100 nm (1:1) was obtained in the same manner as in the method of Example 18 except for employing the resist, developer, rinsing solution and conditions shown in Table 4.

Comparative Example 8

A line-and-space resist pattern of 100 nm (1:1) was obtained in the same manner as in the method of Example 19 except for employing the resist, developer, rinsing solution and conditions shown in Table 4.

TABLE 4

| | Resist | PB | PEB | Developer (1st time) | Rinsing Solution (1st time) | Developer (2nd time) | Rinsing Solution (2nd time) | Abbreviation of Process |
|---|---|---|---|---|---|---|---|---|
| Example (1) | Ar-1 | 100C60s | 105C60s | butyl acetate | 1-hexanol | none | none | E-B-D |
| Example (2) | Ar-2 | 100C60s | 105C60s | butyl acetate | 1-hexanol | none | none | E-B-D |
| Example (3) | Ar-3 | 100C60s | 105C60s | B1 | 1-hexanol | none | none | E-B-D |
| Example (4) | Ar-4 | 100C60s | 105C60s | B1 | 4-methyl-2-pentanol | none | none | E-B-D |
| Example (5) | Ar-5 | 100C60s | 105C60s | butyl acetate | 4-methyl-2-pentanol | none | none | E-B-D |
| Example (6) | Ar-6 | 100C60s | 105C60s | butyl acetate | 4-methyl-2-pentanol | none | none | E-B-D |
| Example (7) | Ar-7 | 100C60s | 105C60s | butyl acetate | 4-methyl-2-pentanol | none | none | E-B-D |
| Example (8) | Ar-8 | 100C60s | 105C60s | butyl acetate | 4-methyl-2-pentanol | none | none | E-B-D |
| Example (9) | Ar-9 | 100C60s | 105C60s | butyl acetate | 1-hexanol | none | none | E-B-D |
| Example (10) | Ar-10 | 100C60s | 105C60s | butyl acetate | 1-hexanol | none | none | E-B-D |
| Example (11) | Ar-11 | 100C60s | 105C60s | butyl acetate | 1-hexanol | none | none | E-B-D |
| Example (12) | Ar-12 | 100C60s | 105C60s | butyl acetate | 4-methyl-2-pentanol | none | none | E-B-D |
| Example (13) | Ar-13 | 100C60s | 105C60s | butyl acetate | 4-methyl-2-pentanol | none | none | E-B-D |
| Example (14) | Ar-14 | 100C60s | 105C60s | butyl acetate | 4-methyl-2-pentanol | none | none | E-B-D |
| Example (15) | Ar-15 | 100C60s | 105C60s | butyl acetate | 4-methyl-2-pentanol | none | none | E-B-D |
| Example (16) | Ar-16 | 100C60s | 105C60s | butyl acetate | 4-methyl-2-pentanol | none | none | E-B-D |
| Example (17) | Ar-17 | 100C60s | 95C60s | butyl acetate | 1-hexanol | none | none | E-B-D |
| Example (18) | Ar-18 | 100C60s | 105C60s | aq. 2.38 wt % TMAH solution | pure water | butyl acetate | 4-methyl-2-pentanol | E-B-P-B-N |
| Example (19) | Ar-19 | 100C60s | 105C60s | butyl acetate | 1-hexanol | aq. 2.38 wt % TMAH solution | pure water | E-B-N-B-P |
| Example (20) | Ar-20 | 100C60s | 105C60s | butyl acetate | 4-methyl-2-pentanol | none | none | iE-B-D |
| Example (21) | Ar-1 | 100C60s | 105C60s | A1 | 1-hexanol | none | none | E-B-D |
| Example (22) | Ar-2 | 100C60s | 105C60s | A1: B1 = 50 wt %: 50 wt % | 1-hexanol | none | none | E-B-D |
| Example (23) | Ar-3 | 100C60s | 105C60s | 2-hexanone | 1-hexanol | none | none | E-B-D |
| Example (24) | Ar-4 | 100C60s | 105C60s | 3-hexanone | 4-methyl-2-pentanol | none | none | E-B-D |
| Example (25) | Ar-5 | 100C60s | 105C60s | 2-heptanone | 4-methyl-2-pentanol | none | none | E-B-D |
| Example (26) | Ar-6 | 100C60s | 105C60s | 3-heptanone | 4-methyl-2-pentanol | none | none | E-B-D |

TABLE 4-continued

| | Resist | PB | PEB | Developer (1st time) | Rinsing Solution (1st time) | Developer (2nd time) | Rinsing Solution (2nd time) | Abbreviation of Process |
|---|---|---|---|---|---|---|---|---|
| Example (27) | Ar-7 | 100C60s | 105C60s | anisole | 4-methyl-2-pentanol | none | none | E-B-D |
| Example (28) | Ar-8 | 100C60s | 105C60s | ethyl 3-ethoxy-propionate | 4-methyl-2-pentanol | none | none | E-B-D |
| Example (29) | Ar-9 | 100C60s | 105C60s | ethyl 3-ethoxy-propionate | 1-hexanol | none | none | E-B-D |
| Example (30) | Ar-10 | 100C60s | 105C60s | A1 | 1-hexanol | none | none | E-B-D |
| Example (31) | Ar-11 | 100C60s | 105C60s | A1: B1 = 50 wt %: 50 wt % | 1-hexanol | none | none | E-B-D |
| Example (32) | Ar-12 | 100C60s | 105C60s | 2-hexanone | 4-methyl-2-pentanol | none | none | E-B-D |
| Example (33) | Ar-13 | 100C60s | 105C60s | 3-hexanone | 4-methyl-2-pentanol | none | none | E-B-D |
| Example (34) | Ar-14 | 100C60s | 105C60s | 2-heptanone | 4-methyl-2-pentanol | none | none | E-B-D |
| Example (35) | Ar-15 | 100C60s | 105C60s | 3-heptanone | 4-methyl-2-pentanol | none | none | E-B-D |
| Example (36) | Ar-16 | 100C60s | 105C60s | ethyl 3-ethoxypropionate | 4-methyl-2-pentanol | none | none | E-B-D |
| Example (37) | Ar-17 | 100C60s | 95C60s | ethyl 3-ethoxypropionate | 1-hexanol | none | none | E-B-D |
| Example (38) | Ar-18 | 100C60s | 105C60s | aq. 2.38 wt % TMAH solution | pure water | 2-heptanone | 4-methyl-2-pentanol | E-B-P-B-N |
| Example (39) | Ar-19 | 100C60s | 105C60s | 2-heptanone | 4-methyl-2-pentanol | aq. 2.38 wt % TMAH solution | pure water | E-B-N-B-P |
| Example (40) | Ar-20 | 100C60s | 105C60s | ethyl 3-ethoxypropionate | 4-methyl-2-pentanol | none | none | iE-B-D |
| Comparative Example (1) | Ar-R1 | 100C60s | 105C60s | butyl acetate | 4-methyl-2-pentanol | none | none | E-B-D |
| Comparative Example (2) | Ar-R2 | 100C60s | 105C60s | butyl acetate | 4-methyl-2-pentanol | none | none | E-B-D |
| Comparative Example (3) | Ar-R3 | 100C60s | 105C60s | butyl acetate | 4-methyl-2-pentanol | none | none | E-B-D |
| Comparative Example (4) | Ar-R4 | 100C60s | 105C60s | butyl acetate | 4-methyl-2-pentanol | none | none | E-B-D |
| Comparative Example (5) | Ar-R5 | 100C60s | 105C60s | butyl acetate | 1-hexanol | none | none | E-B-D |
| Comparative Example (6) | Ar-R6 | 100C60s | 105C60s | butyl acetate | 1-hexanol | none | none | iE-B-D |
| Comparative Example (7) | Ar-R7 | 100C60s | 105C60s | aq. 2.38 wt % TMAH solution | pure water | butyl acetate | 4-methyl-2-pentanol | E-B-P-B-N |
| Comparative Example (8) | Ar-R8 | 100C60s | 105C60s | butyl acetate | 4-methyl-2-pentanol | aq. 2.38 wt % TMAH solution | pure water | E-B-N-B-P |
| Comparative Example (9) | Ar-1 | 100C60s | 105C60s | aq. 2.38 wt % TMAH solution | pure water | none | none | E-B-D |

In Table 4, PB indicates heating before exposure, and PEB indicates heating after exposure. Also, in the columns of PB and PEB, for example, "100C60s" indicates heating at 100° C. for 60 seconds. In the developer, each of A1 and B1 indicates the solvent set forth above.

<Evaluation Method>

Evaluation of Resolution:

[Line Width Roughness (LWR)]

The line-and-space resist pattern of 100 nm (1:1) was observed using a Critical Dimension scanning electron microscope (SEM) (S-9380II, manufactured by Hitachi Ltd.). With respect to the range of 2 μm in the longitudinal direction of the space pattern, the line width was measured at 50 points at regular intervals and from its standard deviation, 3σ was computed, whereby the line width roughness was measured. A smaller value indicates better performance.

[Defocus Latitude (DOF)]

The exposure dose and focus for forming a line-and-space resist pattern of 100 nm (1:1) were defined as an optimal exposure dose and an optimal focus, respectively. The focus was changed (defocused) while keeping the exposure dose at the optimal exposure dose, and the amplitude of focus allowing a pattern size of 100 nm±10% was determined. As the value is larger, the change in performance due to change of focus is smaller and the defocus latitude (DOF) is better.

[Profile]

The cross-sectional profile of the line-and-space resist pattern of 100 nm (1:1) at the optimal exposure dose and optimal focus was observed. A profile closer to rectangle is better.

TABLE 5

| | Resist | LWR [nm] | DOF [μm] | Pattern Profile |
|---|---|---|---|---|
| Example (1) | Ar-1 | 5.2 | 0.60 | rectangular |
| Example (2) | Ar-2 | 6.9 | 0.50 | rectangular |
| Example (3) | Ar-3 | 6.1 | 0.55 | rectangular |
| Example (4) | Ar-4 | 5.8 | 0.55 | rectangular |
| Example (5) | Ar-5 | 6.5 | 0.55 | rectangular |
| Example (6) | Ar-6 | 5.9 | 0.57 | rectangular |
| Example (7) | Ar-7 | 6.7 | 0.50 | rectangular |
| Example (8) | Ar-8 | 5.3 | 0.60 | rectangular |
| Example (9) | Ar-9 | 5.2 | 0.55 | rectangular |
| Example (10) | Ar-10 | 5.4 | 0.55 | rectangular |
| Example (11) | Ar-11 | 6.0 | 0.65 | rectangular |
| Example (12) | Ar-12 | 6.0 | 0.50 | rectangular |
| Example (13) | Ar-13 | 5.7 | 0.53 | rectangular |
| Example (14) | Ar-14 | 4.5 | 0.55 | rectangular |
| Example (15) | Ar-15 | 5.3 | 0.65 | rectangular |
| Example (16) | Ar-16 | 5.8 | 0.65 | rectangular |
| Example (17) | Ar-17 | 6.7 | 0.55 | rectangular |
| Example (18) | Ar-18 | 4.6 | 0.65 | rectangular |
| Example (19) | Ar-19 | 5.0 | 0.50 | rectangular |
| Example (20) | Ar-20 | 4.0 | 0.70 | rectangular |
| Example (21) | Ar-1 | 4.9 | 0.72 | rectangular |
| Example (22) | Ar-2 | 6.2 | 0.58 | rectangular |
| Example (23) | Ar-3 | 5.7 | 0.60 | rectangular |
| Example (24) | Ar-4 | 5.7 | 0.61 | rectangular |
| Example (25) | Ar-5 | 6.5 | 0.72 | rectangular |
| Example (26) | Ar-6 | 5.1 | 0.68 | rectangular |
| Example (27) | Ar-7 | 6.4 | 0.58 | rectangular |

TABLE 5-continued

| | Resist | LWR [nm] | DOF [μm] | Pattern Profile |
|---|---|---|---|---|
| Example (28) | Ar-8 | 4.8 | 0.65 | rectangular |
| Example (29) | Ar-9 | 4.9 | 0.61 | rectangular |
| Example (30) | Ar-10 | 5.3 | 0.72 | rectangular |
| Example (31) | Ar-11 | 6.0 | 0.78 | rectangular |
| Example (32) | Ar-12 | 5.2 | 0.58 | rectangular |
| Example (33) | Ar-13 | 5.4 | 0.58 | rectangular |
| Example (34) | Ar-14 | 4.1 | 0.61 | rectangular |
| Example (35) | Ar-15 | 5.0 | 0.85 | rectangular |
| Example (36) | Ar-16 | 5.7 | 0.78 | rectangular |
| Example (37) | Ar-17 | 6.7 | 0.64 | rectangular |
| Example (38) | Ar-18 | 4.0 | 0.71 | rectangular |
| Example (39) | Ar-19 | 4.8 | 0.55 | rectangular |
| Example (40) | Ar-20 | 3.6 | 0.92 | rectangular |
| Comparative Example (1) | Ar-R1 | 7.3 | 0.30 | T-top |
| Comparative Example (2) | Ar-R2 | 7.5 | 0.35 | T-top |
| Comparative Example (3) | Ar-R3 | 8.2 | 0.30 | T-top |
| Comparative Example (4) | Ar-R4 | 7.0 | 0.40 | T-top |
| Comparative Example (5) | Ar-R5 | 7.5 | 0.40 | T-top |
| Comparative Example (6) | Ar-R6 | 7.1 | 0.35 | T-top |
| Comparative Example (7) | Ar-R7 | 7.6 | 0.50 | tapered |
| Comparative Example (8) | Ar-R8 | 7.2 | 0.52 | tapered |
| Comparative Example (9) | Ar-1 | 8.3 | 0.45 | rectangular |

As apparent from Table 5, in all of Comparative Examples 1 to 6 where a resist composition not containing (C) a basic compound or ammonium salt compound for use in the present invention is used, the line width roughness, defocus latitude and pattern profile are bad, in Comparative Examples 7 and 8, the line width roughness and pattern profile are bad, and in Comparative Example 9, the line width roughness and defocus latitude are bad.

On the other hand, it is seen that in all of Examples 1 to 40 where the resist composition for use in the present invention is developed with an organic solvent-containing developer, a high-precision fine pattern excellent in terms of line width roughness, defocus latitude and pattern profile can be stably formed. In particular, there is seen a tendency that the results of Examples 18, 19, 38 and 39 where double development is performed, and the results of Examples 20 and 40 where immersion exposure is performed, are excellent in terms of the line width roughness, defocus latitude and pattern profile.

INDUSTRIAL APPLICABILITY

According to the present invention, a pattern forming method excellent in terms of line width variation (LWR), focus latitude (DOF) and pattern profile, a composition used therefor, and a resist film can be provided.

This application is based on Japanese patent applications No. 2009-144711, filed on Jun. 17, 2009 and No. 2010-105909, filed on Apr. 30, 2010, the entire content of which is hereby incorporated by reference, the same as if set forth at length.

The invention claimed is:

1. A pattern forming method, comprising:
   (i) forming a film from a chemical amplification resist composition;
   (ii) pattern-wise exposing the film with far ultraviolet rays or EUV light using a mask or a reticle having a pattern, so as to form an exposed film having low exposure regions and high exposure regions; and
   (iii) developing the exposed film by using a developer containing an organic solvent, wherein the chemical amplification resist composition contains:
      (A) a resin (A) which contains an acid-decomposable group-containing repeating unit and which decreases its solubility in the developer containing an organic solvent by an action of an acid;
      (B) a compound capable of generating an acid upon irradiation with an actinic ray or radiation; and
      (C) a basic compound or ammonium salt compound whose basicity decreases upon irradiation with an actinic ray or radiation,
   wherein the organic solvent contained in the developer is at least one kind of an organic solvent selected from the group consisting of a ketone-based solvent, an ester-based solvent, an amide-based solvent or an ether-based solvent,
   and wherein the development is performed by dissolving the low exposure regions of the exposed film and forming the pattern of said high exposure regions.

2. The pattern forming method according to claim 1, wherein the content of the organic solvent in the developer is from 90 to 100 mass % based on the entire amount of the developer.

3. The pattern forming method according to claim 1, wherein the compound (C) is a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

4. The pattern forming method according to claim 1, wherein the compound (C) generates a compound represented by the following formula (PA-I), (PA-II) or (PA-III) upon irradiation with an actinic ray or radiation:

$$Q\text{-}A_1\text{-}(X)_n\text{—}B\text{—}R \quad (PA\text{-}I)$$

$$Q_1\text{-}X_1\text{—}NH\text{—}X_2\text{-}Q_2 \quad (PA\text{-}II)$$

$$Q_1\text{-}X_1\text{—}NH\text{—}X_2\text{-}A_2\text{-}(X_3)_m\text{—}B\text{-}Q_3 \quad (PA\text{-}III)$$

wherein in formula (PA-I),
  $A_1$ represents a single bond or a divalent linking group;
  Q represents $—SO_3H$ or $—CO_2H$;
  X represents $—SO_2—$ or $—CO—$;
  n represents 0 or 1;
  B represents a single bond, an oxygen atom or $—N(Rx)\text{-}$;
  Rx represents a hydrogen atom or a monovalent organic group; and
  R represents a monovalent organic group having a basic functional group, or a monovalent organic group having an ammonium group;
in formula (PA-II),
  each of $Q_1$ and $Q_2$ independently represents a monovalent organic group, provided that either one of $Q_1$ and $Q_2$ has a basic functional group, $Q_1$ and $Q_2$ may combine to form a ring, and the ring formed may have a basic functional group; and
  each of $X_1$ and $X_2$ independently represents $—CO—$ or $—SO_2—$; and
in formula (PA-III),
  each of $Q_1$ and $Q_3$ independently represents a monovalent organic group, provided that either one of $Q_1$ and $Q_3$ has a basic functional group, $Q_1$ and $Q_3$ may combine to form a ring, and the ring formed may have a basic functional group;
  each of $X_1$, $X_2$ and $X_3$ independently represents $—CO—$ or $—SO_2—$;
  $A_2$ represents a divalent linking group;

B represents a single bond, an oxygen atom or —N(Qx)-;

Qx represents a hydrogen atom or a monovalent organic group;

when B is —N(Qx)-, $Q_3$ and Qx may combine to form a ring; and m represents 0 or 1.

5. The pattern forming method according to claim 4, wherein the compound (C) generates a compound represented by formula (PA-II) or (PA-III).

6. The pattern forming method according to claim 1, further comprising:
(iv) performing rinsing by using a rinsing solution.

7. The pattern forming method according to claim 6, wherein the rinsing solution is a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

8. The pattern forming method according to claim 1, further comprising:
(vi) developing the film by using an aqueous alkali developer.

9. The pattern forming method according to claim 1, wherein the exposure is immersion exposure.

10. A chemical amplification resist composition that is used in the pattern forming method claimed in claim 1.

11. A resist film formed from the chemical amplification resist composition claimed in claim 10.

12. The pattern forming method according to claim 1, wherein the resist composition further contains a hydrophobic resin.

13. The pattern forming method according to claim 1, wherein the actinic ray or radiation is ArF excimer laser.

14. The pattern forming method according to claim 1, wherein the acid-decomposable group-containing repeating unit in the resin (A) is represented by formula (AI):

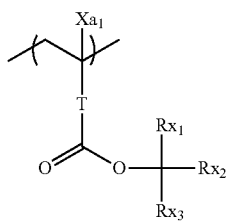

(AI)

wherein, in the formula (AI), $Xa_1$ represents a hydrogen atom, a methyl group which may have a substituent, or a group represented by —$CH_2$—$R_9$ where $R_9$ represents a hydroxyl group or a monovalent organic group; T represents a single bond or a divalent linking group; and each of $Rx_1$ to $Rx_3$ independently represents an alkyl group or a cycloalkyl group with the proviso that two members out of $Rx_1$ to $Rx_3$ may combine to form a cycloalkyl group.

15. The pattern forming method according to claim 14, wherein the acid-decomposable group-containing repeating unit includes a repeating unit represented by formulae (1) or (2):

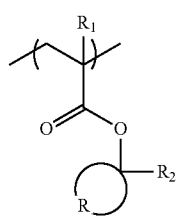

(1)

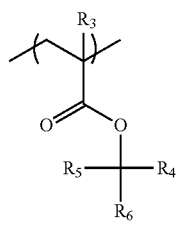

(2)

wherein, in formulae (1) and (2), each of $R_1$ and $R_3$ independently represents a hydrogen atom, a methyl group which may have a substituent, or a group represented by —$CH_2$—$R_9$ where $R_9$ represents a hydroxyl group or a monovalent organic group; each of $R_2$, $R_4$, $R_5$ and $R_6$ independently represents an alkyl group or a cycloalkyl group; and R represents an atomic group necessary for forming an alicyclic structure together with the carbon atom.

16. The pattern forming method according to claim 15, wherein the acid-decomposable group-containing repeating unit includes repeating units represented by formulae (1) and (2).

17. The pattern forming method according to claim 15, wherein the acid-decomposable group-containing repeating unit includes two kinds of the repeating unit represented by formula (1).

* * * * *